(12) United States Patent
Ando et al.

(10) Patent No.: US 10,910,407 B2
(45) Date of Patent: Feb. 2, 2021

(54) SEMICONDUCTOR DEVICE

(71) Applicant: Semiconductor Energy Laboratory Co., Ltd., Atsugi (JP)

(72) Inventors: Yoshinori Ando, Atsugi (JP); Takashi Hamada, Atsugi (JP); Yasumasa Yamane, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/478,244

(22) PCT Filed: Jan. 22, 2018

(86) PCT No.: PCT/IB2018/050368
§ 371 (c)(1),
(2) Date: Jul. 16, 2019

(87) PCT Pub. No.: WO2018/138619
PCT Pub. Date: Aug. 2, 2018

(65) Prior Publication Data
US 2019/0363108 A1 Nov. 28, 2019

(30) Foreign Application Priority Data

| Jan. 30, 2017 | (JP) | 2017-014337 |
| Jun. 16, 2017 | (JP) | 2017-118471 |
| Aug. 11, 2017 | (JP) | 2017-156235 |

(51) Int. Cl.
*H01L 27/12* (2006.01)
*H01L 29/66* (2006.01)
*H01L 29/786* (2006.01)

(52) U.S. Cl.
CPC ........ *H01L 27/1225* (2013.01); *H01L 27/124* (2013.01); *H01L 29/66742* (2013.01); *H01L 29/78693* (2013.01)

(58) Field of Classification Search
CPC ............... H01L 27/1156; H01L 27/124; H01L 27/1225; H01L 29/66742; H01L 29/78648;
(Continued)

(56) References Cited

U.S. PATENT DOCUMENTS

| 7,674,650 B2 | 3/2010 | Akimoto et al. |
| 8,384,080 B2 | 2/2013 | Taniguchi et al. |

(Continued)

FOREIGN PATENT DOCUMENTS

| JP | 2007-096055 A | 4/2007 |
| JP | 2007-123861 A | 5/2007 |

(Continued)

OTHER PUBLICATIONS

International Search Report (Application No. PCT/IB2018/050368) dated Apr. 24, 2018.

(Continued)

*Primary Examiner* — Allan R Wilson
(74) *Attorney, Agent, or Firm* — Robinson Intellectual Property Law Office; Eric J. Robinson

(57) ABSTRACT

A high-performance semiconductor device is provided. The semiconductor device includes a transistor, an insulating film over the transistor, an electrode, and a metal oxide over the insulating film. The transistor includes a first gate electrode, a first gate insulating film over the first gate electrode, an oxide over the first gate insulating film, a source electrode and a drain electrode electrically connected to the oxide, a second gate insulating film over the oxide, and a second gate electrode over the second gate insulating film. The electrode includes a region in contact with the insulating film. The first gate insulating film is in contact with the insulating film. The thicknesses of the insulating film over the second gate electrode, the insulating film over (Continued)

the source electrode, and the insulating film over the drain electrode are substantially the same, and the insulating film includes excess oxygen.

14 Claims, 31 Drawing Sheets

(58) Field of Classification Search
CPC .......... H01L 29/7869; H01L 29/78693; H01L 29/78696
See application file for complete search history.

(56) References Cited

U.S. PATENT DOCUMENTS

| | | | |
|---|---|---|---|
| 8,692,252 B2 | 4/2014 | Takata et al. | |
| 8,737,109 B2 | 5/2014 | Yamazaki et al. | |
| 8,860,108 B2 | 10/2014 | Yamazaki et al. | |
| 8,947,158 B2 | 2/2015 | Watanabe | |
| 9,024,317 B2 | 5/2015 | Endo et al. | |
| 9,281,409 B2 | 3/2016 | Yamazaki et al. | |
| 9,337,826 B2 | 5/2016 | Koyama et al. | |
| 9,379,192 B2 | 6/2016 | Ito et al. | |
| 9,401,432 B2 | 7/2016 | Kobayashi et al. | |
| 9,450,080 B2 | 9/2016 | Yamazaki et al. | |
| 9,455,337 B2 | 9/2016 | Hodo et al. | |
| 9,472,678 B2 | 10/2016 | Yamazaki et al. | |
| 9,666,722 B2 | 5/2017 | Matsubayashi et al. | |
| 9,705,004 B2 | 7/2017 | Kobayashi et al. | |
| 9,722,088 B2 | 8/2017 | Hanaoka et al. | |
| 9,768,318 B2 | 9/2017 | Yamazaki et al. | |
| 9,780,226 B2 | 10/2017 | Koezuka et al. | |
| 9,806,198 B2 | 10/2017 | Suzawa | |
| 9,847,429 B2 | 12/2017 | Yamazaki et al. | |
| 10,475,818 B2 * | 11/2019 | Ando | H01L 27/1052 |
| 2003/0170939 A1 | 9/2003 | Yamazaki et al. | |
| 2005/0087769 A1 | 4/2005 | Yamazaki et al. | |
| 2006/0231858 A1 | 10/2006 | Akimoto et al. | |
| 2011/0281394 A1 * | 11/2011 | Yamazaki | H01L 21/02565 438/104 |
| 2011/0303913 A1 | 12/2011 | Yamazaki et al. | |
| 2012/0061666 A1 | 3/2012 | Inoue et al. | |
| 2012/0161126 A1 | 6/2012 | Yamazaki | |
| 2012/0309167 A1 | 12/2012 | Park et al. | |
| 2012/0313152 A1 | 12/2012 | Yokoi et al. | |
| 2013/0244374 A1 * | 9/2013 | Okazaki | H01L 29/78696 438/104 |
| 2015/0155362 A1 | 6/2015 | Nakazawa et al. | |
| 2015/0179803 A1 | 6/2015 | Yamazaki et al. | |
| 2015/0255310 A1 | 9/2015 | Yamazaki et al. | |
| 2016/0254386 A1 | 9/2016 | Yamazaki et al. | |
| 2016/0284862 A1 | 9/2016 | Yamazaki et al. | |
| 2016/0351572 A1 | 12/2016 | Atsumi et al. | |
| 2017/0141130 A1 * | 5/2017 | Yamazaki | H01L 21/02271 |
| 2017/0236842 A1 | 8/2017 | Matsuda et al. | |
| 2017/0263650 A1 | 9/2017 | Tochibayashi et al. | |
| 2017/0263651 A1 | 9/2017 | Tochibayashi et al. | |
| 2017/0271517 A1 | 9/2017 | Kimura et al. | |
| 2017/0294541 A1 | 10/2017 | Yamazaki | |
| 2017/0309732 A1 | 10/2017 | Yamazaki et al. | |
| 2017/0309752 A1 | 10/2017 | Yamazaki et al. | |

FOREIGN PATENT DOCUMENTS

| | | |
|---|---|---|
| JP | 2011-119674 A | 6/2011 |
| JP | 2012-253354 A | 12/2012 |
| JP | 2016-086170 A | 5/2016 |
| JP | 2016-164979 A | 9/2016 |
| JP | 2016-225613 A | 12/2016 |
| KR | 2012-0134215 A | 12/2012 |

OTHER PUBLICATIONS

Written Opinion (Application No. PCT/IB2018/050368) dated Apr. 24, 2018.

* cited by examiner

SEMICONDUCTOR DEVICE

TECHNICAL FIELD

Embodiments of the present invention relate to a semiconductor device and a method for driving the semiconductor device. Another embodiment of the present invention relates to an electronic device.

In this specification and the like, a semiconductor device refers to every device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

A technique by which a transistor is formed using a semiconductor thin film has been attracting attention. The transistor is used in a wide range of electronic devices such as an integrated circuit (IC) and an image display device (also simply referred to as a display device). Silicon-based semiconductor materials are widely known as materials for semiconductor thin films that can be used for transistors. As other materials, oxide semiconductors have been attracting attention.

For example, techniques have been disclosed by each of which a display device is manufactured using a transistor whose active layer is formed of zinc oxide or an In—Ga—Zn-based oxide as an oxide semiconductor (see Patent Documents 1 and 2).

In recent years, a technique has been disclosed by which an integrated circuit of a memory device is manufactured using a transistor including an oxide semiconductor (see Patent Document 3). Furthermore, not only memory devices but also arithmetic devices and the like are manufactured using transistors including oxide semiconductors.

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119674

DISCLOSURE OF INVENTION

An object of one embodiment of the present invention is to provide a semiconductor device having favorable electrical characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device capable of reducing power consumption. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

In some cases, a semiconductor device includes a circuit in which a plurality of elements are densely provided over one substrate and other elements are stacked above the circuit with an insulating film covering the elements interposed therebetween. The elements may be a transistor, a capacitor, a diode, a resistor, and the like. For example, a transistor having part of a silicon substrate as a channel formation region is provided over the silicon substrate, a transistor having an oxide as a channel formation region is provided over the transistor with an insulating film interposed therebetween, and a wiring layer, a capacitor, and the like are provided over the transistor with an insulating film interposed therebetween, in some cases. As described above, when a plurality of elements are stacked with the insulating films interposed therebetween, the elements of a semiconductor device can be arranged with high density per substrate area.

In order to make such a plurality of elements operate, an electrode that electrically connects upper and lower elements is needed. The number of electrodes depends on the density of elements included in the semiconductor device, for example, the density of transistors.

Variation in electrical characteristics of the transistor having an oxide as a channel formation region may be affected depending on the contact area between the electrode and the insulator in the vicinity of the channel formation region and the density of transistors. The density of transistors (transistor density) refers to the number of transistors provided per unit area. For example, in the case where the transistor density refers to the number of transistors provided per square micrometer, the transistor density can be expressed in the unit/$\mu m^2$ or $\cdot \mu m^{-2}$.

According to one embodiment of the prevent invention, a semiconductor device with small variation in the transistor characteristics can be provided by adjusting the contact area between the electrode and the insulator in the vicinity of the channel formation region and the transistor density.

One embodiment of the present invention is a semiconductor device including a transistor, an insulating film over the transistor, an electrode, and a metal oxide over the insulating film. The transistor includes a first gate electrode, a first gate insulating film over the first gate electrode, an oxide over the first gate insulating film, a source electrode and a drain electrode electrically connected to the oxide, a second gate insulating film over the oxide, and a second gate electrode over the second gate insulating film. The electrode includes a region in contact with the insulating film. The first gate insulating film is in contact with the insulating film. The thicknesses of the insulating film over the second gate electrode, the insulating film over the source electrode, and the insulating film over drain electrode are substantially the same. The insulating film includes excess oxygen.

In the semiconductor device, the metal oxide has a function of inhibiting the passage of oxygen.

In the semiconductor device, the metal oxide includes aluminum and oxygen.

In the semiconductor device, the oxide includes In, an element M (Al, Ga, Y, or Sn), and Zn.

The semiconductor device of one embodiment of the present invention may include a circuit. The circuit may include a plurality of transistors and electrodes, and the transistor density is higher than or equal to $1/\mu^2$ and lower than or equal to $2500/\mu m^2$.

In this circuit, the contact area between each electrode and the insulating film is preferably less than or equal to $0.035$ $\mu m^2$.

In the semiconductor device, the thickness of the insulating film is preferably greater than or equal to 40 nm.

One embodiment of the present invention is a semiconductor wafer including a plurality of the semiconductor devices and a region for dicing.

One embodiment of the present invention is a method for manufacturing a semiconductor device, including the steps of: forming a first insulator; forming a transistor including a source electrode, a drain electrode, and a channel formation region in an oxide over the first insulator; forming a second insulator over the transistor; and forming a third insulator over the second insulator to add oxygen into the second insulator; performing heat treatment to transfer the oxygen to the oxide through the second insulator; and forming an electrode reaching the source electrode through the second insulator and the third insulator.

In the method for manufacturing the semiconductor device, the third insulator is formed by a sputtering method and includes aluminum and oxygen.

A semiconductor device having favorable electrical characteristics can be provided. A semiconductor device that can be miniaturized or highly integrated can be provided. A semiconductor device that can be manufactured with high productivity can be provided.

A semiconductor device capable of retaining data for a long time can be provided. A semiconductor device capable of high-speed data writing can be provided. A semiconductor device with high design flexibility can be provided. A semiconductor device capable of reducing power consumption can be provided. A novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BEST MODE FOR CARRYING OUT THE INVENTION

Figure 1A:
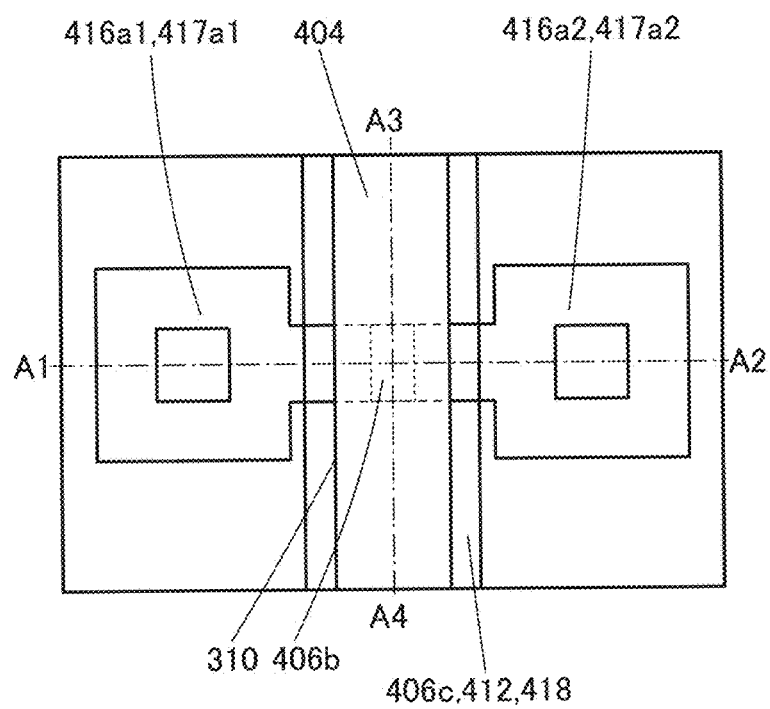
FIGS. 1A to 1C are a top view and cross-sectional views illustrating the structure of a transistor of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to the shapes or values shown in the drawings. In the drawings, the same portions or portions having similar functions are denoted by the same reference numerals in different drawings, and explanation thereof will not be repeated. In addition, the same hatching pattern is applied to portions having similar functions, and the portions are not particularly denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those that specify one embodiment of the present invention.

In this specification, terms for describing arrangement, such as "over", "above", "under", and "below", are used for convenience in describing a positional relation between components with reference to drawings. Furthermore, the positional relation between components is changed as appropriate in accordance with the direction in which each component is described. Thus, there is no limitation on terms used in this specification, and description can be made appropriately depending on the situation.

The "semiconductor device" in this specification and the like means every device which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. In addition, the transistor includes a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

Furthermore, the functions of a source and a drain might be interchanged with each other when transistors having different polarities are employed or the direction of current flow is changed in circuit operation, for example. Therefore, the terms "source" and "drain" can be interchanged with each other in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. In addition, the term "insulating film" can be changed into the term "insulating layer" in some cases.

Furthermore, unless otherwise specified, transistors described in this specification and the like are field-effect transistors. In addition, unless otherwise specified, transistors described in this specification and the like are n-channel transistors.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

For example, in this specification and the like, an explicit description "X and Y are connected" means that X and Y are electrically connected, X and Y are functionally connected, and X and Y are directly connected. Accordingly, without being limited to a predetermined connection relation, for example, the connection relation shown in drawings or texts, another connection relation is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit and a step-down circuit) and a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; and a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification, a barrier film refers to a film having a function of inhibiting the passage of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS field-effect transistor (FET) is a transistor including an oxide or an oxide semiconductor.

Embodiment 1

A structure of a semiconductor device of one embodiment of the present invention is described below.

Structure Example 1 of Transistor

Figure 1C:
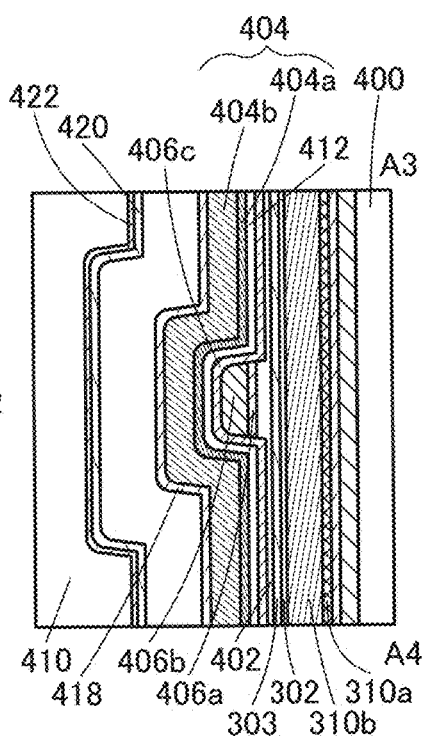
Figure 1B:
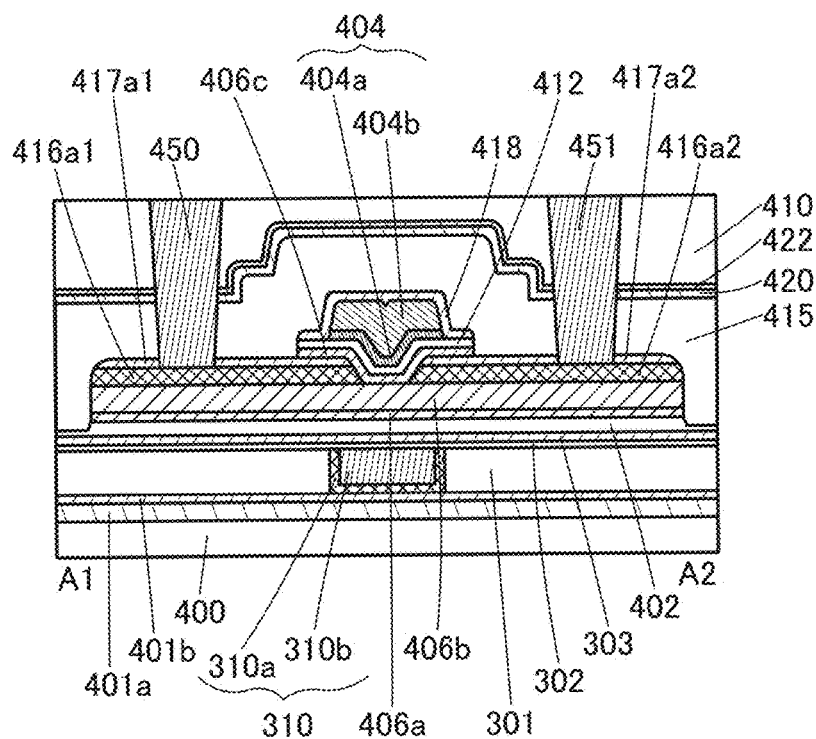

FIG. 1A is a top view of the semiconductor device. FIG. 1B is a cross-sectional view taken along dashed-dotted line A1-A2 in FIG. 1A. FIG. 1C is a cross-sectional view taken along dashed-dotted line A3-A4 in FIG. 1A.

FIG. 1B is an A1-A2 cross-sectional view of the transistor included in the semiconductor device in the channel length direction. FIG. 1C is an A3-A4 cross-sectional view of the transistor included in the semiconductor device in the channel width direction. Note that for simplification of the drawing, some components in the top view in FIG. 1A are not illustrated.

In FIGS. 1B and 1C, the transistor included in the semiconductor device is provided over an oxide 401a over a substrate 400 and an oxide 401b over the oxide 401a. The transistor includes a conductor 310a, a conductor 310b, and an insulator 301 over the oxide 401b an insulator 302 over the conductor 310a, the conductor 310b, and the insulator 301; an insulator 303 over the insulator 302; an insulator 402 over the insulator 303; an oxide 406a over the insulator 402; an oxide 406b over the oxide 406a; a conductor 416a1 and a conductor 416a2 each including a region in contact with a top surface of the oxide 406b; a barrier film 417a1 over the conductor 416a1; a barrier film 417a2 over the conductor 416a2; an oxide 406c including a region in contact with a side surface of the conductor 416a1, a side surface of the conductor 416a2, a top surface of the barrier film 417a1, a top surface of the barrier film 417a2, and a top surface of the oxide 406b; an insulator 412 over the oxide 406c; and a conductor 404 including a region overlapping with the top surface of the oxide 406b with the oxide 406c and the insulator 412 therebetween. The insulator 301 has an opening, and the conductor 310a and the conductor 310b are provided in the opening.

Over the transistor, an oxide 418, an insulator 415 over the oxide 418, an oxide 420 over the insulator 415, an oxide 422 over the oxide 420, and an insulator 410 over the oxide 422 are provided.

Furthermore, an electrode 450 reaching the conductor 416a1 through the barrier film 417a1, the insulator 415, the oxide 420, the oxide 422, and the insulator 410, and an electrode 451 reaching the conductor 416a2 through the barrier film 417a2, the insulator 415, the oxide 420, the oxide 422, and the insulator 410 are provided.

In the cross-sectional view in the channel length direction in FIG. 1B, end portions of the oxide 418, end portions of the insulator 412, and end portions of the oxide 406c are aligned and positioned over the barrier film 417a1 and the barrier film 417a2. The thicknesses of the insulator 415 over the oxide 418 overlapping with the conductor 404, the insulator 415 over the barrier film 417a1, and the insulator 415 over the barrier film 417a2 are each substantially the same. The insulator 415 includes a region in contact with a top surface of the insulator 402.

In the transistor, the conductor 404 functions as a first gate electrode. The conductor 404 can have a stacked-layer structure including a conductor 404a and a conductor 404b. For example, when the conductor 404a having a function of inhibiting the passage of oxygen is formed under the conductor 404b, an increase in the electric resistance due to oxidation of the conductor 404b can be prevented.

The oxide 418 is formed to cover the conductor 404a and the conductor 404b. When a metal oxide having a function of inhibiting the passage of oxygen, such as aluminum oxide, is used for the oxide 418, diffusion of oxygen from outside into the conductor 404b can be prevented, and thus an increase in the electric resistance due to oxidation of the conductor 404b can be prevented.

For the oxide 418, a metal oxide that is formed by an atomic layer deposition (ALD) method is preferably used, and for example, aluminum oxide is preferably used. The insulator 412 functions as a first gate insulator.

The conductors 416a1 and 416a2 function as a source electrode and a drain electrode. The conductors 416a1 and 416a2 can each have a stacked-layer structure including a conductor having a function of inhibiting the passage of oxygen. For example, when a conductor having a function of inhibiting the passage of oxygen is formed as an upper layer, an increase in the electric resistance due to oxidation of the conductors 416a1 and 416a2 can be prevented. Note that the electric resistance of the conductors can be measured by a two-terminal method or the like.

The barrier films 417a1 and 417a2 each have a function of inhibiting the passage of oxygen and impurities such as hydrogen and water. The barrier film 417a1 is located over the conductor 416a1 and prevents diffusion of oxygen into the conductor 416a1. The barrier film 417a2 is located over the conductor 416a2 and prevents diffusion of oxygen into the conductor 416a2.

In the transistor, the oxide 406b functions as a channel formation region. That is, in the transistor, the resistance of the oxide 406b can be controlled by a potential applied to the conductor 404. In other words, conduction or non-conduction between the conductor 416a1 and the conductor 416a2 can be controlled by the potential applied to the conductor 404.

As illustrated in FIG. 1C, the oxide 406c is provided to cover the whole oxide 406b in the channel width direction. Furthermore, the conductor 404 functioning as the first gate electrode is provided to cover the whole oxide 406b with the insulator 412 functioning as the first gate insulator therebetween. Thus, the whole oxide 406b can be electrically surrounded by an electric field of the conductor 404 functioning as the first gate electrode. Such a transistor structure in which a channel formation region is electrically surrounded by an electric field of a first gate electrode is referred to as a surrounded channel (s-channel) structure. As a result, a channel can be formed in the whole oxide 406b; thus, a large amount of current can flow between the source and the drain, and current in an on state (on-state current) can be increased. In addition, since the oxide 406b is surrounded by the electric field of the conductor 404, current in an off state (off-state current) can be decreased.

In the transistor, the conductor 404 functioning as the first gate electrode partly overlaps with each of the conductors 416a1 and 416a2 functioning as the source electrode and the drain electrode, whereby parasitic capacitance between the conductors 404 and 416a1 and parasitic capacitance between the conductors 404 and 416a2 are formed.

The transistor structure including the barrier film 417a1 as well as the insulator 412 and the oxide 406c between the conductors 404 and 416a1 allows a reduction in the parasitic capacitance. Similarly, the transistor structure including the barrier film 417a2 as well as the insulator 412 and the oxide 406c between the conductors 404 and 416a2 allows a reduction in the parasitic capacitance. Thus, the transistor has excellent frequency characteristics.

Furthermore, the above structure of the transistor allows a reduction or prevention of generation of a leakage current between the conductor 404 and each of the conductors 416a1 and 416a2 when the transistor operates, for example, when a potential difference between the conductor 404 and each of the conductors 416a1 and 416a2 occurs.

A conductor 310 is provided in the opening formed in the insulator 301. The conductor 310 can have a stacked-layer structure including the conductors 310a and 310b. The conductor 310a is formed in contact with an inner wall of the opening in the insulator 301, and the conductor 310b is formed on the inner side. Here, top surfaces of the conductors 310a and 310b can have substantially the same level as a top surface of the insulator 301. The conductor 310 functions as a second gate electrode. The conductor 310 can be a multilayer film including a conductor that has a function of inhibiting the passage of oxygen. For example, when the conductor 310a is formed using a conductor that has a function of inhibiting the passage of oxygen, a decrease in the conductivity due to oxidation of the conductor 310b can be prevented.

The insulators 302, 303, and 402 function as a second gate insulating film. By controlling a potential supplied to the conductor 310, the threshold voltage of the transistor can be adjusted.

Here, for the oxide 420, a metal oxide that is formed by a sputtering method is preferably used, and for example, aluminum oxide is preferably used. Such an oxide 420 enables oxygen to be supplied to the insulator 415 through the contact area between the oxide 420 and the insulator 415, and thus, the insulator 415 can be brought into an oxygen excess state. In other words, the insulator 415 can contain oxygen in excess of the stoichiometric composition, and the oxygen in such a case can be referred to as excess oxygen. Excess oxygen can be effectively supplied, by heat treatment or the like, to the oxide 406a and a region of the oxide 406b where a channel is formed (channel formation region) through the insulator 415 and the insulator 402 in contact with the insulator 415. Accordingly, oxygen vacancies in the oxides 406a and 406b can be reduced. The insulators 415 and 402 are formed using an insulating material that transmits oxygen more easily than the oxide 420 or the oxide 422. For example, silicon oxide or silicon oxynitride can be used.

The insulator 415 includes a region in contact with the electrodes 450 and 451. Excess oxygen in the insulator 415 may be diffused into the electrodes 450 and 451 through the region. In that case, excess oxygen may be consumed and reduced due to oxidation of the electrodes 450 and 451. Therefore, the surface area of the region in contact with the electrodes 450 and 451 needs to be considered.

The electrodes 450 and 451 can be a multilayer film including a conductor that has a function of inhibiting the passage of oxygen. When the electrodes 450 and 451 each include a conductor that has a function of inhibiting the passage of oxygen, oxidation of the electrodes 450 and 451 can be prevented, leading to a reduction in the consumption of excess oxygen in some cases.

Figure 3:
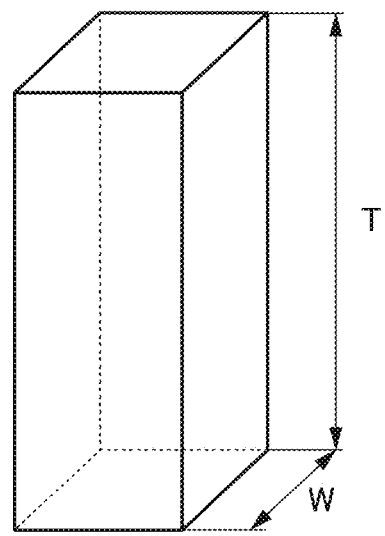
FIG. 3 is a perspective view illustrating the shape of an electrode of one embodiment of the present invention.

FIG. 3 is a perspective view illustrating the portion of the electrode 450 or the electrode 451 in contact with the insulator 415. The electrode 450 is substantially a rectangular solid and each of the bottom surface and the top surface is a square in which the length of one side is W. Suppose that the thickness of the insulator 415 is T, the contact area between the electrode 450 and the insulator 415 is W×T×4. The same applies to the electrode 451.

In addition, the consumption of excess oxygen of the insulator 415 depends on the transistor density. That is, the amount of oxygen supplied to the oxide 406b included in each transistor, and the amount of oxygen diffused into the region in which the insulator 415 and a side surface of the conductors 416a1 and 416a2 included in each transistor are in contact with each other increases as the transistor density increases.

In this embodiment, the relationship between $V_{sh}$ of the transistor and each of the transistor density and the contact area between the electrode 450 or the electrode 451 and the insulator 415 is evaluated. In the $I_d$–$V_g$ curve where the horizontal axis represents gate voltage ($V_g$ [V]) and the vertical axis represents the square root of drain current ($I_d^{1/2}$ [A]), the gate voltage at the rising of drain current is referred to as $V_{sh}$. Furthermore, $V_{sh}$ in this specification is defined as, in the $I_d$–$V_g$ curve where the horizontal axis represents the gate voltage $V_g$ [V] and the vertical axis represents the logarithm of the drain current $I_d$ [A], a gate voltage at the intersection point of the line of $I_d$=1.0×10$^{-12}$ [A] and the tangent to the curve at a point where the slope of the curve is the steepest. Note that here, $V_{sh}$ is calculated with a drain voltage $V_d$ of 3.3 V.

$V_{sh}$ depends on the density of oxygen vacancies in a channel formation region. That is, $V_{sh}$ becomes small when the density of the oxygen vacancies in the channel formation region is high. In other words, the transistor comes to have normally-on characteristics by a shift of $V_{sh}$ in the negative direction. Accordingly, when the density of the oxygen vacancies in the channel formation region is decreased by the supply of oxygen into the oxide 406b having the channel formation region, the shift of $V_{sh}$ in the negative direction can be prevented and the transistor can have normally-off characteristics.

The evaluation was performed using four samples of the insulator 415 with the thicknesses of 10 nm, 32 nm, 62 nm, and 100 nm. The transistor density of each sample was set to 1/μm$^2$, 2/μm$^2$, and 2.9/μm$^2$, and $V_{sh}$ in each case is measured. In each sample at each transistor density, the length of one side of the bottom surface or the top surface of the electrode 450 or the electrode 451 was 100 nm.

Figure 4A:
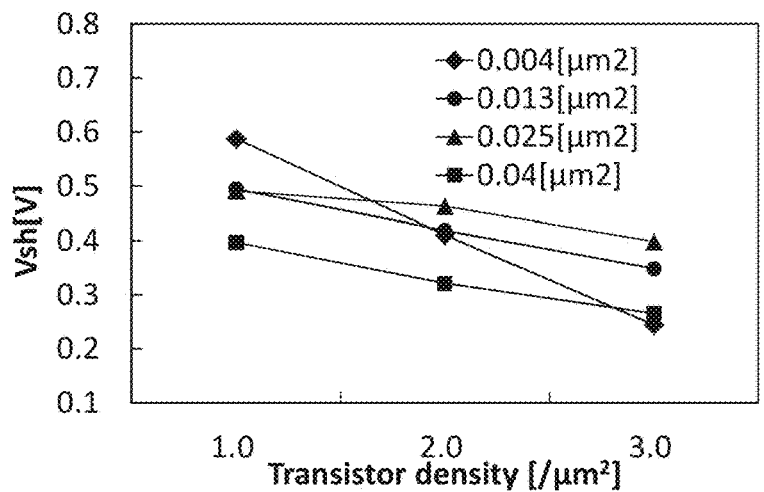
FIG. 4A is a graph showing the dependence of $V_{sh}$ on the transistor density.

The graph in FIG. 4A shows the dependence of $V_{sh}$ on the transistor density where the horizontal axis represents $V_{sh}$ and the vertical axis represents the transistor density. As described above, the contact area between the electrode 450 or the electrode 451 and the insulator 415 is calculated by the equation S=W×T×4. S is 0.004 μm$^2$, 0.013 μm$^2$, 0.025 μm$^2$, and 0.04 μm$^2$ when the thickness T of the insulator 415 is 10 nm, 32 nm, 62 nm, and 100 nm, respectively.

It is found from FIG. 4A that the dependence of $V_{sh}$ on the transistor density is observed at any surface area, and $V_{sh}$ decreases, in other words, $V_{sh}$ tends to shift in the negative direction as the transistor density increases. However, the dependence on the transistor density is influenced by the size of the contact area. That is, the dependence on the transistor density is high when the contact area is 0.004 μm$^2$, and the dependence on the transistor density is small when the contact area is 0.025 μm$^2$.

Figure 4B:
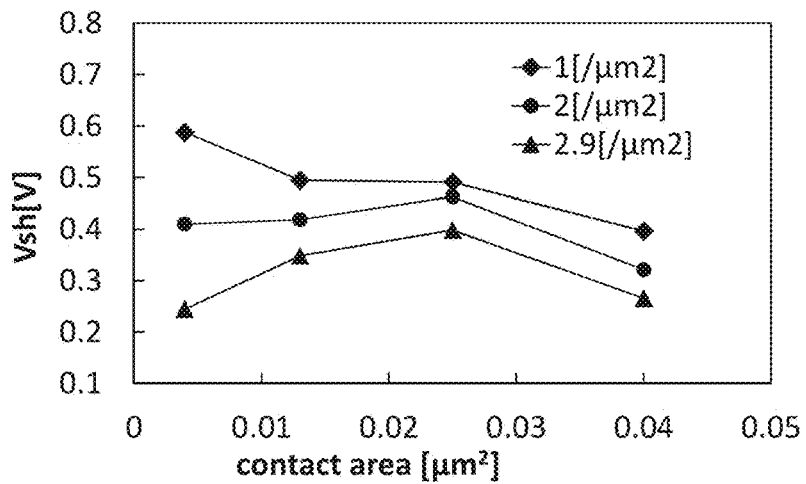
FIG. 4B is a graph showing the dependence of $V_{sh}$ on the contact area between an electrode and an insulator.

The graph in FIG. 4B shows the dependence of $V_{sh}$ on the surface area for the same data as above, where the horizontal axis represents $V_{sh}$ and the vertical axis is replaced with the contact area. It is found from FIG. 4B that the difference in $V_{sh}$ between varied transistor densities is the smallest when the contact area is in the vicinity of 0.025 μm$^2$ at any transistor density.

Figure 4C:
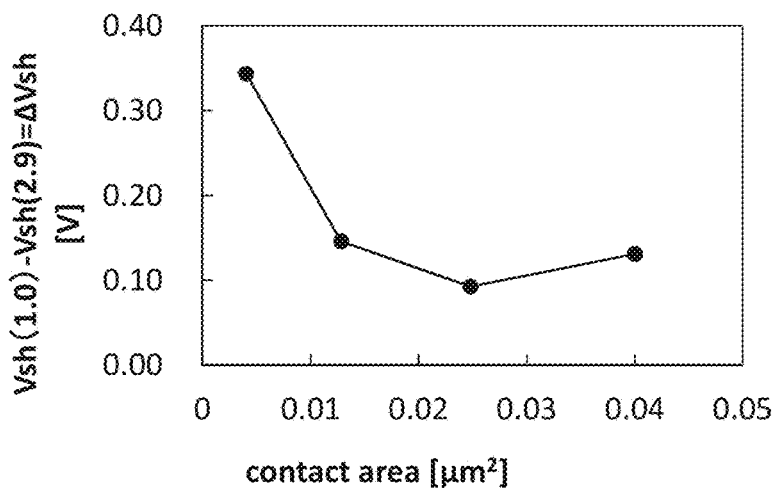
FIG. 4C is a graph showing the dependence of $\Delta V_{sh}$ on the contact area between an electrode and an insulator.

The graph in FIG. 4C shows the dependence of $\Delta V_{sh}$ on the contact area where the horizontal axis represents $\Delta V_{sh}$ and the vertical axis represents the contact area. Here, $\Delta V_{sh}$ represents the difference between $V_{sh}$ when the transistor density is 1/μm² and $V_{sh}$ when the transistor density is 2.9/μm².

It is found from FIG. 4C that $\Delta V_{sh}$ is the smallest when the surface area is in the vicinity of 0.025 μm². That is, the dependence on the transistor density is the smallest when the surface area is in the vicinity of 0.025 μm².

The consumption of excess oxygen in the insulator 415 should be reduced as the contact area between the electrode 450 or the electrode 451 and the insulator 415 is smaller, and downward lines should be shown in the graph of FIG. 4B. However, as described above, $V_{sh}$ reaches the maximum value in the vicinity of 0.025 μm² in all samples except the sample with the transistor density of 1/μm².

Figure 5A:
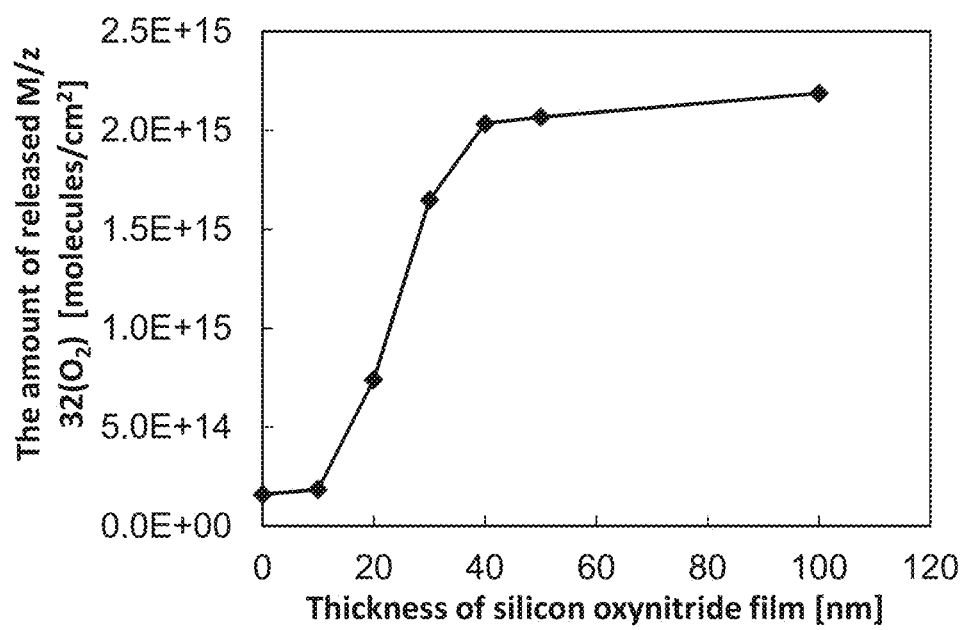
FIG. 5A is a graph showing the dependence of the amount of released oxygen on the thickness of a silicon oxynitride film and FIG. 5B is a graph showing the dependence of $\Delta V_{sh}$ on the thickness of a silicon oxynitride film.
Figure 5B:
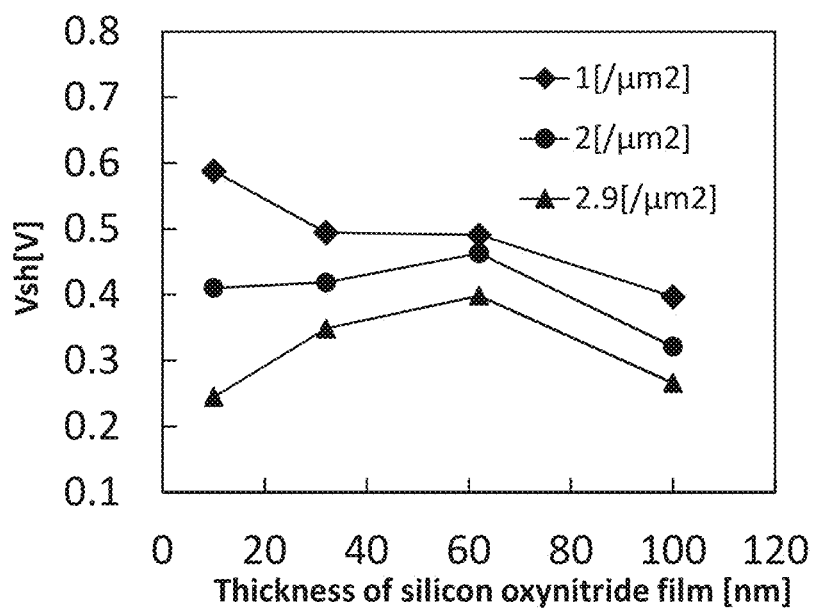
Figure 6A:
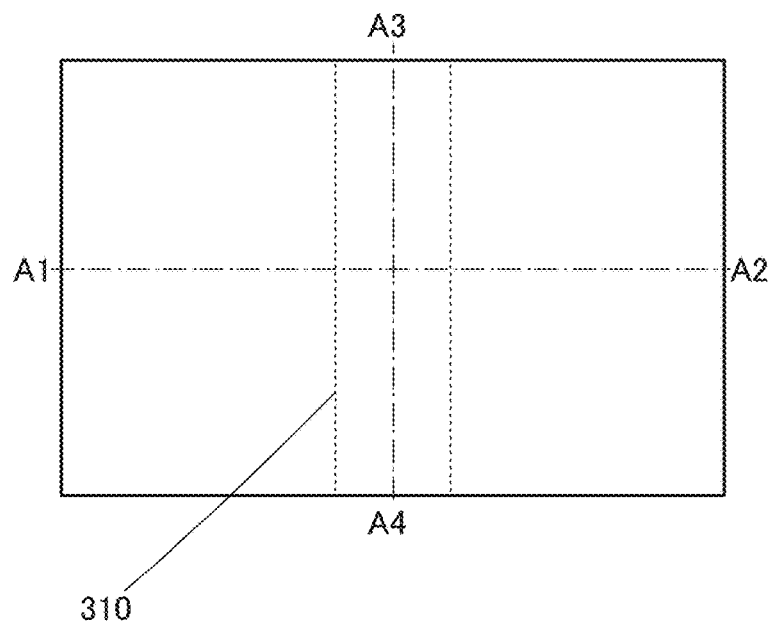
FIGS. 6A to 6C illustrate a method for manufacturing a transistor of one embodiment of the present invention.
Figure 6C:
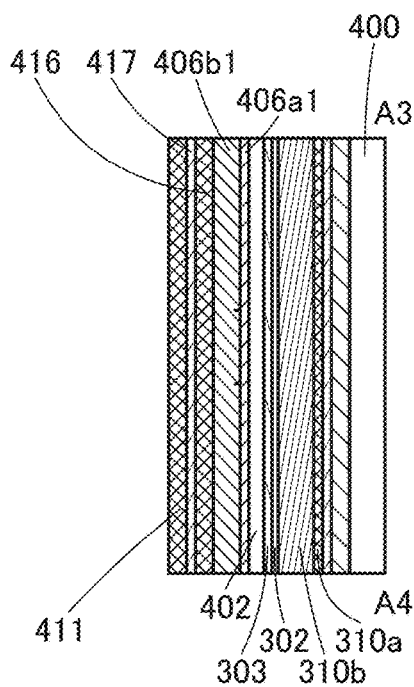
Figure 6B:
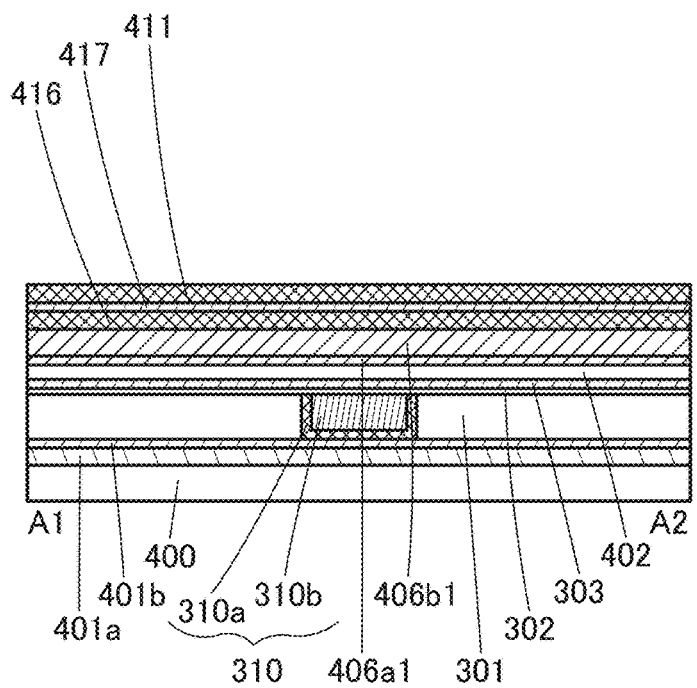
Figure 7A:
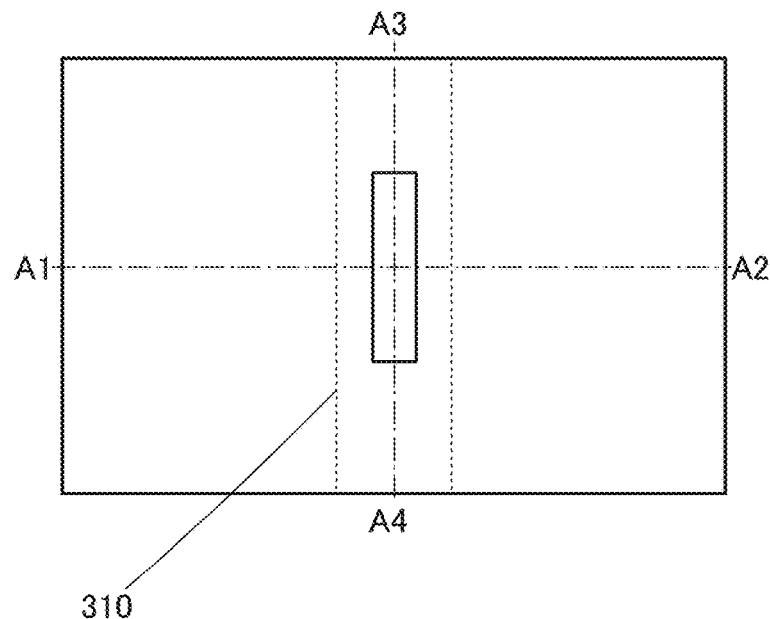
FIGS. 7A to 7C illustrate a method for manufacturing a transistor of one embodiment of the present invention.
Figure 7C:
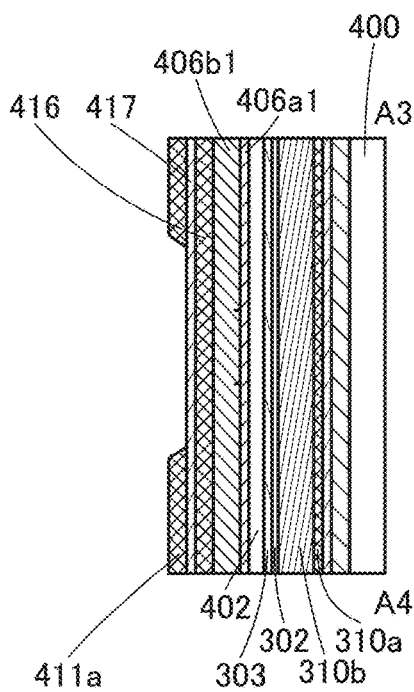
Figure 7B:
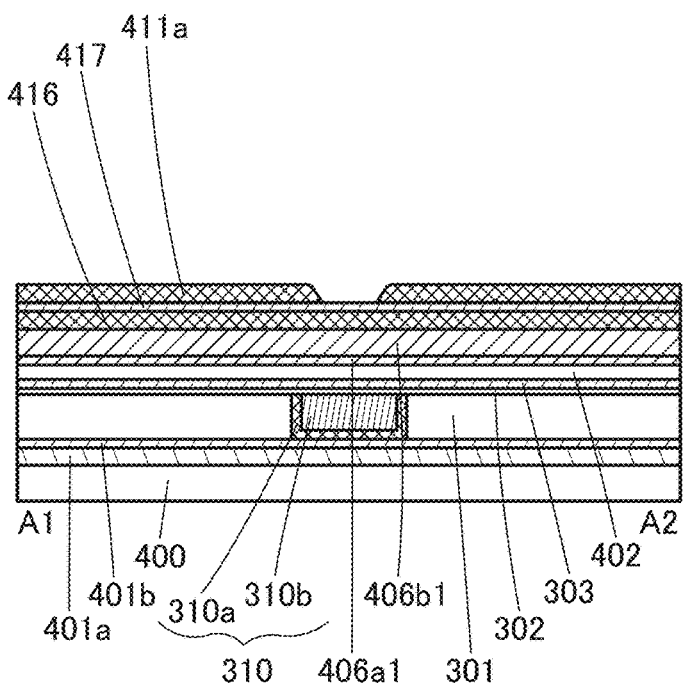

FIG. 5B is a graph obtained by replacing the horizontal axis of the graph in FIG. 4B with the thickness of the insulator 415, that is, the thickness of silicon oxynitride. The graph of FIG. 5B shows the same tendency as FIG. 4B. This is because the length of one side of the bottom surface or the top surface of the electrode was fixed to 100 nm in all the samples.

Accordingly, $V_{sh}$ depends on each of the transistor density, the contact area between the electrode 450 or the electrode 451 and the insulator 415, and the thickness of the insulator 415. Furthermore, when the contact area is in the vicinity of 0.025 μm² or the thickness of the insulator 415 is in the vicinity of 60 nm, the dependence of $V_{sh}$ on the transistor density is small.

Here, a sample was formed in order to estimate the amount of excess oxygen added to the insulator 415. In the sample, an insulator was provided over a substrate, and an oxide was provided over the insulator. Silicon oxynitride was used as the insulator, and aluminum oxide was used as the oxide. FIG. 5A shows the measurement result of the number of oxygen molecules released from the insulator when the thickness of the insulator is 0 nm, 10 nm, 20 nm, 30 nm, 40 nm, 50 nm, and 100 nm. The amount of the released oxygen can be estimated as the amount of excess oxygen added to the insulator. The amount of the released oxygen converted into oxygen molecules was measured by thermal desorption spectroscopy in the surface temperature range of the insulator film from 50° C. to 500° C.

As illustrated in FIG. 5A, the amount of excess oxygen abruptly increases as the thickness increases in the region where the thickness is greater than or equal to 0 nm and less than or equal to the vicinity of 40 nm. This increase in the amount of excess oxygen seems to be saturated in the region where the thickness is greater than the vicinity of 40 nm. Because of this tendency, $V_{sh}$ is more dependent on the thickness of the insulator 415 than on the contact area between the electrode 450 or the electrode 451 and the insulator 415 in the region where the thickness is greater than or equal to 0 nm and less than or equal to the vicinity of 40 nm. That is, $V_{sh}$ tends to increase as the thickness increases. On the other hand, $V_{sh}$ is dependent on the contact area between the electrode 450 or the electrode 451 and the insulator 415 in the region where the thickness is greater than the vicinity of 40 nm because the amount of excess oxygen is saturated and the change due to the thickness is small. That is, $V_{sh}$ tends to decrease (shift in the negative direction) as the contact area between the electrode 450 or the electrode 451 and the insulator 415 increases.

From the above results, the optimal range of the contact area between the electrode 450 or the electrode 451 and the insulator 415 where the dependence of $V_{sh}$ on the transistor density is small can be obtained. That is, the thickness of the insulator 415 is preferably greater than or equal to 40 nm. The contact area between the electrode 450 or the electrode 451 and the insulator 415 is preferably less than or equal to 0.035 μm². The transistor density is higher than or equal to 0.01/μm² and lower than or equal to 2500/μm², preferably higher than or equal to 0.1/μm² and lower than or equal to 2500/μm², further preferably higher than or equal to 1/μm² and lower than or equal to 2500/μm², still further preferably higher than or equal to 10/μm² and lower than or equal to 2500/μm², even still further preferably higher than or equal to 100/μm² and lower than or equal to 2500/μm².

Structural Example 2 of Semiconductor Device

Figure 2A:
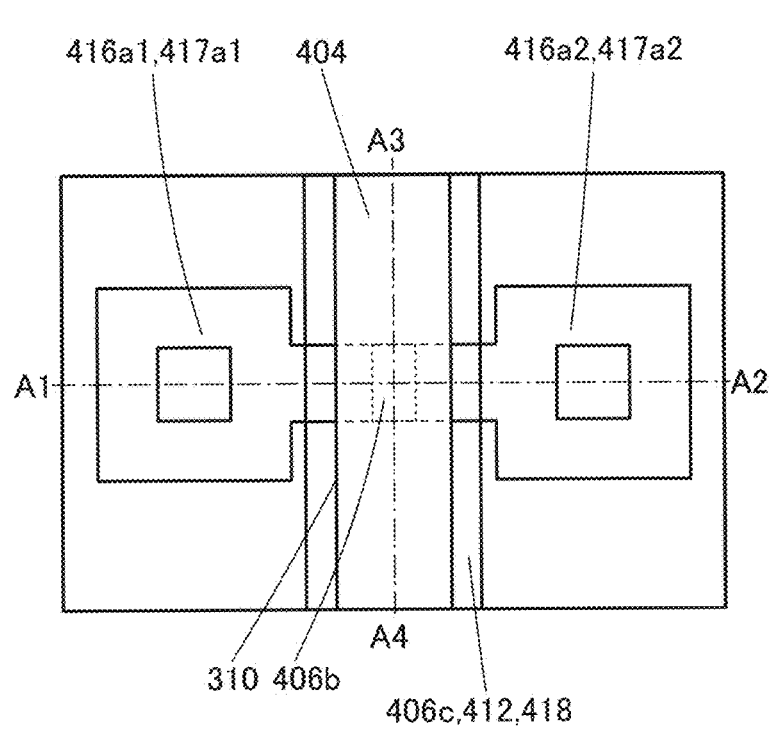
FIGS. 2A to 2C are a top view and cross-sectional views illustrating the structure of a transistor of one embodiment of the present invention.
Figure 2C:
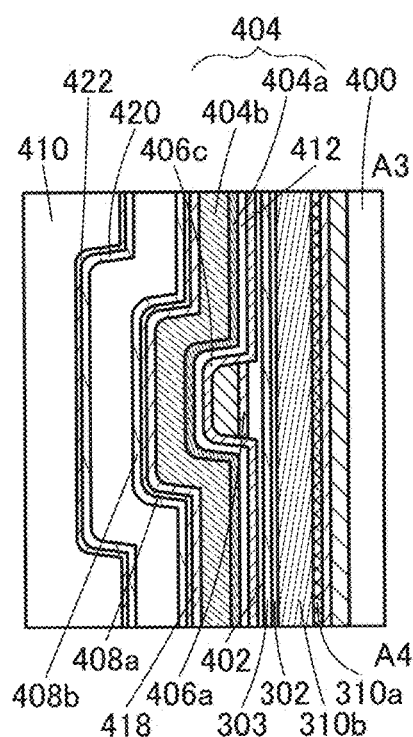
Figure 2B:
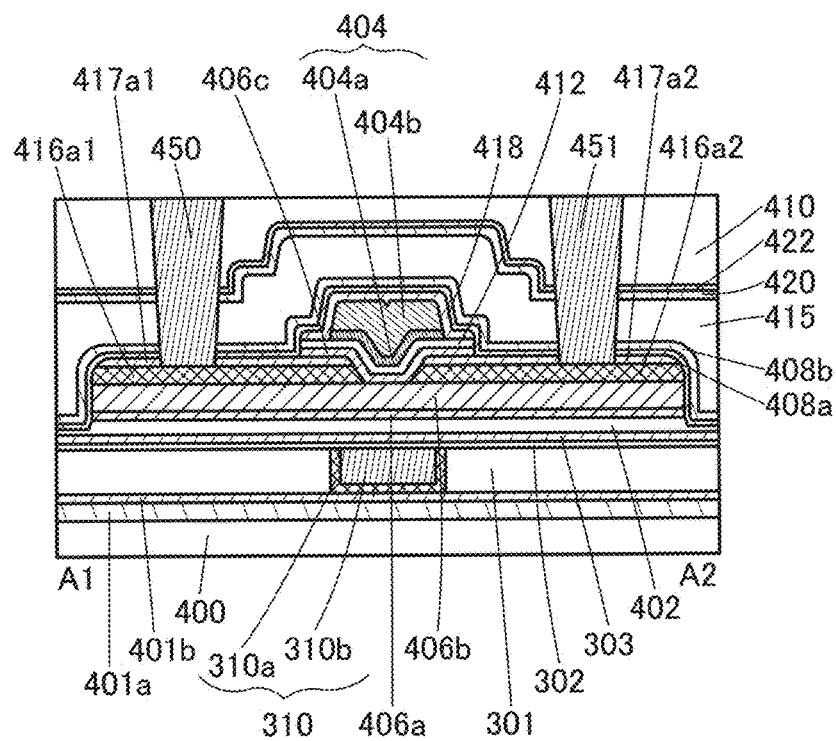

FIGS. 2A to 2C illustrate an example of a semiconductor device having a structure different from that in FIGS. 1A to 1C.

FIG. 2A is a top view of the semiconductor device. FIG. 2B is a cross-sectional view taken along dashed-dotted line A1-A2 in FIG. 2A. FIG. 2C is a cross-sectional view taken along dashed-dotted line A3-A4 in FIG. 2A. FIG. 1B is an A1-A2 cross-sectional view of the transistor included in the semiconductor device in the channel length direction. FIG. 1C is an A3-A4 cross-sectional view of the transistor included in the semiconductor device in the channel width direction. Note that for simplification of the drawing, some components in the top view in FIG. 2A are not illustrated.

The structure of the semiconductor device in FIGS. 2B and 2C differs from that in FIGS. 1B and 1C in that an oxide 408a and an oxide 408b are provided in this order over the oxide 418 over the transistor included in the semiconductor device and the insulator 415 is provided over the oxide 408b.

Here, for the oxide 408a, a metal oxide that is formed by a sputtering method is preferably used, and for example, aluminum oxide is preferably used. When the oxide 408a is formed by an ALD method, the film with few pinholes and excellent step coverage can be formed. Similarly, for the oxide 408b, a metal oxide that is formed by a sputtering method is preferably used, and for example, aluminum oxide is preferably used. Such an oxide 408b enables oxygen to be supplied from the oxide 408b to the insulator 412 through the oxide 408a and the contact area between the oxide 408a and the insulator 412, and thus, the insulator 412 can be brought into an oxygen excess state. Excess oxygen can be effectively supplied, by heat treatment or the like, to the oxide 406a and a region of the oxide 406b where a channel is formed (channel formation region) through the oxide 406c in contact with the insulator 412 (path 1). In addition, such an oxide 408b enables oxygen to be supplied from the oxide 408b to the insulator 402 through the oxide 408a and the contact area between the oxide 408a and the insulator 402, and thus, the insulator 402 can be brought into an oxygen excess state. Excess oxygen can be effectively supplied, by heat treatment or the like, to the oxide 406a and a region of the oxide 406b where a channel is formed (channel formation region) through the insulator 402 (path 2). Through these two paths, the oxygen vacancies in the oxides 406a and 406b can be reduced. The insulators 412 and 402 are formed using an insulating material that transmits oxygen more easily than the oxide 420 or the oxide 422. For example, silicon oxide or silicon oxynitride can be used.

The oxides 408a and 408b preferably have a function of inhibiting the passage of oxygen. Such a function can prevent oxygen supplied to the oxides 406a and 406b from diffusing outward.

Furthermore, the oxides 408a and 408b preferably have a function of inhibiting the passage of impurities typified by hydrogen and water. Such a function can prevent impurities typified by hydrogen or water from entering the oxides 406a and 406b.

Note that the thickness of the oxide 408a is less than or equal to 3 nm, preferably greater than or equal to 0.5 nm and less than or equal to 1.5 nm. The thickness of the oxide 408b is preferably greater than or equal to the thickness of the oxide 408a.

The description of the semiconductor device in FIG. 1A to 1C can be referred to for the other components and effects.

Substrate

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a robust semiconductor device can be provided.

For the substrate 400 that is a flexible substrate, metal, an alloy, a resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

Insulator

Examples of an insulator include an insulating oxide, an insulating nitride, an insulating oxynitride, an insulating nitride oxide, an insulating metal oxide, an insulating metal oxynitride, and an insulating metal nitride oxide.

The transistor is surrounded by an insulator that has a function of inhibiting the passage of oxygen and impurities such as hydrogen, whereby stable transistor characteristics can be obtained. For example, an insulator that has a function of inhibiting the passage of oxygen and impurities such as hydrogen may be used as each of the insulator 303 and the oxides 401a, 401b, 408a, 408b, 418, 420, and 422.

An insulator that has a function of inhibiting the passage of oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulator 303 and the oxides 401a, 401b, 408a, 408b, 418, 420, and 422 may each be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulator 303 and the oxides 401a, 401b, 418, 420, and 422 each preferably include aluminum oxide.

For example, when the oxide 422 is formed by a sputtering method with the use of plasma including oxygen, oxygen can be added to an insulator serving as a base layer of the oxide.

The insulators 301, 302, 402, 412, 410, and 415 can each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 301, 302, 402, 412, 410, and 415 preferably contain silicon oxide, silicon oxynitride, or silicon nitride.

In particular, the insulators 402 and 412 preferably include an insulator with a high relative permittivity. For example, the insulators 402 and 412 each preferably include gallium oxide, hafnium oxide, zirconium oxide, oxide containing aluminum and hafnium, oxynitride containing aluminum and hafnium, oxide containing silicon and hafnium, oxynitride containing silicon and hafnium, nitride containing silicon and hafnium, or the like. Alternatively, the insulators 402 and 412 each preferably have a stacked-layer structure of silicon oxide or silicon oxynitride and an insulator with a high relative permittivity. Because silicon oxide and silicon oxynitride have thermal stability, combination of silicon oxide or silicon oxynitride with an insulator with a high relative permittivity allows the stacked-layer structure to be thermally stable and have a high relative permittivity. For example, when aluminum oxide, gallium oxide, or hafnium oxide is positioned on the oxide 406c side in each of the insulators 402 and 412, entry of silicon included in silicon oxide or silicon oxynitride into the oxide 406b can be inhibited. When silicon oxide or silicon oxynitride is positioned on the oxide 406c side in each of the insulators 402 and 412, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulators 410 and 415 preferably include an insulator with a low relative permittivity. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon or aramid), polyimide, polycarbonate, and acrylic.

An insulator that has a function of inhibiting the passage of oxygen and impurities such as hydrogen may be used for each of the barrier films 417a1 and 417a2. The barrier films 417a1 and 417a2 can prevent excess oxygen included in the insulator 415 from diffusing into the conductors 416a1 and 416a2.

The barrier films 417a1 and 417a2 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride, for example.

Conductor

The conductors 404a, 404b, 310a, 310b, 416a1, and 416a2, and the electrodes 450 and 451 can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like. Alternatively, a semiconductor having a high electric conductivity typified by polycrystalline silicon including an impurity element such as phosphorus, or silicide such as nickel silicide may be used.

Alternatively, a conductive material including oxygen and a metal element included in a metal oxide that can be used for the oxides 406a, 406b, and 406c and is to be described later may be used. A conductive material including any of the above metal elements and nitrogen may be used. For example, a conductive material including nitrogen, such as titanium nitride or tantalum nitride, may be used. Indium tin oxide (ITO), indium oxide including tungsten oxide, indium zinc oxide including tungsten oxide, indium oxide including titanium oxide, indium tin oxide including titanium oxide, indium zinc oxide, or indium tin oxide to which silicon is added may be used. Indium gallium zinc oxide including nitrogen may be used. With any of such materials, hydrogen included in the oxides 406a, 406b, and 406c can be captured in some cases. Alternatively, hydrogen entering from an external insulator or the like can be captured in some cases.

A stack of a plurality of conductive layers formed with the above materials may be used. For example, a stacked-layer structure formed using a combination of a material including any of the metal elements listed above and a conductive material including oxygen may be used. Alternatively, a stacked-layer structure formed using a combination of a material including any of the metal elements listed above and a conductive material including nitrogen may be used. Alternatively, a stacked-layer structure formed using a combination of a material including any of the metal elements listed above, a conductive material including oxygen, and a conductive material including nitrogen may be used.

When an oxide is used for the channel formation region of the transistor, a stacked-layer structure formed using a combination of a material including any of the above-described metal elements and a conductive material including oxygen is preferably used for the gate electrode. In that case, the conductive material including oxygen is preferably formed on the channel formation region side. When the conductive material including oxygen is formed on the channel formation region side, oxygen released from the conductive material is likely to be supplied to the channel formation region.

Metal Oxide that can be Used for Oxides 406a, 406b, and 406c

A metal oxide is preferably used for each of the oxides 406a, 406b, and 406c. However, silicon (including strained silicon), germanium, silicon germanium, silicon carbide, gallium arsenide, aluminum gallium arsenide, indium phosphide, gallium nitride, an organic semiconductor, or the like may be used instead of each of the oxides 406a, 406b, and 406c in some cases.

A metal oxide that can be used for the oxides 406a, 406b, and 406c is described.

The metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the metal oxide is InMZnO containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Structure

An oxide is classified into a single crystal oxide and a non-single-crystal oxide. Examples of a non-single-crystal oxide include a c-axis-aligned crystalline oxide semiconductor (CAAC-OS), a polycrystalline oxide, a nanocrystal-line oxide semiconductor (nc-OS), an amorphous-like oxide semiconductor (a-like OS), and an amorphous oxide.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide, depending on an analysis method.

The a-like OS has a structure between those of the nc-OS and the amorphous oxide. The a-like OS has a void or a low-density region. That is, the a-like OS has low crystallinity as compared with the nc-OS and the CAAC-OS.

An oxide can have various structures which show various different properties. Two or more of the amorphous oxide, the polycrystalline oxide, the a-like OS, the nc-OS, and the CAAC-OS may be included in an oxide of one embodiment of the present invention.

Atomic Ratio

Next, preferred ranges of the atomic ratio of indium, the element M, and zinc contained in an oxide according to the present invention are described with reference to FIGS. 23A to 23C. Note that the proportion of oxygen atoms is not shown in FIGS. 23A to 23C. The terms of the atomic ratio of indium, the element M, and zinc contained in the oxide are denoted by [In], [M], and [Zn], respectively.

Figure 23A:
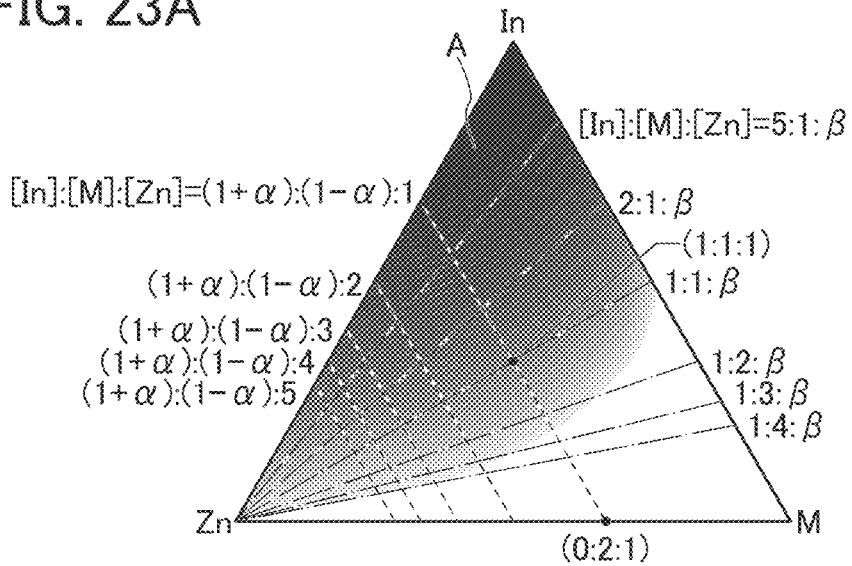
FIGS. 23A to 23C each illustrate an atomic ratio range of an oxide of one embodiment of the present invention.
Figure 23B:
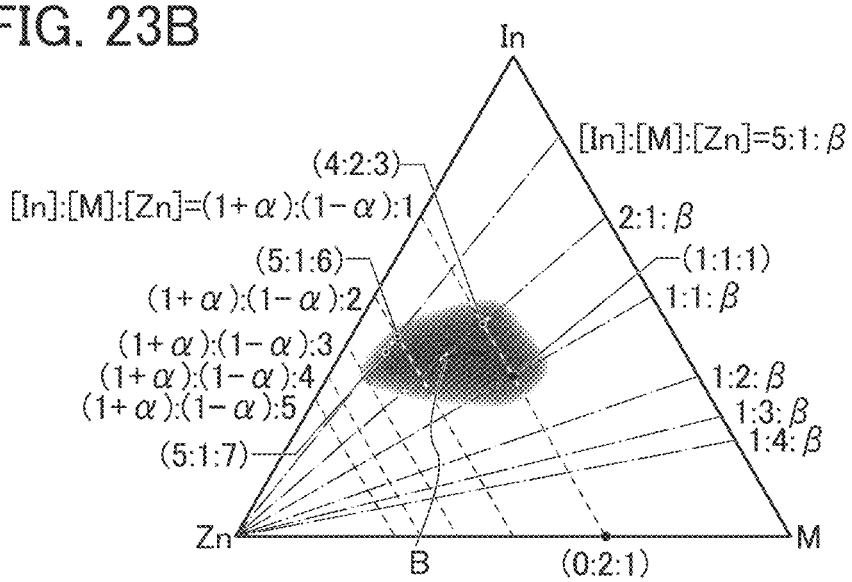
Figure 23C:
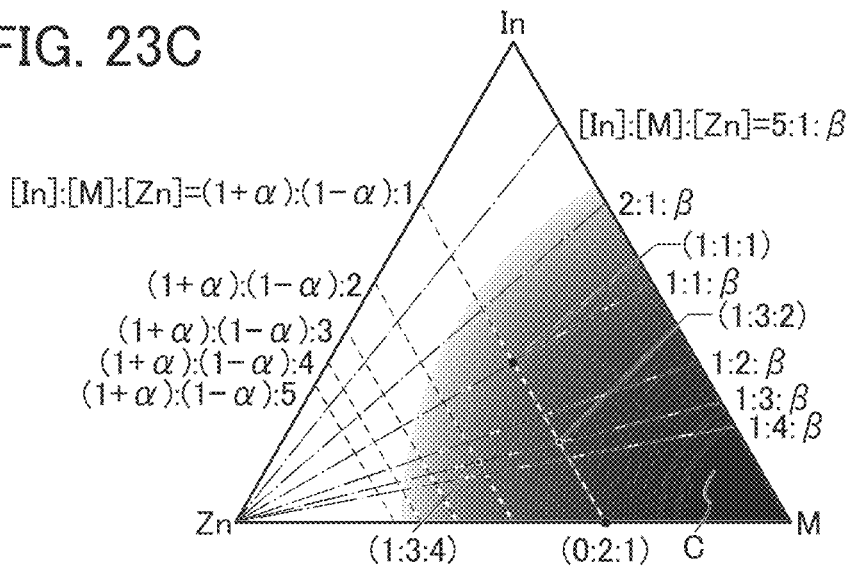

In FIGS. 23A to 23C, broken lines indicate a line where the atomic ratio [In]:[M]:[Zn] is $1+\alpha$:$(1-\alpha)$:1 (where $-1\leq\alpha\leq1$), a line where the atomic ratio [In]:[M]:[Zn] is $(1+\alpha)$:$(1-\alpha)$:2, a line where the atomic ratio [In]:[M]:[Zn] is $(1+\alpha)$:$(1-\alpha)$:3, a line where the atomic ratio [In]:[M]:[Zn] is $(1+\alpha)$:$(1-\alpha)$:4, and a line where the atomic ratio [In]:[M]:[Zn] is $(1+-\alpha)$:$(1-\alpha)$:5.

Dashed-dotted lines indicate a line where the atomic ratio [In]:[M]:[Zn] is 5:1:$\beta$ (where $\beta\geq0$), a line where the atomic ratio [In]:[M]:[Zn] is 2:1:$\beta$, a line where the atomic ratio [In]:[M]:[Zn] is 1:1:$\beta$, a line where the atomic ratio [In]:[M]:[Zn] is 1:2:$\beta$, a line where the atomic ratio [In]:[M]:[Zn] is 1:3:$\beta$, and a line where the atomic ratio [In]:[M]:[Zn] is 1:4:$\beta$.

An oxide with the atomic ratio [In]:[M]:[Zn] of 0:2:1 and the vicinity thereof in FIGS. 23A to 23C tends to have a spinel crystal structure.

A plurality of phases (e.g., two phases or three phases) exist in the oxide in some cases. For example, with an atomic ratio [In]:[M]:[Zn] in the vicinity of 0:2:1, two phases of a spinel crystal structure and a layered crystal structure are likely to exist. In addition, with an atomic ratio [In]:[M]:[Zn] in the vicinity of 1:0:0, two phases of a bixbyite crystal structure and a layered crystal structure are likely to exist. In the case where a plurality of phases exist in the oxide, a grain boundary might be formed between different crystal structures.

A region A in FIG. 23A shows an example of the preferred ranges of the atomic ratio of indium, the element M, and zinc contained in an oxide.

An oxide having a high content of indium can have high carrier mobility (electron mobility). Thus, an oxide having a high content of indium has higher carrier mobility than an oxide having a low content of indium.

In contrast, carrier mobility decreases as the indium content and the zinc content in an oxide become lower. Thus, with an atomic ratio [In]:[M]:[Zn] of 0:1:0 and the vicinity thereof (e.g., a region C in FIG. 23C), insulation performance becomes better.

Accordingly, an oxide of one embodiment of the present invention preferably has an atomic ratio represented by the region A in FIG. 23A. With the atomic ratio, a layered structure with high carrier mobility and a few grain boundaries is easily obtained.

In the region A, in particular a region B in FIG. 23B, an excellent oxide which easily becomes a CAAC-OS and has high carrier mobility can be obtained.

The CAAC-OS is an oxide with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide. This means that the CAAC-OS has small amounts of impurities and defects (e.g., oxygen vacancies). Thus, an oxide including a CAAC-OS is physically stable. Therefore, the oxide including a CAAC-OS is resistant to heat and has high reliability.

Note that the region B includes an atomic ratio [In]:[M]:[Zn] of 4:2:3 to 4:2:4.1 and the vicinity thereof. The vicinity includes an atomic ratio [In]:[M]:[Zn] of 5:3:4. Note that the region B includes an atomic ratio [In]:[M]:[Zn] of 5:1:6 and the vicinity thereof and an atomic ratio [In]:[M]:[Zn] of 5:1:7 and the vicinity thereof.

Note that the property of an oxide is not uniquely determined by an atomic ratio. Even with the same atomic ratio, the property of an oxide might be different depending on a formation condition. For example, in the case where the oxide is formed with a sputtering apparatus, a film having an atomic ratio deviated from the atomic ratio of a target is formed. In addition, [Zn] in the film might be smaller than [Zn] in the target depending on the substrate temperature in formation. Thus, the illustrated regions each represent an atomic ratio with which an oxide tends to have specific characteristics, and boundaries of the regions A to C are not clear.

Transistor Including Oxide

Next, the case where the oxide is used for a transistor is described.

When the oxide is used for a transistor, carrier scattering or the like at a grain boundary can be reduced; thus, the transistor can have high field-effect mobility. Moreover, the transistor can have high reliability.

An oxide film with a low carrier density is preferably used for the transistor. In order to reduce the carrier density of the oxide film, the impurity concentration in the oxide film is reduced so that the density of defect states can be reduced. In this specification and the like, a state with a low impurity concentration and a low density of defect states is referred to as a highly purified intrinsic or substantially highly purified intrinsic state. For example, an oxide film whose carrier density is lower than $8 \times 10^{11}/cm^3$, preferably lower than $1 \times 10^{11}/cm^3$, more preferably lower than $1 \times 10^{10}/cm^3$, and higher than or equal to $1 \times 10^{-9}/cm^3$ is used.

A highly purified intrinsic or substantially highly purified intrinsic oxide film has a low density of defect states and accordingly has a low density of trap states in some cases.

Charge trapped by the trap states in the oxide takes a long time to be released and may behave like fixed charge. Thus, a transistor whose channel formation region is formed in an oxide with a high density of trap states has unstable electrical characteristics in some cases.

In view of the above, to obtain stable transistor characteristics, it is effective to reduce the concentration of impurities in the oxide. To reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

Impurity

Here, the influence of impurities in the oxide is described.

When silicon or carbon, which is a Group 14 element, is contained in the oxide, defect states are formed in the oxide. Thus, the concentration of silicon or carbon in the oxide and around an interface with the oxide (the concentration obtained by secondary ion mass spectrometry (SIMS)) is set lower than or equal to $2 \times 10^{18}$ atoms/cm$^3$, preferably lower than or equal to $2 \times 10^{17}$ atoms/cm$^3$.

When the oxide contains alkali metal or alkaline earth metal, defect states are formed and carriers are generated in some cases. Thus, a transistor using an oxide that contains alkali metal or alkaline earth metal is likely to have normally-on characteristics. Accordingly, it is preferable to reduce the concentration of alkali metal or alkaline earth metal in the oxide. Specifically, the concentration of alkali metal or alkaline earth metal in the oxide measured by SIMS is set lower than or equal to $1 \times 10^{18}$ atoms/cm$^3$, preferably lower than or equal to $2 \times 10^{16}$ atoms/cm$^3$.

When the oxide contains nitrogen, the oxide easily becomes n-type by generation of electrons serving as carriers and an increase of carrier density. Thus, a transistor in which an oxide containing nitrogen is used as a semiconductor is likely to have normally-on characteristics. For this reason, nitrogen in the oxide is preferably reduced as much as possible. For example, the nitrogen concentration in the oxide measured by SIMS is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide reacts with oxygen bonded to a metal atom to be water, and thus causes oxygen vacancies in some cases. Due to entry of hydrogen into the oxygen vacancies, an electron serving as a carrier is sometimes generated. Furthermore, in some cases, bonding of part of hydrogen to oxygen bonded to a metal atom causes generation of an electron serving as a carrier. Thus, a transistor using an oxide that contains hydrogen is likely to have normally-on characteristics. Accordingly, it is preferred that hydrogen in the oxide be reduced as much as possible. Specifically, the hydrogen concentration in the oxide measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide with sufficiently reduced impurity concentration is used for a channel formation region in a transistor, the transistor can have stable electrical characteristics.

Band Diagram

Figure 24A:
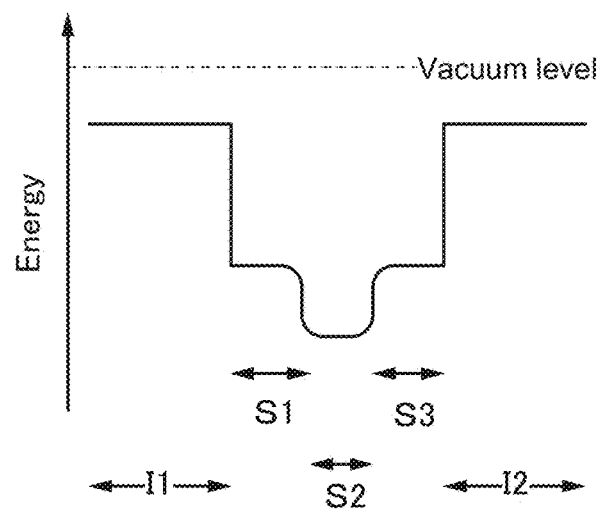
FIGS. 24A to 24C are band diagrams of stacked-layer structures of oxides.
Figure 24B:
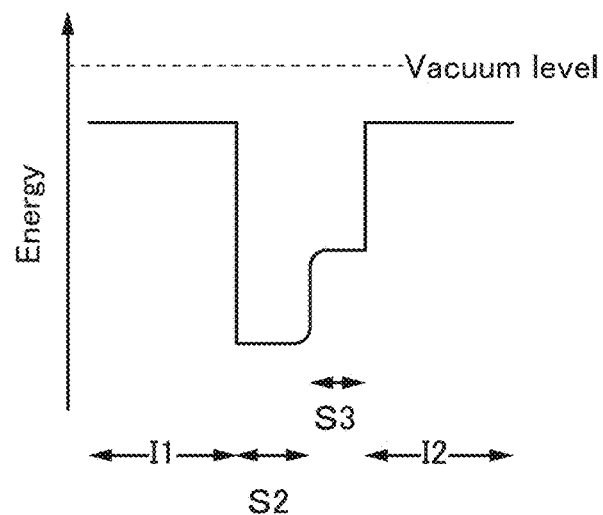
Figure 24C:
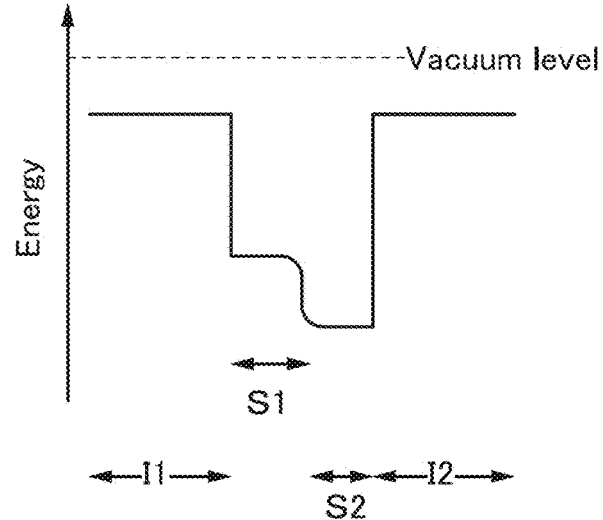

Next, the case where the oxide has a two-layer structure or a three-layer structure will be described. With reference to FIGS. 24A to 24C, the description is made on a band diagram of a layered structure of an oxide S1, an oxide S2, and an oxide S3 and insulators that are in contact with the layered structure; a band diagram of a layered structure of the oxides S2 and S3 and insulators that are in contact with the layered structure; and a band diagram of a layered structure of the oxides S1 and S2 and insulators that are in contact with the layered structure.

FIG. 24A is an example of a band diagram of a layered structure including an insulator I1, the oxide S1, the oxide S2, the oxide S3, and an insulator I2 in the thickness direction. FIG. 24B is an example of a band diagram of a layered structure including the insulator I1, the oxide S2, the oxide S3, and the insulator I2 in the thickness direction. FIG. 24C is an example of a band diagram of a layered structure including the insulator I1, the oxide S1, the oxide S2, and the insulator I2 in the thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level of the conduction band minimum between the oxide S2 and each of the oxides S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As illustrated in FIGS. 24A to 24C, the energy level of the conduction band minimum of each of the oxides S1 to S3 is gradually varied. In other words, the energy level of the conduction band minimum is continuously varied or continuous junction is formed. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, when the oxide S2 is an In—Ga—Zn oxide, it is preferable to use an In—Ga—Zn oxide, a Ga—Zn oxide, gallium oxide, or the like as the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and a large on-state current can be obtained.

When an electron is trapped by a trap state, the trapped electron behaves like fixed charge; thus, the threshold voltage of a transistor is shifted in the positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel formation region. For example, an oxide with high insulation performance and the atomic ratio represented by the region C in FIG. 23C can be used as the oxides S1 and S3. Note that the region C in FIG. 23C represents the atomic ratio [In]:[M]:[Zn] of 0:1:0, 1:3:2, and 1:3:4 and the vicinities thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

This embodiment can be implemented in an appropriate combination with any of the structures described in the other embodiments, Examples, and the like.

Embodiment 2

A method for manufacturing the semiconductor device illustrated in FIGS. 1A to 1C described below with reference to FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14C, and FIGS. 15A to 15C.

Method for Manufacturing Semiconductor Device

FIG. 6A, FIG. 7A, FIG. 8A, FIG. 9A, FIG. 10A, FIG. 11A, FIG. 12A, FIG. 13A, FIG. 14A, and FIG. 15A are top views. FIG. 6B, FIG. 7B, FIG. 8B, FIG. 9B, FIG. 10B, FIG. 11B, FIG. 12B, FIG. 13B, FIG. 14B, and FIG. 15B are cross-sectional views taken along the dashed-dotted lines A1-A2 in FIG. 6A, FIG. 7A, FIG. 8A, FIG. 9A, FIG. 10A, FIG. 11A, FIG. 12A, FIG. 13A, FIG. 14A and FIG. 15A. FIG. 6C, FIG. 7C, FIG. 8C, FIG. 9C, FIG. 10C, FIG. 11C, FIG. 12C, FIG. 13C, FIG. 14C, and FIG. 15C are cross-sectional views taken along the dashed-dotted lines A3-A4 in FIG. 6A, FIG. 7A, FIG. 8A, FIG. 9A, FIG. 10A, FIG. 11A, FIG. 12A, FIG. 13A, FIG. 14A, and FIG. 15A. FIG. 6B, FIG. 7B, FIG. 8B, FIG. 9B, FIG. 10B, FIG. 11B, FIG. 12B, FIG. 13B, FIG. 14B, and FIG. 15B are A1-A2 cross-sectional views of the transistor in the channel length direction, and FIG. 6C, FIG. 7C, FIG. 8C, FIG. 9C, FIG. 10C, FIG. 11C, FIG. 12C, FIG. 13C, FIG. 14C, and FIG. 15C are A3-A4 cross-sectional views of the transistor in the channel width direction.

First, the substrate 400 is prepared.

Next, the oxide 401a is formed. The oxide 401a can be formed by a sputtering method, a chemical vapor deposition (CVD) method, a molecular beam epitaxy (MBE) method, a pulsed laser deposition (PLD) method, an atomic layer deposition (ALD) method, or the like.

The CVD method can include a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using a PECVD method, a high-quality film can be formed at a relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a TCVD method not using plasma is employed, such plasma damage is not caused and the yield of semiconductor devices can be increased. A TCVD method does not cause plasma damage during formation, so that a film with few defects can be obtained.

An ALD method also causes less plasma damage to an object. An ALD method does not cause plasma damage during formation, so that a film with few defects can be obtained.

Unlike in a film formation method in which particles ejected from a target or the like are formed, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low film formation rate; thus, it is sometimes preferable to combine an ALD method with another film formation method with a high film formation rate such as a CVD method.

When a CVD method or an ALD method is used, the composition of a film to be formed can be controlled with a flow rate ratio of a source gas. For example, by a CVD method or an ALD method, a film with a certain composition can be formed depending on a flow rate ratio of a source gas. Moreover, by changing the flow rate ratio of a source gas during formation by a CVD method or an ALD method, a film whose composition is continuously changed can be formed. In the case where a film is formed while the flow rate ratio of a source gas is changed, the time for formation can be shorter than in the case where a film is formed using a plurality of film formation chambers because time for transfer and pressure adjustment can be saved. Thus, semiconductor devices can be manufactured with improved productivity in some cases.

Next, the oxide 401b is formed over the oxide 401a. The oxide 401b can be formed by a sputtering method, a CVD method, an MBE method, a PLD method, an ALD method, or the like. Then, the insulator 301 is formed over the oxide 401b. The insulator 301 can be formed by a sputtering method, a CVD method, an MBE method, a PLD method, an ALD method, or the like.

Then, a groove is formed in the insulator 301 to reach the oxide 401b. Examples of the groove include a depressed portion, a hole, and an opening. In forming the groove, wet etching may be employed; however, dry etching is preferably employed in terms of microfabrication. The oxide 401b is preferably an insulator that serves as an etching stopper film used in forming the groove by etching the insulator 301. For example, in the case where a silicon oxide film is used as the insulator 301 in which the groove is to be formed, the oxide 401b is preferably formed using a silicon nitride film, an aluminum oxide film, or a hafnium oxide film.

In this embodiment, aluminum oxide is formed by a sputtering method for the oxide 401a, and aluminum oxide is formed by an ALD method for the oxide 401b. Silicon oxide is formed by a CVD method for the insulator 301.

After the formation of the groove, a conductor to be the conductor 310a is formed. The conductor to be the conductor 310 desirably contains a conductor that has a function of inhibiting the passage of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductor 310 can be formed by a sputtering method, a CVD method, an MBE method, a PLD method, an ALD method, or the like.

In this embodiment, tantalum nitride is formed by a sputtering method for the conductor to be the conductor 310a.

Then, a conductor to be the conductor 310b is formed over the conductor to be the conductor 310a. The conductor to be the conductor 310b can be formed by a sputtering method, a CVD method, an MBE method, a PLD method, an ALD method, or the like.

In this embodiment, for the conductor to be the conductor 310b, titanium nitride is formed by a CVD method and tungsten is formed by a CVD method over the titanium nitride.

Next, chemical mechanical polishing (CMP) is performed to remove the conductors to be the conductors 310a and 310b that are located over the insulator 301. Consequently, the conductors to be the conductors 310a and 310b remain only in the groove, whereby the conductor 310 that includes the conductors 310a and 310b can be formed.

Next, the insulator 302 is formed over the insulator 301 and the conductor 310. The insulator 302 can be formed by a sputtering method, a CVD method, an MBE method, a PLD method, an ALD method, or the like.

Next, the insulator 303 is formed over the insulator 302. The insulator 303 can be formed by a sputtering method, a CVD method, an MBE method, a PLD method, an ALD method, or the like.

Next, the insulator 402 is formed over the insulator 303. The insulator 402 can be formed by a sputtering method, a CVD method, an MBE method, a PLD method, an ALD method, or the like.

In this embodiment, silicon oxynitride is formed by a CVD method for the insulator 302, hafnium oxide is formed by an ALD method for the insulator 303, and silicon oxynitride is formed by a CVD method for the insulator 402.

Next, CMP may be performed to planarize the top surface of the insulator 402. Due to the difference in the height between the top surfaces of the conductor 310 and the insulator 301, a step may be generated in the vicinity of the boundary between the top surfaces of the conductor 310 and the insulator 301. When the step is reduced by CMP, a decrease in coverage with the film formed later can be prevented, and thus a decrease in the yield of the semiconductor device can be prevented in some cases. The step that remains after CMP is preferably less than or equal to 3 nm, further preferably less than or equal to 1 nm.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in nitrogen, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in nitrogen or an inert gas atmosphere, and then another heat treatment is performed in an atmosphere containing an oxidizing gas at 10 ppm or more, 1% or more, or 10% or more in order to compensate for released oxygen. By the first heat treatment, impurities such as hydrogen and water included in the insulator 402 can be removed, for example. Alternatively, in the first heat treatment, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 402. Alternatively, after plasma treatment using an inert gas with the apparatus, plasma treatment using oxygen in order to compensate for released oxygen may be performed. Note that the first heat treatment is not necessarily performed in some cases.

This heat treatment can also be performed after the formation of the insulator 302, after the formation of the insulator 303, and after the formation of the insulator 402. Although the heat treatment can be performed under the conditions for the first heat treatment, heat treatment after the formation of the insulator 302 is preferably performed in an atmosphere containing nitrogen.

In this embodiment, the heat treatment is performed after the formation of the insulator 402 in the following manner: heat treatment is performed in a nitrogen atmosphere at 400° C. for one hour, and then another treatment is successively performed in an oxygen atmosphere at 400° C. for one hour.

Next, an oxide 406a1 is formed over the insulator 402. The oxide 406a1 can be formed by a sputtering method, a CVD method, an MBE method, a PLD method, an ALD method, or the like.

Next, treatment for adding oxygen to the oxide 406a1 may be performed. An ion implantation method, a plasma treatment method, or the like can be used for the treatment for adding oxygen. Note that oxygen added to the oxide 406a1 serves as excess oxygen. Next, an oxide 406b1 is formed over the oxide 406a1. The oxide 406b1 can be formed by a sputtering method, a CVD method, an MBE method, a PLD method, an ALD method, or the like.

After that, second heat treatment may be performed. For the second heat treatment, the conditions for the first heat treatment can be used. By the second heat treatment, impurities such as hydrogen and water included in the oxide 406b1 can be removed, for example. In this embodiment, the heat treatment is performed in a nitrogen atmosphere at 400° C. for one hour and then another treatment is successively performed in an oxygen atmosphere at 400° C. for one hour.

Next, a conductor 416 is formed over the oxide 406b1. The conductor 416 can be formed by a sputtering method, a CVD method, an MBE method, a PLD method, an ALD method, or the like. For the conductor 416, a conductive oxide such as indium tin oxide (ITO), indium oxide including tungsten oxide, indium zinc oxide including tungsten oxide, indium oxide including titanium oxide, indium tin oxide including titanium oxide, indium zinc oxide, indium tin oxide to which silicon is added, or indium gallium zinc oxide including nitrogen is formed, and a material including one or more of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like, a semiconductor with high electric conductivity, typified by polycrystalline silicon including an impurity element such as phosphorus, or a silicide such as nickel silicide may be formed over the oxide.

The oxide may have a function of absorbing hydrogen in the oxides 406a1 and 406b1 and capturing hydrogen diffused from the outside; thus, the transistor characteristics and reliability of the transistor are improved in some cases. Titanium instead of the oxide may have a similar function. In this embodiment, tantalum nitride is formed for the conductor 416.

Then, a barrier film 417 is formed over the conductor 416. The barrier film 417 can be formed by a sputtering method, a CVD method, an MBE method, a PLD method, an ALD method, or the like. In this embodiment, aluminum oxide is formed for the barrier film 417.

Subsequently, a conductor 411 is formed over the barrier film 417. The conductor 411 can be formed by a sputtering method, a CVD method, an MBE method, a PLD method, an ALD method, or the like. In this embodiment, tantalum nitride is formed for the conductor 411 (see FIGS. 6A to 6C).

Next, the conductor 411 is processed by a lithography method to form a conductor 411a. Through this processing, the conductor 411a preferably has a tapered cross section. The taper angle between the cross section and a plane parallel to the bottom surface of the substrate is greater than or equal to 30° and less than 75°, preferably greater than or equal to 30° and less than 70°. With such a taper angle, coverage with films formed later in the manufacturing process can be improved. The processing is preferably performed by a dry etching method. The dry etching method is suitable for microfabrication and the above described formation of a tapered shape (see FIGS. 7A to 7C).

In the lithography method, first, a resist is exposed to light through a mask. Next, a region exposed to light is removed or left using a developing solution, so that a resist mask is formed. Then, etching is performed with the resist mask. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that dry etching treatment such as ashing or wet etching treatment can be used for removal of the resist mask. Alternatively, wet etching treatment can be performed after dry etching treatment. Still alternatively, dry etching treatment can be performed after wet etching treatment.

As a dry etching apparatus, a capacitively coupled plasma (CCP) etching apparatus including parallel plate type electrodes can be used. The capacitively coupled plasma etching apparatus including parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, a resist 421 is formed by a lithography method.

Figure 8A:
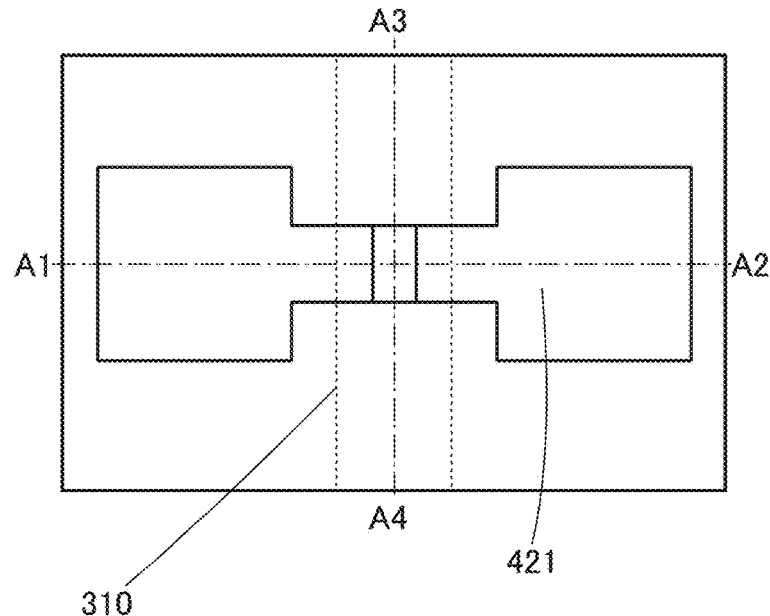
FIGS. 8A to 8C illustrate a method for manufacturing a transistor of one embodiment of the present invention.
Figure 8C:
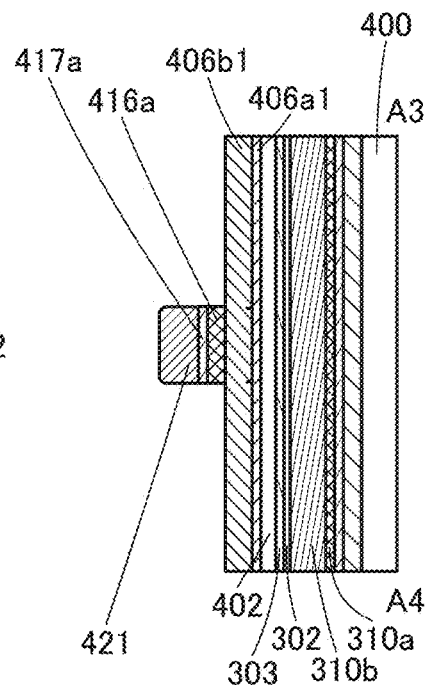
Figure 8B:
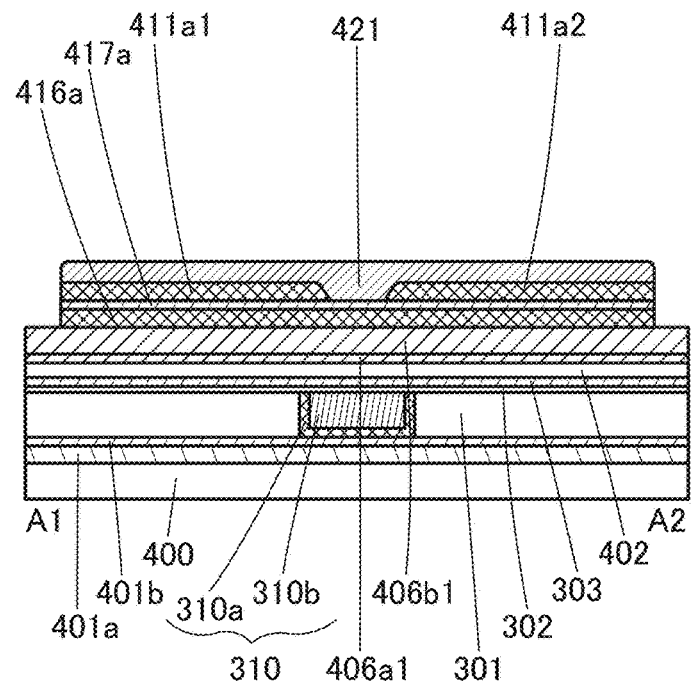
Figure 9A:
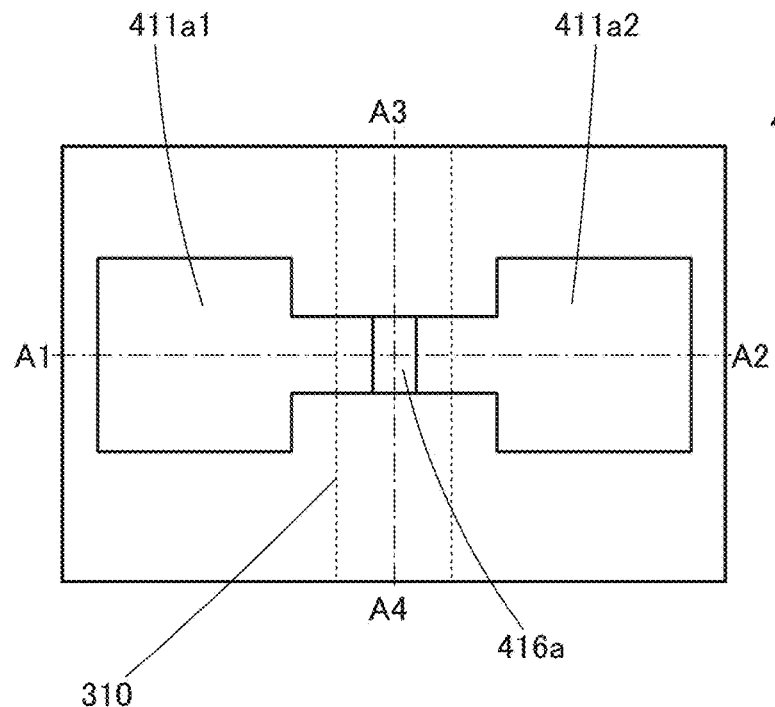
FIGS. 9A to 9C illustrate a method for manufacturing a transistor of one embodiment of the present invention.
Figure 9C:
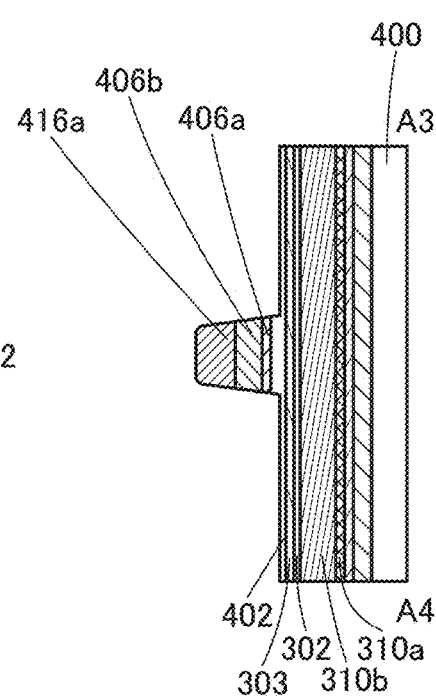
Figure 9B:
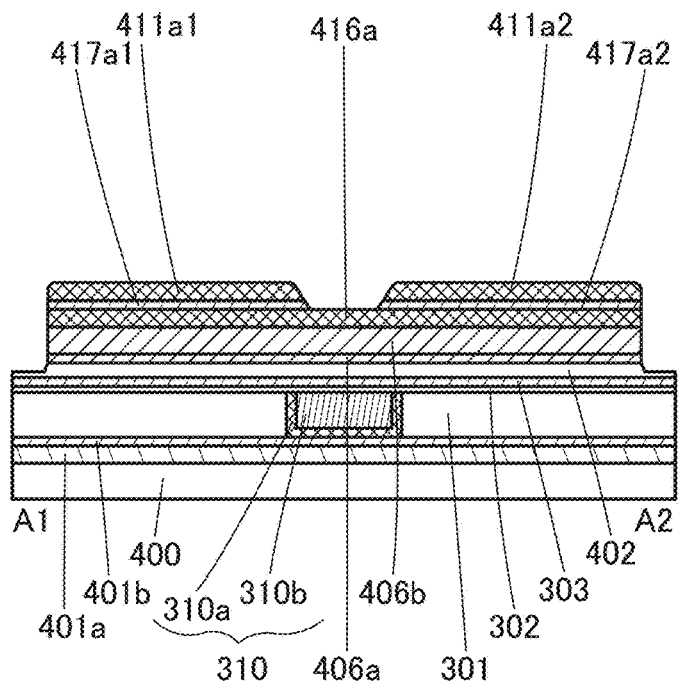

Next, the conductor 411a, the barrier film 417, and the conductor 416 are etched with the use of the resist 421 as an etching mask to form a conductor 411a1, a conductor 411a2, a barrier film 417a, and a conductor 416a (see FIGS. 8A to 8C).

Next, the resist 421 is removed, and then the barrier film 417a is etched with the use of the conductors 411a1 and 411a2 as etching masks to form the barrier films 417a1 and 417a2.

Next, the oxides 406a1 and 406b1 are etched with the use of the conductor 411a1, the conductor 411a2, and an exposed portion of the surface of the conductor 416a as etching masks to form the oxides 406a and 406b. In this embodiment, tantalum nitride is used for the conductors 411a1, 411a2, and 416a. Therefore, the oxides 406a1 and 406b1 are preferably processed under an etching condition in which the etching rates of the oxides 406a1 and 406b1 are higher than the etching rate of tantalum nitride. When the etching rate of tantalum nitride is regarded as 1, the etching rates of the oxides 406a1 and 406b1 are higher than or equal to 3 and lower than or equal to 50, preferably higher than or equal to 5 and lower than or equal to 30 (see FIGS. 9A to 9C).

Figure 10A:
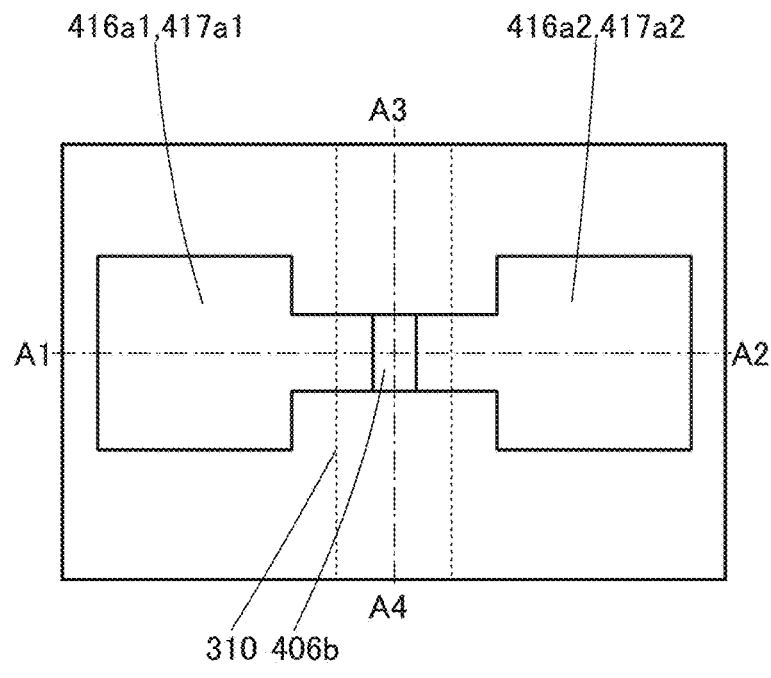
FIGS. 10A to 10C illustrate a method for manufacturing a transistor of one embodiment of the present invention.
Figure 10C:
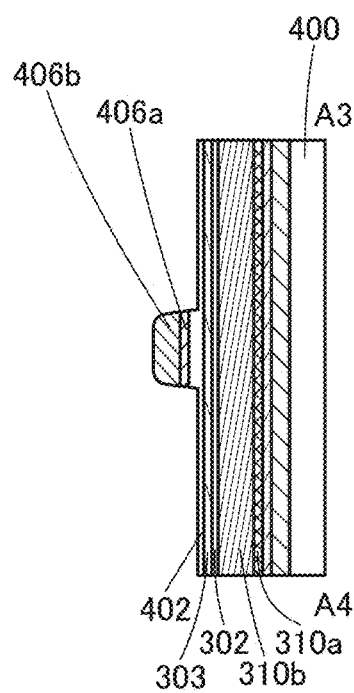
Figure 10B:
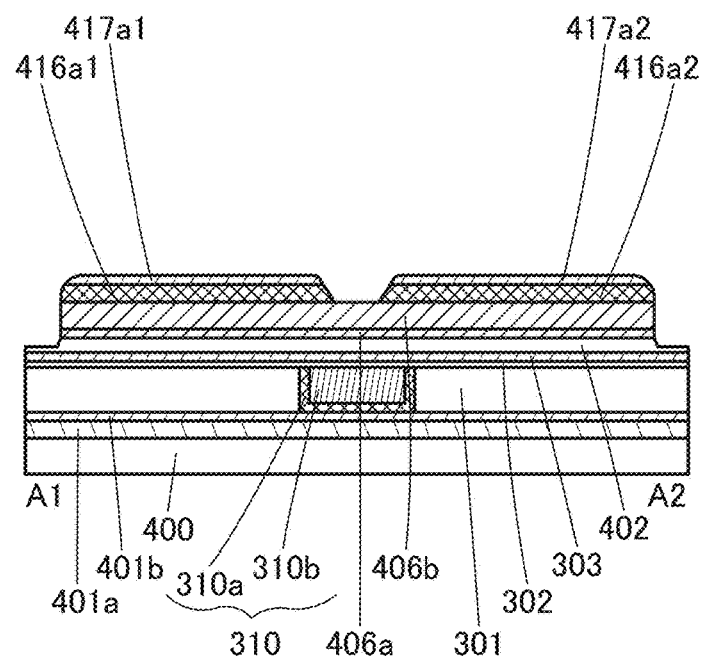
Figure 11A:
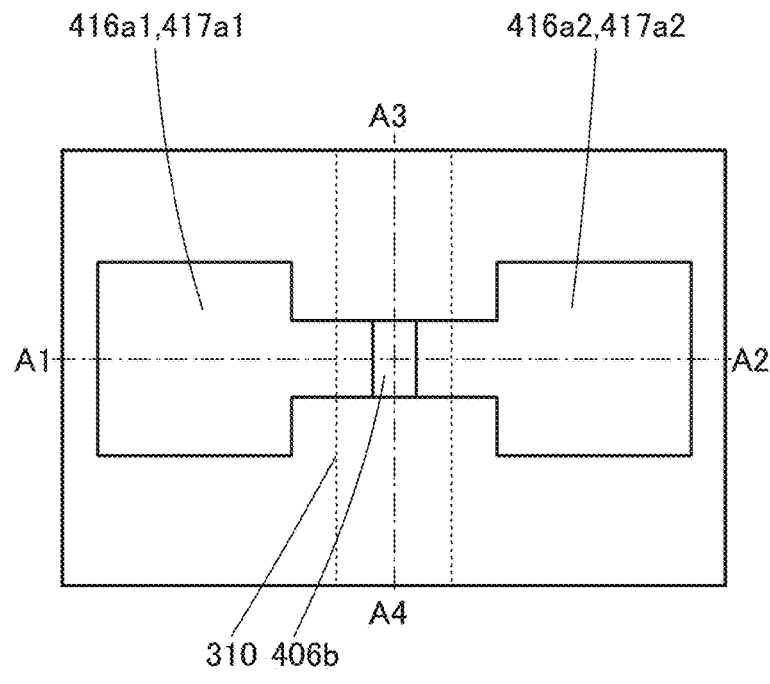
FIGS. 11A to 11C illustrate a method for manufacturing a transistor of one embodiment of the present invention.
Figure 11C:
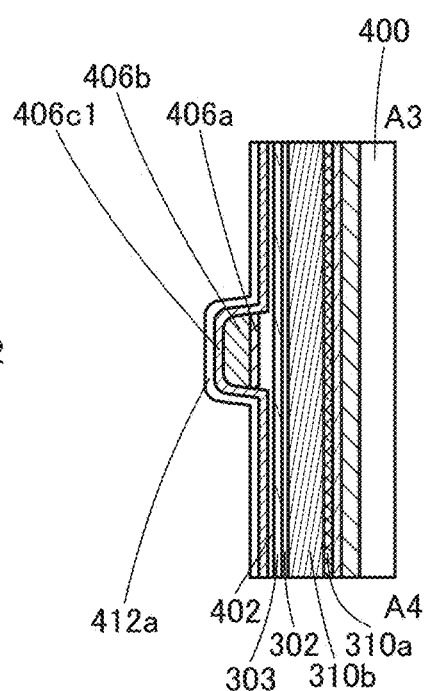
Figure 11B:
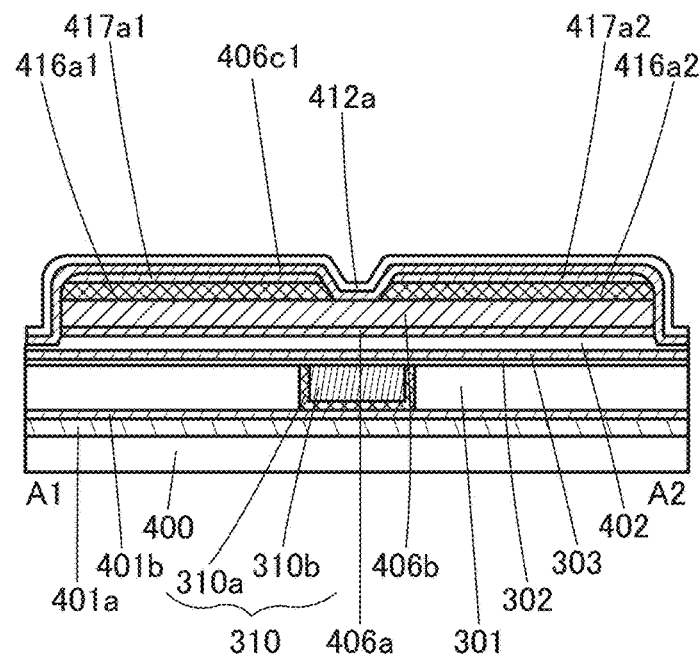

Next, the conductor 411a1, the conductor 411a2, and the exposed portion of the surface of the conductor 416a are etched to form the conductors 416a1 and 416a2 (see FIGS. 10A to 10C). Here, as illustrated in FIG. 10C, the oxide 406b may have a curved surface between the side surface and the top surface. The curvature radius of a curved surface of the oxide 406b is greater than or equal to 3 nm and less than or equal to 10 nm.

Then, washing treatment may be performed using an aqueous solution in which hydrofluoric acid is diluted with carbonated water or pure water (diluted hydrogen fluoride solution). In this embodiment, washing treatment is performed using a mixed solution of carbonated water and hydrofluoric acid. The concentration of hydrofluoric acid is approximately 70 ppm.

Next, third heat treatment may be performed. For the third heat treatment, the conditions for the first heat treatment can be used. In this embodiment, the third heat treatment is not performed.

In some cases, dry etching performed in the above process causes the attachment or diffusion of an impurity due to an etching gas into a surface or an inside portion of the oxide 406a, the oxide 406b, or the like. Examples of the impurity include fluorine and chlorine.

The above treatment allows a reduction in impurity concentration. Furthermore, the moisture concentration and the hydrogen concentration in the oxides 406a and 406b can be reduced.

Next, an oxide 406c1 is formed. The oxide 406c1 can be formed by a sputtering method, a CVD method, an MBE method, a PLD method, an ALD method, or the like. A sputtering method is especially preferred for the formation. Furthermore, sputtering conditions are as follows: a mixed gas of oxygen and argon is used; the oxygen partial pressure is preferably high, further preferably only oxygen is used; and the formation temperature is room temperature or higher than or equal to 100° C. and lower than or equal to 200° C.

The oxide 406c1 is preferably formed under the above conditions, in which case excess oxygen can be added to the oxide 406a, the oxide 406b, and the insulator 402.

Next, an insulator 412a is formed over the oxide 406c1. The insulator 412a can be formed by a sputtering method, a CVD method, an MBE method, a PLD method, an ALD method, or the like (see FIGS. 11A to 11C).

Here, fourth heat treatment may be performed. For the fourth heat treatment, the conditions for the first heat treatment can be used. The heat treatment can reduce the moisture concentration and the hydrogen concentration in the insulator 412a. In this embodiment, the fourth heat treatment is not performed.

Next, a conductor to be the conductor 404 is formed. The conductor to be the conductor 404 can be formed by a sputtering method, a CVD method, an MBE method, a PLD method, an ALD method, or the like.

The conductor 404 may be a multilayer film including, for example, the conductors 404a and 404b. For example, as a conductor to be the conductor 404a, an oxide is formed under conditions similar to those for the oxide 406c1, whereby oxygen can be added to the insulator 412a. Note that oxygen added to the insulator 412a serves as excess oxygen.

Then, a conductor is formed over the oxide by a sputtering method. As a result, the electric resistance of the oxide is decreased, whereby the oxide can be the conductor to be the conductor 404a. Furthermore, a conductor to be the conductor 404b may be formed over the conductor to be the conductor 404a by a sputtering method or the like. In this embodiment, titanium nitride is formed by a sputtering method as the conductor to be the conductor 404a, and tungsten is formed by a sputtering method as the conductor to be the conductor 404b.

Here, fifth heat treatment may be performed. For the fifth heat treatment, the conditions for the first heat treatment can be used. In this embodiment, the fifth heat treatment is not performed.

Figure 12A:
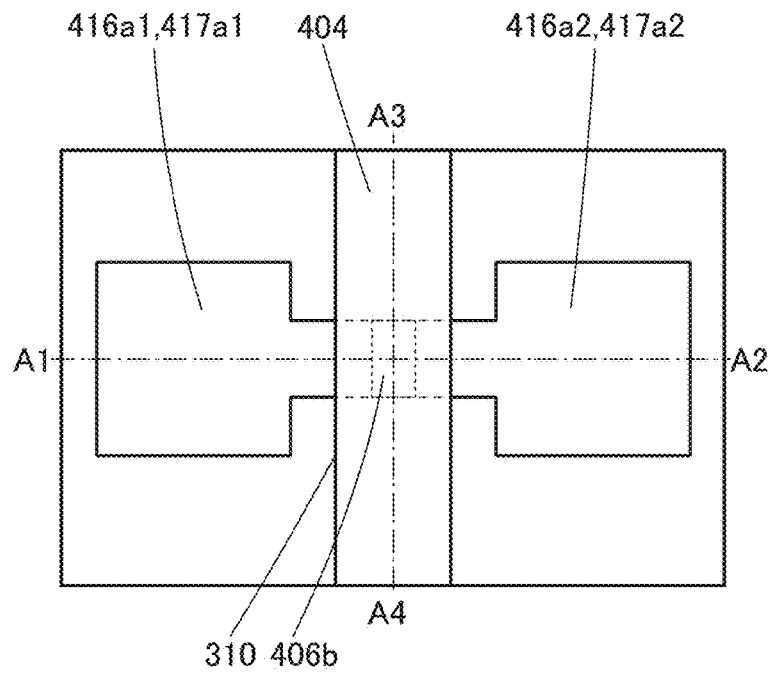
FIGS. 12A to 12C illustrate a method for manufacturing a transistor of one embodiment of the present invention.
Figure 12C:
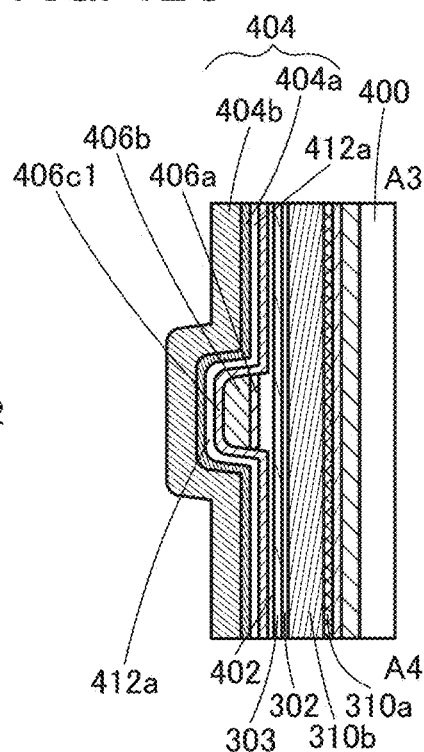
Figure 12B:
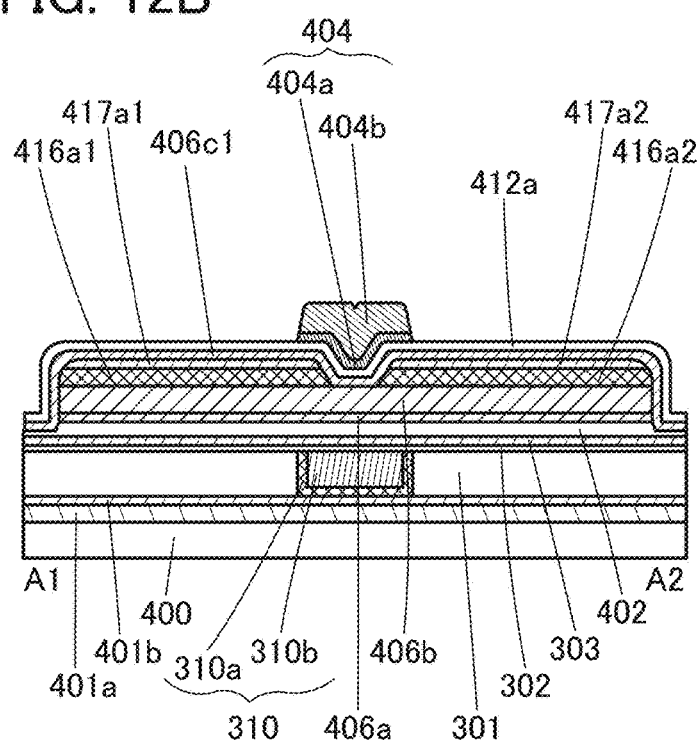
Figure 13A:
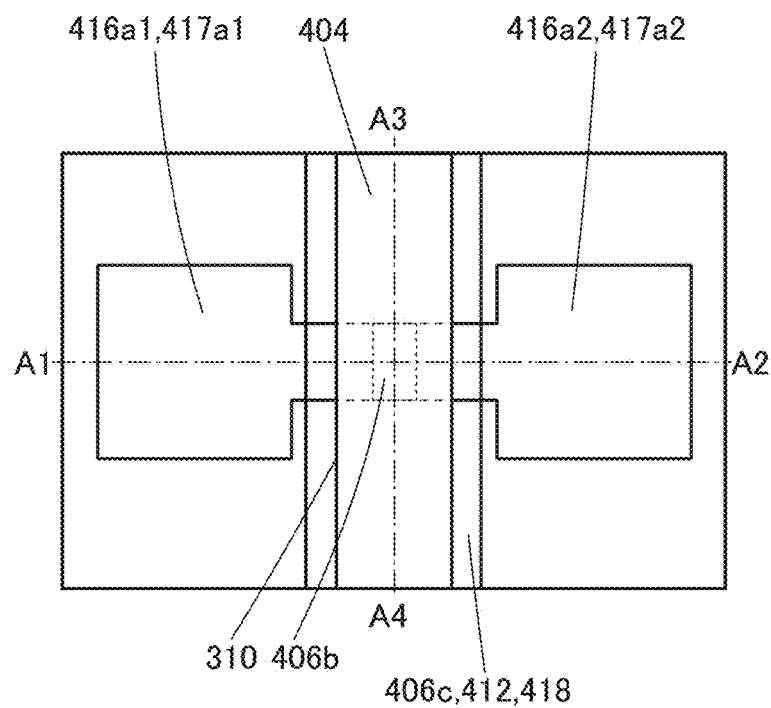
FIGS. 13A to 13C illustrate a method for manufacturing a transistor of one embodiment of the present invention.
Figure 13C:
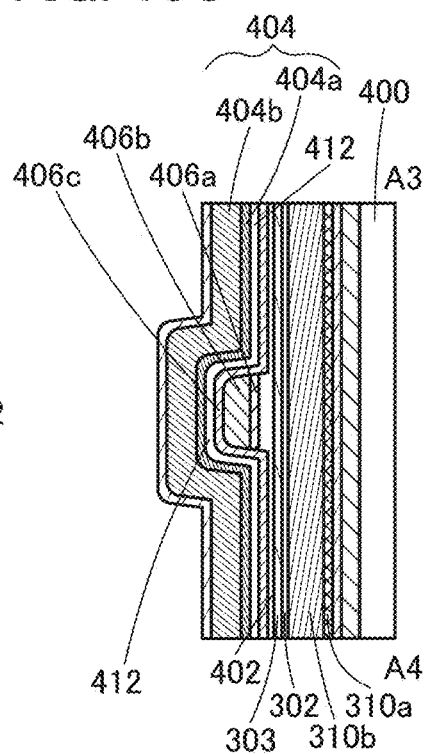
Figure 13B:
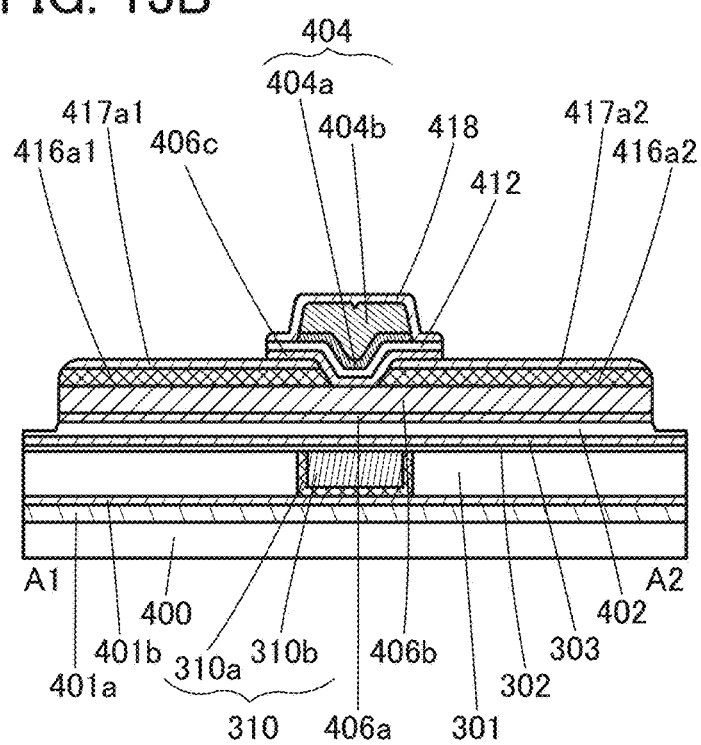
Figure 14A:
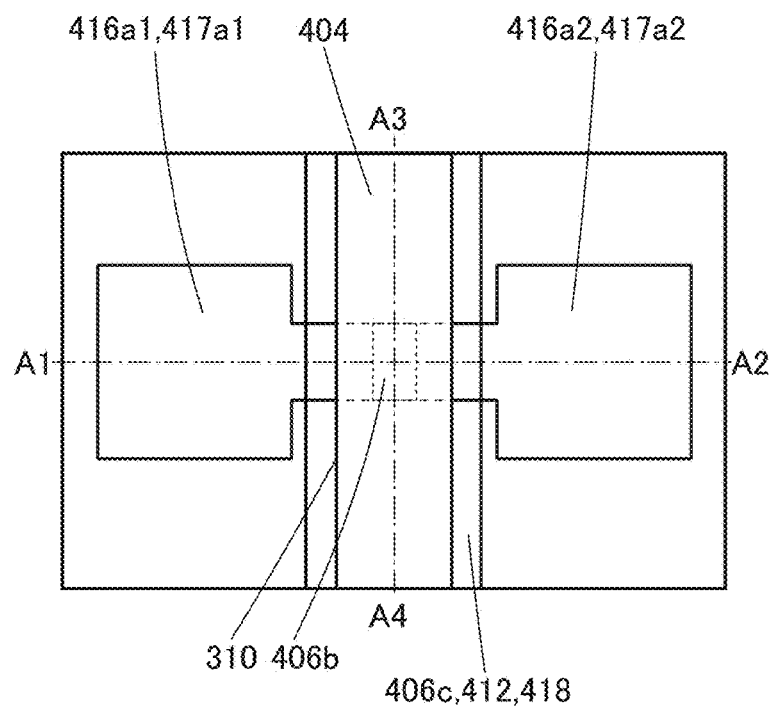
FIGS. 14A to 14C illustrate a method for manufacturing a transistor of one embodiment of the present invention.
Figure 14C:
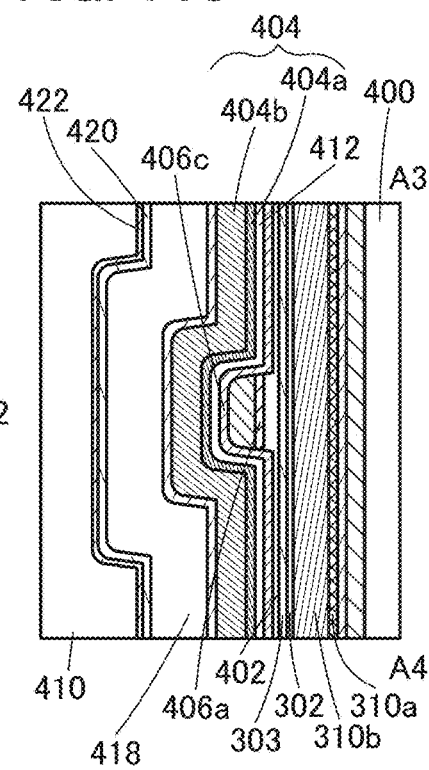
Figure 14B:
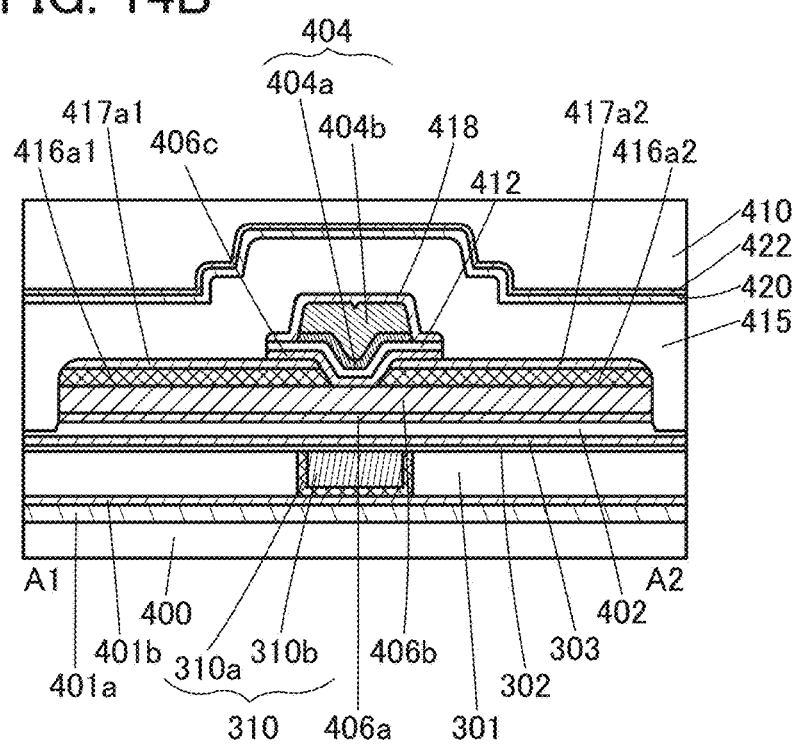
Figure 15A:
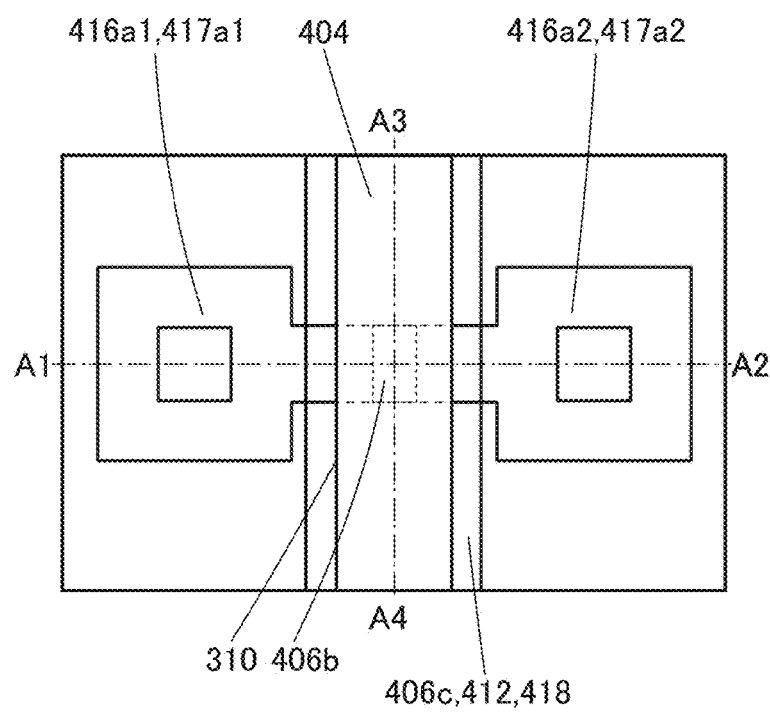
FIGS. 15A to 15C illustrate a method for manufacturing a transistor of one embodiment of the present invention.
Figure 15C:
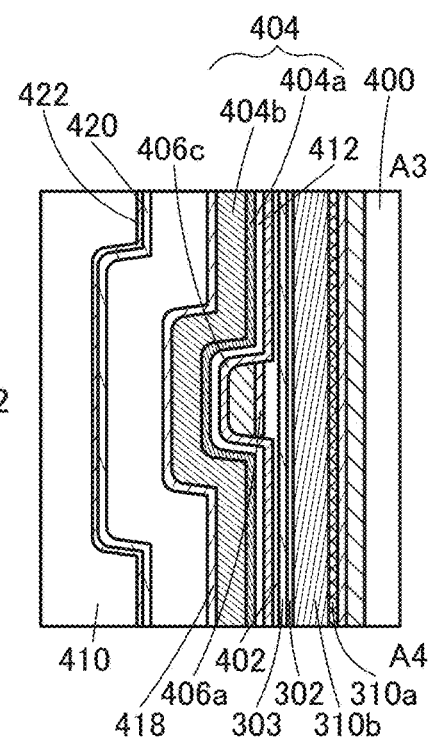
Figure 15B:
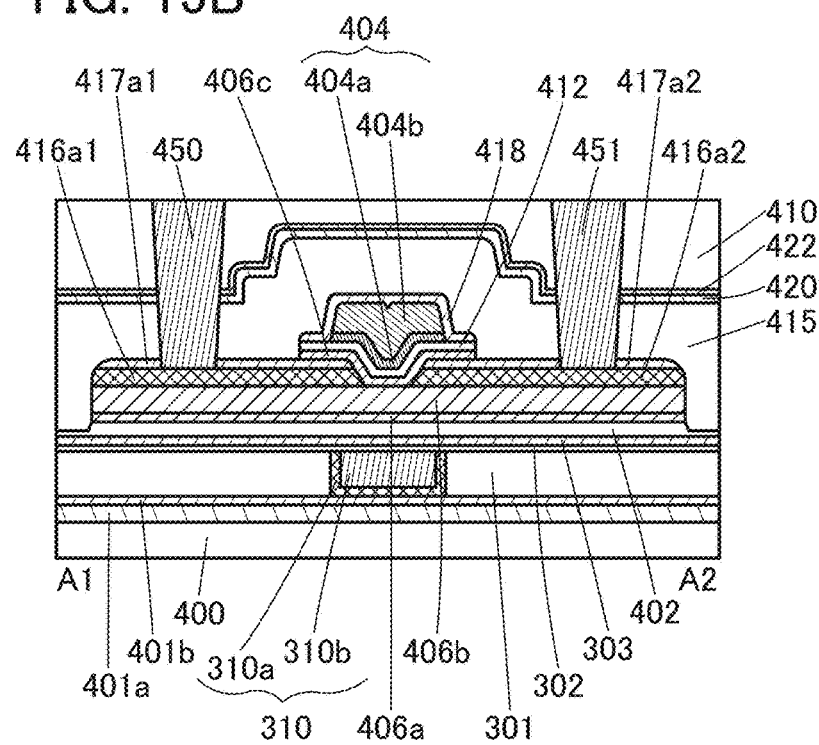

The conductors to be the conductors 404a and 404b are processed by a lithography method to form the conductors 404a and 404b (see FIGS. 12A to 12C).

Next, an oxide to be the oxide 418 may be formed. The oxide to be the oxide 418 is preferably formed using a metal oxide, which can be formed by a sputtering method, a CVD method, an MBE method, a PLD method, an ALD method, or the like. For example, in the case where aluminum oxide is formed by an ALD method, the oxide to be the oxide 418 can be formed to have few pinholes and uniform thickness on the top and side surfaces of the conductor 404, resulting in prevention of oxidation of the conductor 404. In this embodiment, aluminum oxide is formed by an ALD method.

Next, the oxide to be the oxide 418, the insulator 412a, and the oxide 406c1 are processed by a lithography method to form the oxide 418, the insulator 412, and the oxide 406c. Here, the end portions of the oxide 418, the end portions of the insulator 412, and the end portions of the oxide 406c are aligned and positioned over the barrier films 417a1 and 417a2 in the cross-sectional view in the channel length direction (see FIGS. 13A to 13C).

Next, the insulator 415 is formed. The insulator 415 can be formed by a sputtering method, a CVD method, an MBE method, a PLD method, an ALD method, or the like. It is preferable that the insulator 415 transmits oxygen more easily than the oxide 418. In this embodiment, silicon oxide is formed by a CVD method.

Next, the oxides 420 and 422 are formed. The oxides 420 and 422 are preferably formed using a metal oxide, which can be formed by a sputtering method, a CVD method, an MBE method, a PLD method, an ALD method, or the like.

When aluminum oxide is formed by a sputtering method with the use of oxygen plasma for the oxide 420, oxygen can be added to the insulator 415. The added oxygen serves as excess oxygen in the insulator 415, and the excess oxygen is effectively added to the oxide 406b including the channel formation region from the insulator 415 through the insulator 402 by heat treatment performed after the formation of the oxide 420, whereby defects in the channel formation region can be repaired.

When aluminum oxide is formed by an ALD method for the oxide 422, the oxide 422 can have few pinholes and uniform thickness, whereby entry of impurities such as hydrogen from the outside can be prevented. In addition, outward diffusion of the oxygen added to the oxide 422 can be prevented. In this embodiment, aluminum oxide is formed by a sputtering method for the oxide 420 and aluminum oxide is formed by an ALD method for the oxide 422.

Next, the insulator 410 is formed. The insulator 410 can be formed by a sputtering method, a CVD method, an MBE method, a PLD method, an ALD method, or the like. In this embodiment, silicon oxynitride is formed. Then, CMP may be performed to planarize the top surface of the insulator 410 (see FIGS. 14A to 14C).

Next, an opening reaching the conductor 416a1 through the insulator 410, the oxide 422, the oxide 420, the insulator 415, and the barrier film 417a1 is formed by a lithography method. Then, a conductor is embedded in the opening, whereby the electrode 450 is formed. Similarly, an opening reaching the conductor 416a2 through the insulator 410, the oxide 422, the oxide 420, the insulator 415, and the barrier film 417a2 is formed by a lithography method. Then, a conductor is embedded in the opening, whereby the electrode 451 is formed (see FIGS. 15A to 15C).

As the method for forming the openings, the following steps may be employed: a conductor is formed over the insulator 410, an insulator is formed over the conductor, a resist mask is formed over the insulator, the conductor and the insulator are processed using the resist mask as an etching mask, and etching is performed using the conductor and the insulator as etching masks, whereby openings are formed.

The conductors to be the electrodes 450 and 451 can be formed by a sputtering method, a CVD method, an MBE method, a PLD method, an ALD method, or the like. The conductors to be the electrodes 450 and 451 can have a multilayer structure. For example, a multilayer structure of a conductor having a function of inhibiting the passage of oxygen and a conductor different from the conductor may be used. In this embodiment, titanium nitride and tungsten are successively formed in this order by a CVD method. Through the above steps, the semiconductor device illustrated in FIGS. 1A to 1C can be manufactured.

This embodiment can be implemented in an appropriate combination with any of the structures described in the other embodiments, Examples, and the like.

Embodiment 3

In this embodiment, one embodiment of a semiconductor device will be described with reference to FIG. 16, FIG. 17, FIG. 18, and FIG. 19. Semiconductor devices illustrated in FIG. 16 and FIG. 17 each include a transistor 300, a transistor 200, and a capacitor 100.

The transistor 200 is a transistor in which a channel is formed in a semiconductor layer including an oxide semiconductor. Since the off-state current of the transistor 200 is low, by using the transistor 200 in a memory device, stored data can be retained for a long time. In other words, such a memory device does not require refresh operation or has an extremely low frequency of the refresh operation, which leads to a sufficient reduction in power consumption.

Figure 16:
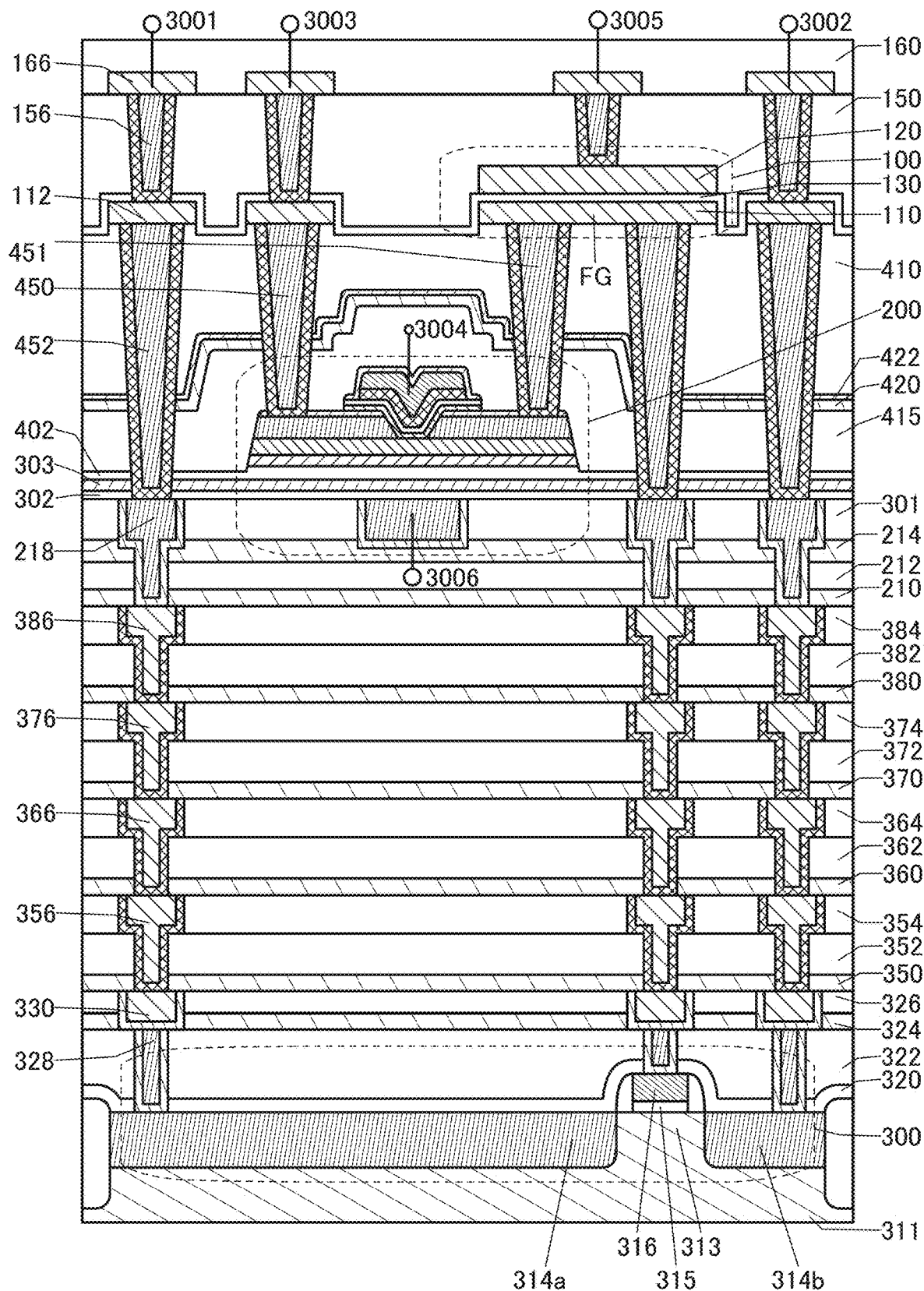
FIG. 16 is a cross-sectional view illustrating a semiconductor device of one embodiment of the present invention.
Figure 17:
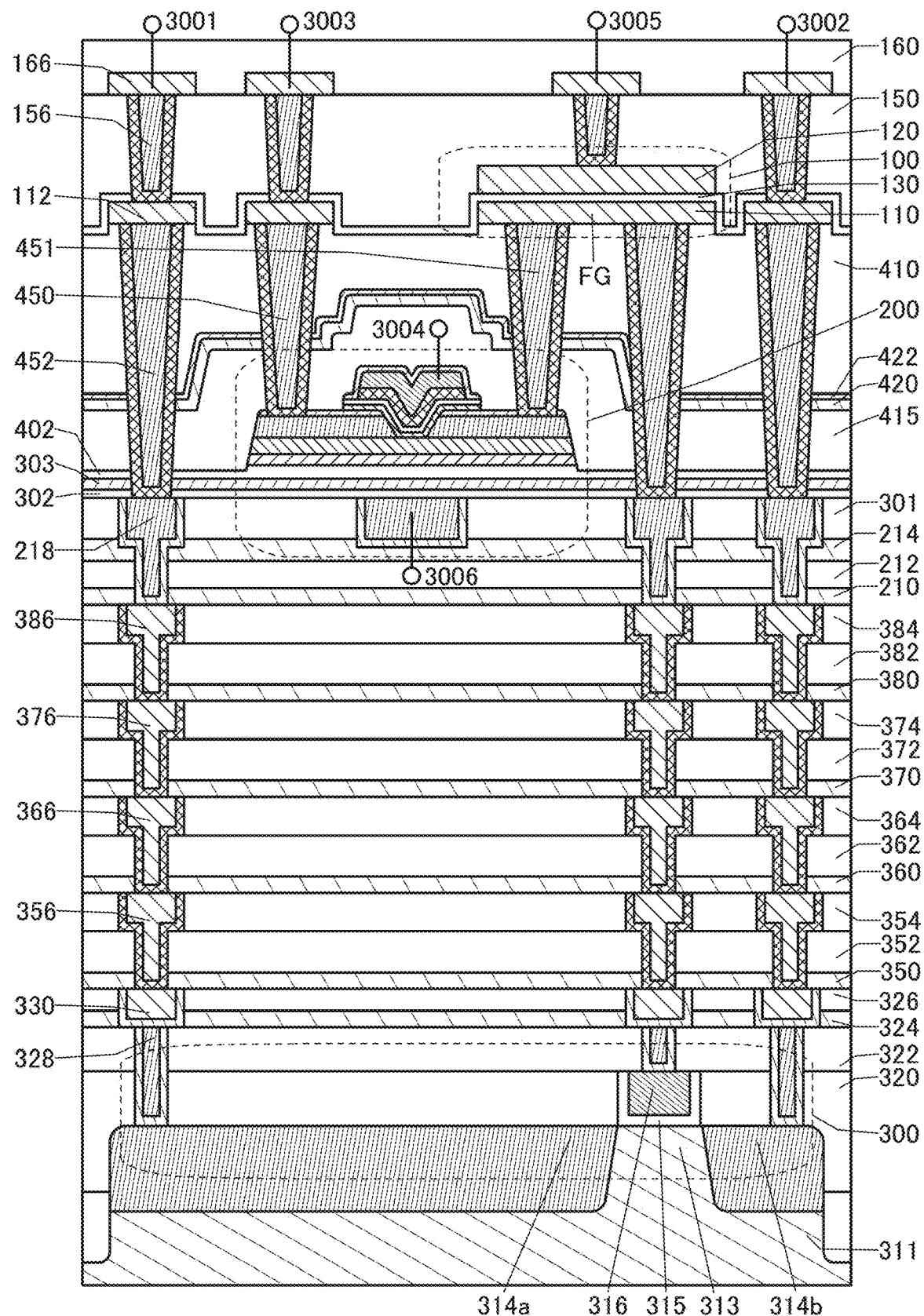
FIG. 17 is a cross-sectional view illustrating a semiconductor device of one embodiment of the present invention.

In FIG. 16 and FIG. 17, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to a first gate of the transistor 200. A wiring 3006 is electrically connected to a second gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor devices illustrated in FIG. 16 and FIG. 17 each have a feature that the potential of the gate of the transistor 300 can be retained, and thus enables writing, retaining, and reading of data as follows.

Writing and retaining of data will be described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained at the node FG (retaining).

In the case where the off-state current of the transistor 200 is low, the charge of the node FG is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level charge is given to the gate of the transistor 300 is lower than an apparent threshold voltage $V_{th\_L}$ at the time when the low-level charge is given to the gate of the transistor 300. Here, an apparent threshold voltage refers to the potential of the wiring 3005 which is needed to make the transistor 300 be in "on state." Thus, the potential of the wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the wiring 3005 is $V_0$ ($>V_{th\_H}$), the transistor 300 is brought into "on state." On the other hand, in the case where the low-level charge is supplied to the node FG in writing, even when the potential of the wiring 3005 is $V_0$ ($<V_{th\_L}$), the transistor 300 remains in "off state." Thus, the data retained in the node FG can be read by determining the potential of the wiring 3002.

Structure Example 3 of Semiconductor Device

The semiconductor device of one embodiment of the present invention includes the transistor 300, the transistor 200, and the capacitor 100 as illustrated in FIG. 16. The transistor 200 is provided above the transistor 300, and the capacitor 100 is provided above the transistor 300 and the transistor 200.

The transistor 300 is provided over a substrate 311 and includes a conductor 316, an insulator 315, a semiconductor region 313 that is a part of the substrate 311, and low-resistance regions 314a and 314b functioning as a source region and a drain region.

Although the transistor 300 is an n-channel transistor in description in this embodiment, the transistor 300 may be either a p-channel transistor or an n-channel transistor.

It is preferable that a region of the semiconductor region 313 where a channel is formed, a region in the vicinity thereof, the low-resistance regions 314a and 314b functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stacked layer of metal materials such as tungsten and aluminum as the conductor. In particular, tungsten is preferable in terms of heat resistance.

Note that the transistor 300 illustrated in FIG. 16 is only an example and is not limited to the structure illustrated therein; an appropriate transistor may be used in accordance with a circuit configuration or a driving method.

An insulator 320, an insulator 322, an insulator 324, and an insulator 326 are stacked sequentially to cover the transistor 300.

The insulators 320, 322, 324, and 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a step caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents impurities and hydrogen from diffusing from the substrate 311, the transistor 300, or the like to a region where the transistor 200 is formed.

As an example of the film having a barrier property against hydrogen, silicon nitride formed by a CVD method can be given. The diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in the TDS analysis in the range of 50° C. to 500° C., for example.

Note that the relative permittivity of the insulator 326 is preferably lower than that of the insulator 324. For example, the relative permittivity of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low relative permittivity is used as an interlayer film, the parasitic capacitance between wirings can be reduced.

A conductor 328, a conductor 330, and the like that are electrically connected to the capacitor 100 or the transistor 200 are provided in the insulators 320, 322, 324, and 326. Note that the conductors 328 and 330 each function as an electrode or a wiring. A plurality of structures of conductors functioning as electrodes or wirings are collectively denoted by the same reference numeral in some cases. Furthermore, in this specification and the like, a wiring and an electrode electrically connected to the wiring may be a single component. That is, there are cases where part of a conductor functions as a wiring and part of a conductor functions as an electrode.

As a material of each of electrodes and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 16, an insulator 350, an insulator 352, and an insulator 354 are stacked sequentially. Furthermore, a conductor 356 is formed in the insulator 350, the insulator 352, and the insulator 354. The conductor 356 functions as an electrode or a wiring. Note that the conductor 356 can be formed using a material similar to that used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 300 and the transistor 200 can be separated by a barrier layer, so that the diffusion of hydrogen from the transistor 300 into the transistor 200 can be prevented.

Note that as the conductor having a barrier property against hydrogen, tantalum nitride may be used, for example. By stacking tantalum nitride and tungsten, which has high conductivity, the diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

A wiring layer may be provided over the insulator 350 and the conductor 356. For example, in FIG. 16, an insulator 360, an insulator 362, and an insulator 364 are stacked sequentially. Furthermore, a conductor 366 is formed in the insulators 360, 362, and 364. The conductor 366 functions as an electrode or a wiring. Note that the conductor 366 can be formed using a material similar to that used for forming the conductors 328 and 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening of the insulator 360 having a barrier property against hydrogen. In such a structure, the transistors 300 and 200 can be separated by a barrier layer, so that the diffusion of hydrogen from the transistor 300 to the transistor 200 can be prevented.

A wiring layer may be provided over the insulator 364 and the conductor 366. For example, in FIG. 16, an insulator 370, an insulator 372, and an insulator 374 are stacked sequentially. Furthermore, a conductor 376 is formed in the insulators 370, 372, and 374. The conductor 376 functions as an electrode or a wiring. Note that the conductor 376 can be formed using a material similar to that used for forming the conductors 328 and 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening of the insulator 370 having a barrier property against hydrogen. In such a structure, the transistors 300 and 200 can be separated by a barrier layer, so that the diffusion of hydrogen from the transistor 300 into the transistor 200 can be prevented.

A wiring layer may be provided over the insulator 374 and the conductor 376. For example, in FIG. 16, an insulator 380, an insulator 382, and an insulator 384 are stacked sequentially. Furthermore, a conductor 386 is formed in the insulators 380, 382, and 384. The conductor 386 functions as an electrode or a wiring. Note that the conductor 386 can be formed using a material similar to that used for forming the conductors 328 and 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening of the insulator 380 having a barrier property against hydrogen. In such a structure, the transistors 300 and 200 can be separated by a barrier layer, so that the diffusion of hydrogen from the transistor 300 to the transistor 200 can be prevented.

An insulator 210, an insulator 212, an insulator 214, and the insulator 301 are stacked sequentially over the insulator 384. A material having a barrier property against oxygen and hydrogen is preferably used for any of the insulators 210, 212, 214, and 301.

The insulators 210 and 214 are preferably formed using, for example, a film having a barrier property that prevents hydrogen and impurities from diffusing from the substrate 311, a region where the transistor 300 is formed, or the like to a region where the transistor 200 is formed. Therefore, the insulators 210 and 214 can be formed using a material similar to that used for forming the insulator 324.

As an example of the film having a barrier property against hydrogen, silicon nitride formed by a CVD method can be given. The diffusion of hydrogen into a semiconductor element including an oxide semiconductor, such as the transistor 200, degrades the characteristics of the semiconductor element in some cases. Therefore, a film that prevents hydrogen diffusion is preferably provided between the transistors 200 and 300. Specifically, the film that prevents hydrogen diffusion is a film from which hydrogen is less likely to be released.

As the film having a barrier property against hydrogen, for example, as each of the insulators 210 and 214, a metal oxide such as aluminum oxide, hafnium oxide, or tantalum oxide is preferably used.

In particular, aluminum oxide has an excellent blocking effect that inhibits the passage of oxygen and impurities such as hydrogen and moisture which cause a change in transistor characteristics. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

For example, the insulators 212 and 301 can be formed using a material similar to that used for forming the insulator 320. In the case where interlayer films are formed of a material with a relatively low relative permittivity, the parasitic capacitance between wirings can be reduced. For example, a silicon oxide film, a silicon oxynitride film, or the like can be used for the insulators 212 and 301.

A conductor 218, a conductor (the conductor 310) included in the transistor 200, and the like are provided in the insulators 210, 212, 214, and 301. Note that the conductor 218 functions as an electrode or a wiring that is electrically connected to the capacitor 100 or the transistor 300. The conductor 218 can be formed using a material similar to that used for forming the conductors 328 and 330.

In particular, part of the conductor 310 in contact with the insulators 210 and 214 is preferably a conductor with a barrier property against oxygen, hydrogen, and water. In such a structure, the transistors 300 and 200 can be completely separated by the layer with a barrier property against oxygen, hydrogen, and water. As a result, the diffusion of hydrogen from the transistor 300 to the transistor 200 can be prevented.

The transistor 200 is provided over the insulator 214. Note that, for example, the structure of the transistor included in the semiconductor device described in the above embodiment can be used as the structure of the transistor 200. Note that the transistor 200 in FIG. 16 is only an example and is not limited to the structure illustrated therein; an appropriate transistor may be used in accordance with a circuit configuration or a driving method.

The insulator 415 is provided over the transistor 200. In the insulator 415, an excess-oxygen region is preferably formed. In particular, in the case of using an oxide semiconductor in the transistor 200, when an insulator including an excess-oxygen region is provided in an interlayer film or the like in the vicinity of the transistor 200, oxygen vacancies in the oxide 406a, the oxide 406b and the oxide 406c included in the transistor 200 are reduced, whereby the reliability of the transistor 200 can be improved.

As the insulator including the excess-oxygen region, specifically, an oxide material that releases part of oxygen by heating is preferably used. An oxide that releases part of oxygen by heating is an oxide film in which the amount of released oxygen converted into oxygen molecules is greater than or equal to $1.0 \times 10^{14}$ molecules/cm$^2$, preferably greater than or equal to $1.0 \times 10^{15}$ molecules/cm$^2$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The oxide 420 is provided over the insulator 415. A material having a barrier property against oxygen or hydrogen is preferably used for the oxide 420. As the oxide 420, a metal oxide such as aluminum oxide, hafnium oxide, or tantalum oxide is preferably used, for example.

In particular, aluminum oxide has an excellent blocking effect that prevents the passage of oxygen and impurities such as hydrogen and moisture which cause a change in transistor characteristics. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

Here, for the oxide 420, a metal oxide that is formed by a sputtering method is preferably used, and for example, aluminum oxide is preferably used. Such an oxide 420 enables oxygen to be supplied to the insulator 415 through the contact area between the oxide 420 and the insulator 415, and thus, the insulator 415 can be brought into an oxygen excess state.

The oxide 422 is provided over the oxide 420. The oxide 422 can be formed using a metal oxide. For example, when aluminum oxide is formed by an ALD method for the oxide 422, the oxide 422 can have few pinholes and uniform thickness, whereby entry of impurities such as hydrogen from the outside can be prevented.

The insulator 410 is provided over the oxide 422. In the case where a material with a relatively low relative permittivity is used for an interlayer film, the parasitic capacitance between wirings can be reduced. For example, a silicon oxide film, a silicon oxynitride film, or the like can be used for the insulator 410.

The electrode 450 and the electrode 451 are embedded in the insulator 415, the oxides 420 and 422, and the insulator 410. Electrodes 452 are embedded in the insulators 302, 303, 402, and 415, the oxides 420 and 422, and the insulator 410.

The electrodes 450, 451 and 452 are function as electrodes or wirings that are electrically connected to the capacitor 100, the transistor 200, or the transistor 300. The electrodes 450, 451 and 452 can be formed using a material similar to that used for forming the conductors 328 and 330. Note that the contact areas between each of the electrodes 450, 451, and 452 and the insulator 415 are substantially the same.

The capacitor 100 is provided above the transistor 200. The capacitor 100 includes a conductor 110, a conductor 120, and an insulator 130.

A conductor 112 may be provided over the electrode 450. Note that the conductor 112 functions as an electrode or a wiring that is electrically connected to the transistor 200 or the transistor 300. The conductor 110 functions as the one electrode of the capacitor 100. The conductors 112 and 110 can be formed at the same time.

The conductors 112 and 110 can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductors 112 and 110 each have a single-layer structure in FIG. 16; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 100 having the structure, the dielectric strength can be increased and the electrostatic breakdown of the capacitor 100 can be prevented because of the insulator 130.

Over the insulator 130, the conductor 120 is provided to overlap with the conductor 110. The conductor 120 functions as the other electrode of the capacitor 100. Note that the conductor 120 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material may be used.

An insulator 150 is provided over the conductor 120 and the insulator 130. The insulator 150 can be formed using a material similar to that used for forming the insulator 320. The insulator 150 may function as a planarization film that covers a roughness thereunder.

A conductor 156 is embedded in the insulators 150 and 130. The conductor 156 functions as an electrode electrically connected to the electrode 450 through the conductor 112. The conductor 156 is also electrically connected to the conductor 120.

A conductor 166 is provided over the conductor 156. The conductor 166 functions as a wiring. In addition, an insulator 160 is provided over the conductor 166. The insulator 160 can be formed using a material similar to that used for forming the insulator 320. Alternatively, an organic resin film may be used.

The above is the description of the structure examples of the semiconductor device. With the use of the structure, a change in electrical characteristics can be prevented and reliability can be improved in a semiconductor device including a transistor including an oxide semiconductor. A transistor including an oxide semiconductor with a high on-state current can be provided. A transistor including an oxide semiconductor with a low off-state current can be provided. A semiconductor device with low power consumption can be provided.

Modification Example of Semiconductor Device

FIG. 17 illustrates a modification example of this embodiment. FIG. 17 is different from FIG. 16 in the structure of the transistor 300.

In the transistor 300 illustrated in FIG. 17, the semiconductor region 313 (part of the substrate 311) in which a channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with a top surface of the protruding portion.

Although the case where the protruding portion is formed by processing part of the semiconductor substrate is described here, a semiconductor film having a protruding shape may be formed by processing an SOI substrate.

The above is the description of the modification example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

Structural Example of Memory Cell Array

Figure 18:
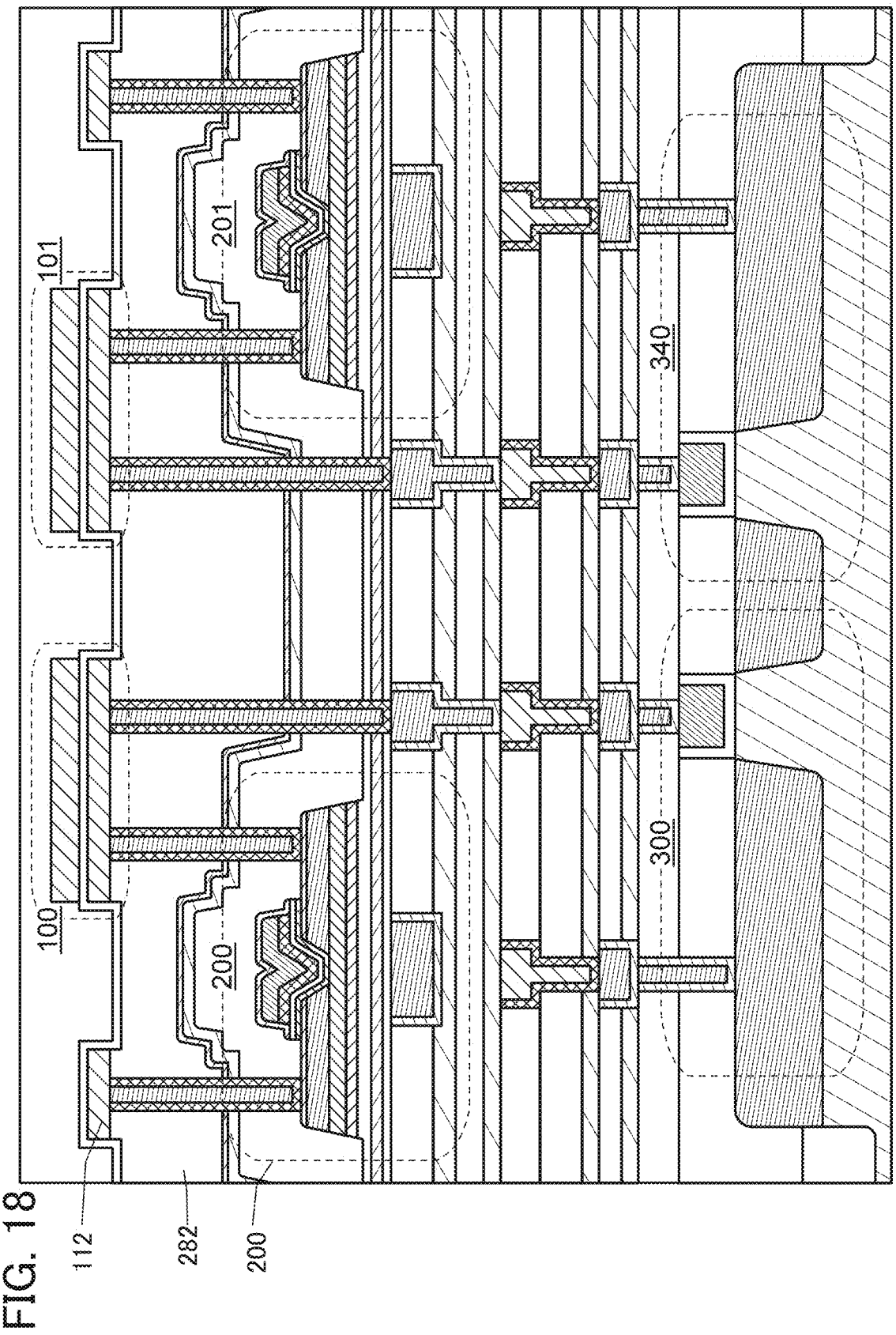
FIG. 18 is a cross-sectional view illustrating a memory cell array of one embodiment of the present invention.

FIG. 18 illustrates an example of a memory cell array of this embodiment. By arranging semiconductor devices illustrated in FIG. 16 and FIG. 17 in a matrix, a memory cell array can be formed. FIG. 18 is a cross-sectional view illustrating part of a row in which the memory devices illustrated in FIG. 17 are arranged in a matrix.

In FIG. 18, the semiconductor device which includes the transistor 300, the transistor 200, and the capacitor 100 and the semiconductor device which includes a transistor 340, a transistor 201, and a capacitor 101 are arranged in the same row.

As illustrated in FIG. 18, the memory cell array includes a plurality of transistors (the transistors 200 and 201 in the drawing).

Note that in the case where memory cells are arrayed, it is necessary that data of a desired memory cell be read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than $V_{th\_H}$ is supplied to the wiring 3005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than $V_{th\_L}$ is supplied to the wiring 3005 connected to the memory cells from which data is not read.

Structural Example of Memory Device

Figure 19:
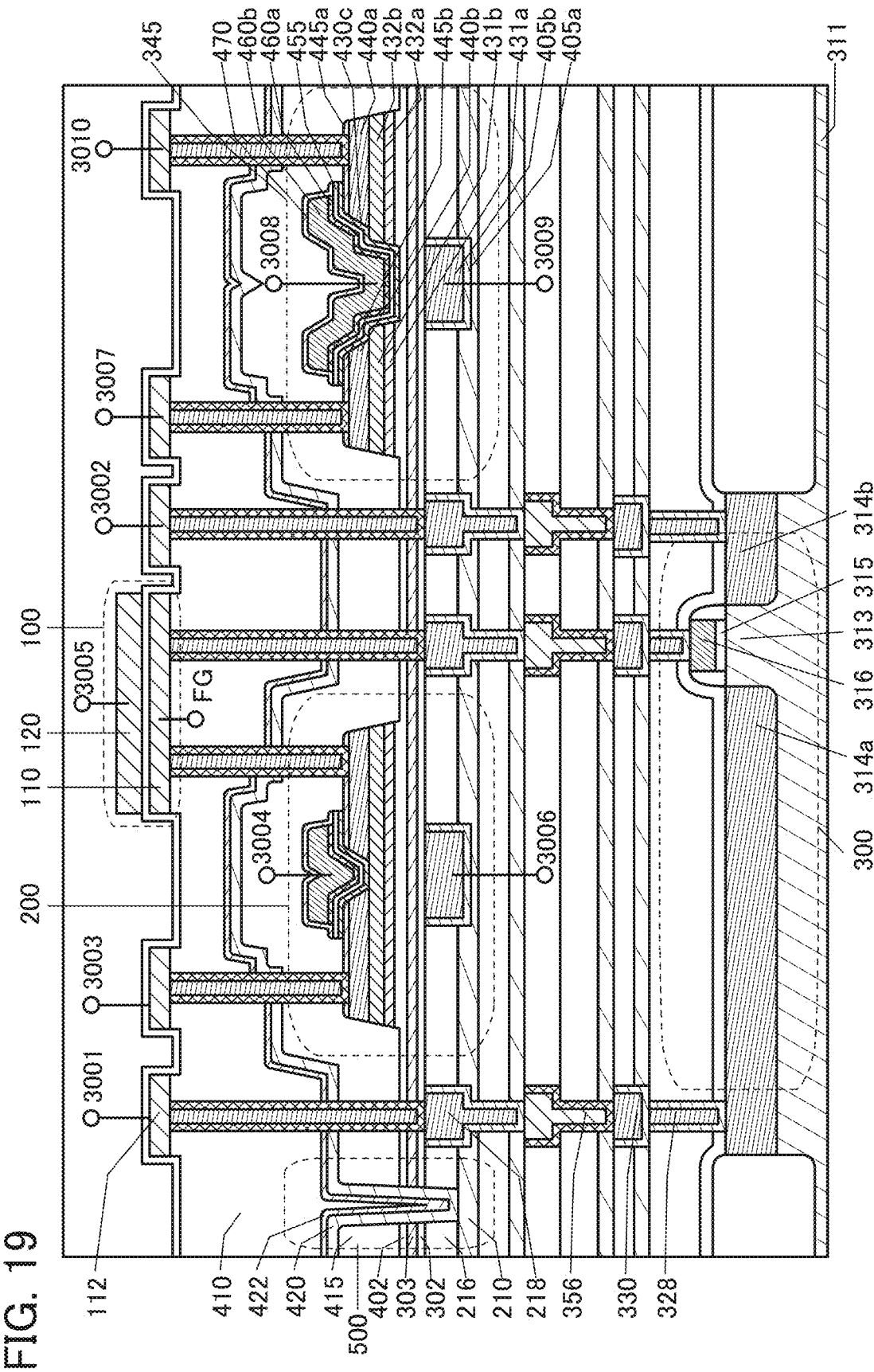
FIG. 19 is a cross-sectional view illustrating a memory device of one embodiment of the present invention.

FIG. 19 illustrates an example of a memory device using the semiconductor device of one embodiment of the present invention.

The memory device illustrated in FIG. 19 includes a transistor 345 in addition to the semiconductor device illustrated in FIG. 16 that includes the transistor 200, the transistor 300, and the capacitor 100.

The transistor 345 can control second gate voltage of the transistor 200. For example, a first gate and a second gate of the transistor 345 are diode-connected to a source thereof, and the source of the transistor 345 is connected to the second gate of the transistor 200. When a negative potential of the second gate of the transistor 200 is held in this structure, first gate-source voltage and second gate-source voltage of the transistor 345 are 0 V. In the transistor 345, a drain current when the second gate voltage and first gate voltage are 0 V is extremely low; thus, the negative potential of the second gate of the transistor 200 can be held for a long time even without power supply to the transistors 200 and 345. Accordingly, the memory device including the transistors 200 and 345 can retain stored data for a long time.

In FIG. 19, the wiring 3001 is electrically connected to a source of the transistor 300, and the wiring 3002 is electrically connected to a drain of the transistor 300. The wiring 3003 is electrically connected to one of a source and a drain of the transistor 200, the wiring 3004 is electrically connected to a gate of the transistor 200, and the wiring 3006 is electrically connected to the second gate of the transistor 200. The gate of the transistor 300 and the other of the source and the drain of the transistor 200 are electrically connected to one electrode of the capacitor 100. The wiring 3005 is electrically connected to the other electrode of the capacitor 100. A wiring 3007 is electrically connected to the source of the transistor 345, a wiring 3008 is electrically connected to the gate of the transistor 345, a wiring 3009 is electrically connected to the second gate of the transistor 345, a wiring 3010 is electrically connected to a drain of the transistor 345. The wiring 3006, the wiring 3007, the wiring 3008, and the wiring 3009 are electrically connected to each other.

The memory device illustrated in FIG. 19 has a feature that the potential of the gate of the transistor 300 can be held, and thus enables writing, retaining, and reading of data as described below.

The memory devices illustrated in FIG. 19 are arranged in a matrix like the memory devices illustrated in FIG. 16, whereby a memory cell array can be formed. Note that one transistor 345 can control second gate voltages of the transistors 200. For this reason, the number of transistors 345 can be smaller than the number of the transistors 200.

The transistor 345 and the transistor 200 are formed in the same tier and thus can be fabricated in parallel. The transistor 345 includes a conductor 460 (including a conductor 460a and a conductor 460b) functioning as a first gate electrode, a conductor 405 (including a conductor 405a and a conductor 405b) functioning as a second gate electrode, a barrier layer 470 in contact with the conductor 460, the insulators 302, 303, 402, and 455 functioning as gate insulating layers, an oxide 430c including a channel formation region, a conductor 440b and oxides 431a and 431b functioning as one of a source and a drain, and a conductor 440a and oxides 432a and 432b functioning as the other of the source and the drain, and a barrier layer 445 (including a barrier layer 445a and a barrier layer 445b).

In the transistor 345, the conductor 405 is in the same tier as the conductor 310. The oxides 431a and 432a are in the same tier as the oxide 406a, and the oxides 431b and 432b are in the same tier as the oxide 406b. The conductors 440a and 440b are in the same tier as the conductors 416a1 and 416a2. The oxide 430c is in the same tier as the oxide 406c. The insulator 455 is in the same tier as the insulator 412. The conductor 460 is in the same tier as the conductor 404. The barrier layer 470 is in the same tier as the oxide 418.

In the oxide 430c functioning as an active layer of the transistor 345, oxygen vacancies and impurities such as hydrogen or water are reduced, as in the oxides 406a, 406b and 406c or the like. Accordingly, the threshold voltage of the transistor 345 can be higher than 0 V, an off-state current can be reduced, and the drain current when the second gate voltage and the first gate voltage are 0 V can be extremely low.

A dicing line (also referred to as a scribe line, a dividing line, or a cutting line) that is provided when a large-sized substrate is divided into semiconductor elements so that a plurality of semiconductor devices are each formed in a chip form will be described. In an example of a dividing method, for example, a groove (a dicing line) for separating the semiconductor elements is formed on the substrate, and then the substrate is cut along the dicing line so that a plurality of semiconductor devices that are separated are obtained. For example, FIG. 19 is a cross-sectional view of a structure 500 around the dicing line.

As in the structure 500, for example, openings are provided in the insulators 415, 402, 303, 302, and 216 around a region overlapping with the dicing line formed in an end portion of the memory cell including the transistor 200 or the transistor 345. Furthermore, the oxide 420 is provided to cover the side surfaces of the insulators 415, 402, 303, 302, and 216.

Thus, in the openings, the insulator 210 and the oxide 420 are in contact with each other. At that time, the insulator 210 is formed using the same material and method as those for the oxide 420, whereby adhesion therebetween can be improved. Aluminum oxide can be used, for example.

With such a structure, the insulator 415 and the transistors 200 and 345 can be enclosed with the insulator 210 and the oxide 420. Since the insulator 210 and the oxide 420 have functions of preventing the diffusion of oxygen, hydrogen, and water even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 or the transistor 345 can be prevented.

Furthermore, in the structure, excess oxygen in the insulator 415 can be prevented from diffusing into the outside of the oxide 420. Accordingly, excess oxygen in the insulator 415 is efficiently supplied to the oxide where the channel is formed in the transistor 200 or the transistor 345. The oxygen can reduce oxygen vacancies in the oxide where the channel is formed in the transistor 200 or the transistor 345. Thus, the oxide where the channel is formed in the transistor 200 or the transistor 345 can be an oxide semiconductor with a low density of defect states and stable characteristics. That is, a change in electrical characteristics of the transistor 200 or the transistor 345 can be prevented and the reliability can be improved. A transistor including an oxide semiconductor with high on-state current can be provided. A transistor including an oxide semiconductor with low off-state current can be provided. A semiconductor device with low power consumption can be provided.

This embodiment can be implemented in an appropriate combination with any of the structures described in the other embodiments, Example, and the like.

Embodiment 4

In this embodiment, one embodiment of a semiconductor device will be described with reference to FIGS. 20A and 20B and FIGS. 21A and 21B.

Semiconductor Wafer and Chip

Figure 20A:
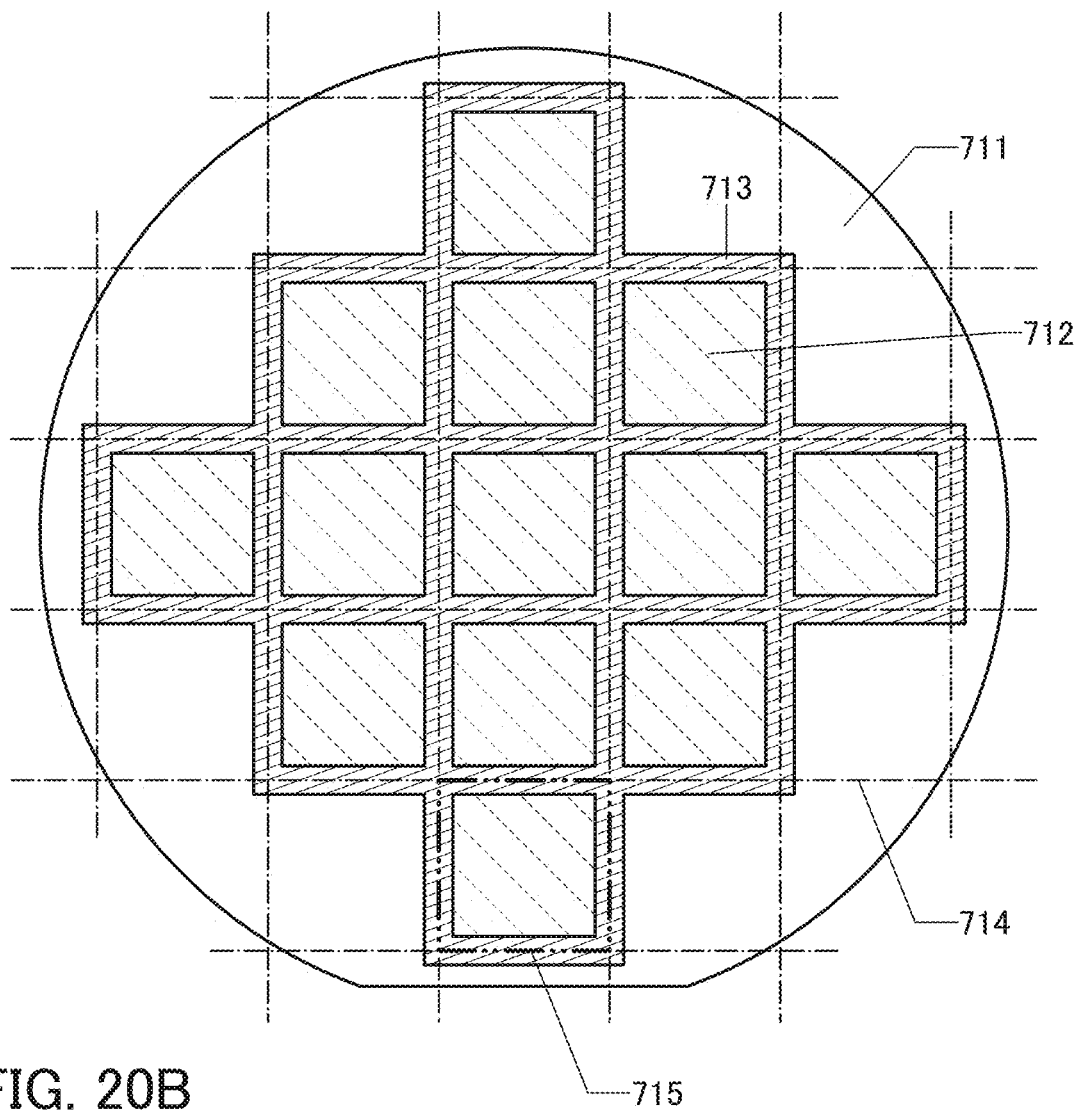
FIGS. 20A and 20B are top views of a semiconductor wafer of one embodiment of the present invention.

FIG. 20A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device or the like of one embodiment of the present invention can be provided in the circuit region 712.

Figure 20B:
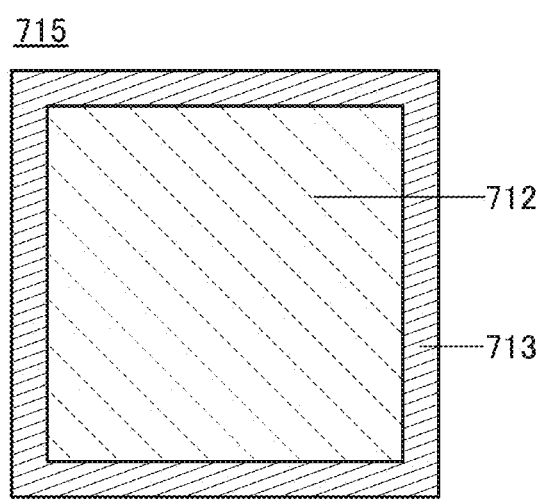

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 20B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer, a semiconductor layer, or the like in the separation regions 713 allows a reduction in the usage of the pure water. Therefore, the cost of manufacturing semiconductor devices can be reduced. Thus, semiconductor devices can be manufactured with improved productivity.

Electronic Component

Figure 21A:
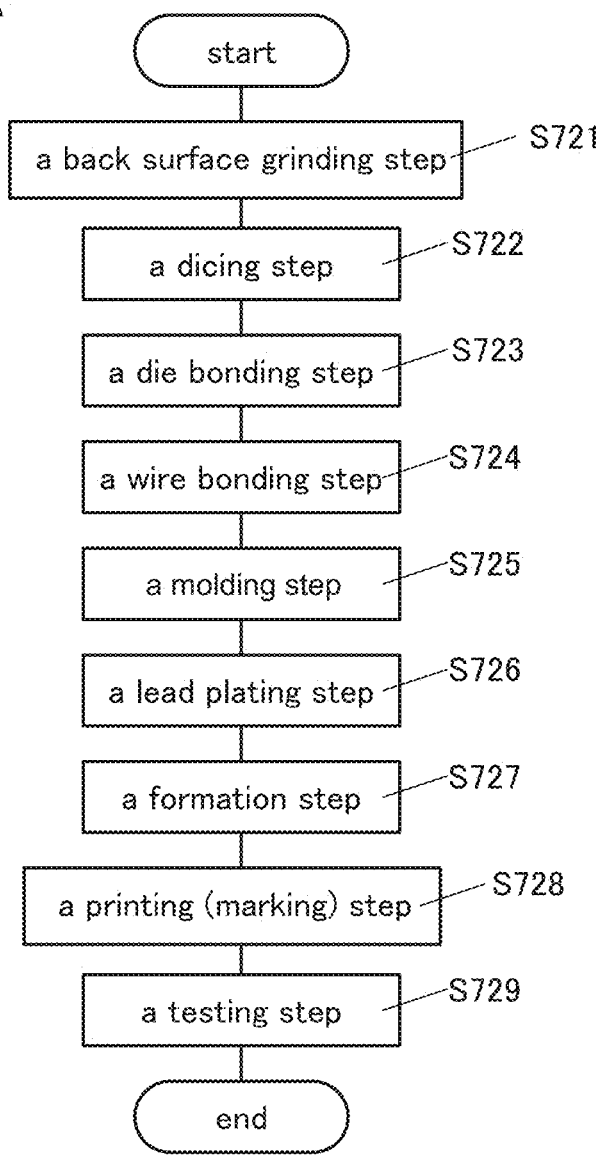
FIG. 21A is a flowchart showing a manufacturing process example of an electronic component.

An example of an electronic component using the chip 715 will be described with reference to FIGS. 21A and 21B. Note that the electronic component is also referred to as a semiconductor package or an IC package. The electronic component has a plurality of standards, names, and the like depending on a terminal extraction direction, a terminal shape, and the like.

The electronic component is completed when the semiconductor device described in the above embodiment is combined with components other than the semiconductor device in an assembly process (post-process).

The post-process will be described with reference to a flow chart in FIG. 21A. After the semiconductor device of one embodiment of the present invention and the like are provided over the substrate 711 in a pre-process, a back surface grinding step in which a back surface (a surface where the semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire or a gold wire can be used. Ball bonding or wedge bonding can be used as the wire bonding.

The wire-bonded chip 715 is subjected to a molding step of sealing the chip with an epoxy resin or the like (Step S725). Through the molding step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed wiring board in a later step. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 21B:
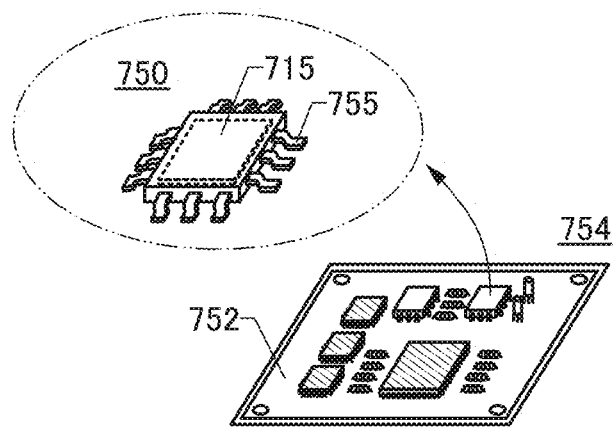
FIG. 21B is a schematic perspective view of the electronic component.

FIG. 21B is a perspective schematic diagram of a completed electronic component. FIG. 21B is a perspective schematic diagram illustrating a quad flat package (QFP) as an example of the electronic component. An electronic component 750 in FIG. 21B includes a lead 755 and the chip 715. The electronic component 750 may include more than one chip 715.

The electronic component 750 in FIG. 21B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

This embodiment can be implemented in an appropriate combination with any of the structures described in the other embodiments, Example, and the like.

Embodiment 5

A semiconductor device of one embodiment of the present invention can be used for a variety of electronic devices.

Electronic Device

FIGS. 22A to 22F illustrate specific examples of the electronic devices including the semiconductor device of one embodiment of the present invention.

Figure 22A:
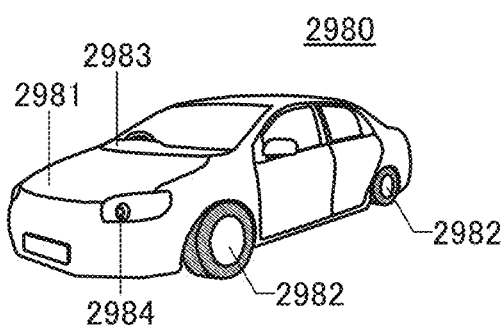
FIGS. 22A to 22F each illustrate an electronic device of one embodiment of the present invention.

FIG. 22A is an external view illustrating an example of a car. A car 2980 includes a car body 2981, wheels 2982, a dashboard 2983, lights 2984, and the like. The car 2980 includes an antenna, a battery, and the like.

Figure 22B:
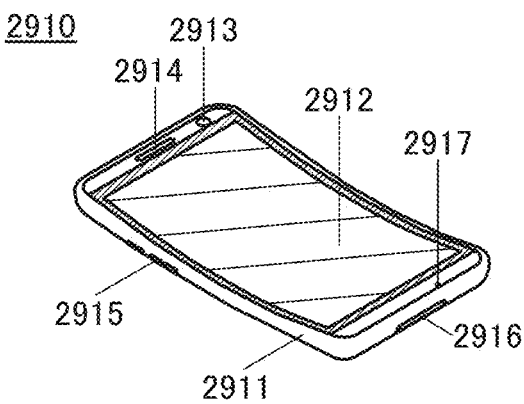

An information terminal 2910 illustrated in FIG. 22B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In the housing 2911 of the information terminal 2910, an antenna, a battery, and the like are provided. The information terminal 2910 can be used as, for example, a smartphone, a mobile phone, a tablet information terminal, a tablet personal computer, or an e-book reader.

Figure 22C:
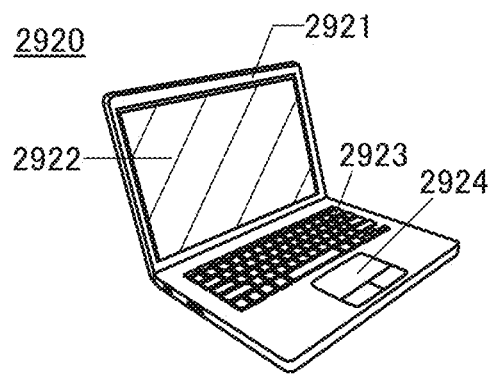

A notebook personal computer 2920 illustrated in FIG. 22C includes a housing 2921, a display portion 2922, a keyboard 2923, a pointing device 2924, and the like. In the housing 2921 of the notebook personal computer 2920, an antenna, a battery, and the like are provided.

Figure 22D:
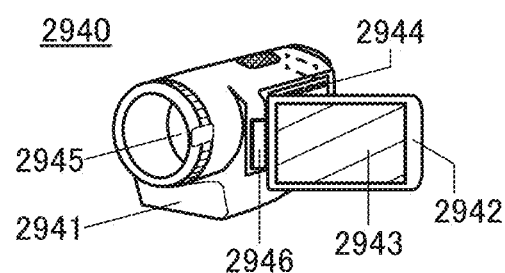

A video camera 2940 illustrated in FIG. 22D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In the housing 2941 of the video camera 2940, an antenna, a battery, and the like are provided. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942.

Figure 22E:
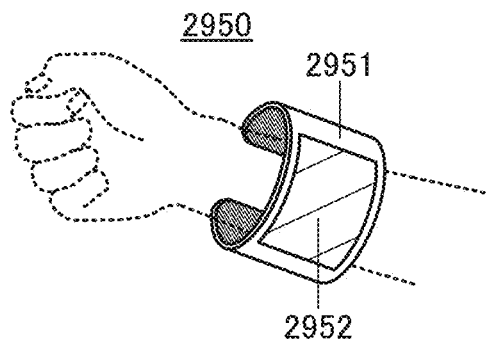

FIG. 22E illustrates an example of a bangle-type information terminal. An information terminal 2950 includes a housing 2951, a display portion 2952, and the like. In the housing 2951 of the information terminal 2950, an antenna, a battery, and the like are provided. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 22F:
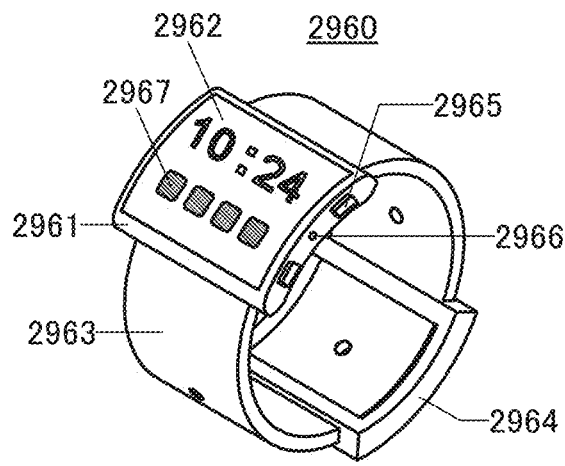

FIG. 22F illustrates an example of a watch-type information terminal. An information terminal 2960 includes a housing 2961, a display portion 2962, a band 2963, a buckle 2964, an operation switch 2965, an input/output terminal 2966, and the like. In the housing 2961 of the information terminal 2960, an antenna, a battery, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, an application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. In addition, charging via the input/output terminal 2966 is possible. Note that the charging operation may be performed by wireless power feeding without using the input/output terminal 2966.

For example, a memory device including the semiconductor device of one embodiment of the present invention can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments, Example, and the like.

Example 1

In this example, the semiconductor device illustrated in FIGS. 1A to 1C was manufactured. As the samples of the semiconductor device, four samples were prepared. After the transistor characteristics of each sample were measured, additional heat treatment was performed and the influence of heat treatment time on the transistor characteristics was evaluated.

In the semiconductor device, a 400-nm-thick silicon oxide film was formed over a single crystal silicon wafer by a thermal oxidation method. Next, a 40-nm-thick first aluminum oxide film was formed by a sputtering method.

Next, a 150-nm-thick first silicon oxynitride film was formed over the first aluminum oxide film by a CVD method, and a 35-nm-thick first tungsten film was formed over the first silicon oxynitride film by a sputtering method. Then, the first tungsten film was processed by a lithography method, and a hard mask including the first tungsten film was formed.

Subsequently, the first silicon oxynitride film was processed using the hard mask, so that a groove reaching the first aluminum oxide film was formed. In the groove, a first tantalum nitride film was formed by a sputtering method and a first titanium nitride film and a second tungsten film were formed over the first tantalum nitride film by an ALD method and a CVD method. Then, the second tungsten film, the first titanium nitride film, the first tantalum nitride film, and the first tungsten film were polished by first CMP treatment until the top surface of the first silicon oxynitride film was exposed, and the second tungsten film, the first titanium nitride film, and the first tantalum nitride film were embedded in the groove; accordingly, a wiring layer and a second gate electrode were formed.

Next, a 10-nm-thick second silicon oxynitride film was formed by a CVD method. A 20-nm-thick hafnium oxide film was formed by an ALD method. Then, a 30-nm-thick third silicon oxynitride film was formed by a CVD method. The second silicon oxynitride film, the hafnium oxide film, and the third silicon oxynitride film serve as a second gate insulating film. Next, first heat treatment was performed. The first heat treatment was performed in an atmosphere containing nitrogen at 400° C. for one hour, and subsequently another treatment was performed in an atmosphere containing oxygen at 400° C. for one hour.

Next, as a first oxide (S1), a 5-nm-thick In—Ga—Zn oxide was formed by a sputtering method. The S1 was formed under the following conditions: a target having an atomic ratio of In:Ga:Zn=1:3:4 was used, the oxygen gas flow rate was 45 sccm, the pressure was 0.7 Pa, and the substrate temperature was 200° C.

Then, as a second oxide (S2), a 15-nm-thick In—Ga—Zn oxide was formed over the S1 by a sputtering method. The S2 was formed under the following conditions: a target having an atomic ratio of In:Ga:Zn=4:2:4.1 was used, the argon gas flow rate was 40 sccm, the oxygen gas flow rate was 5 sccm, the pressure was 0.7 Pa, and the substrate temperature was 130° C.

Then, second heat treatment was performed. The second heat treatment was performed in an atmosphere containing nitrogen at 400° C. for one hour, and subsequently another treatment was performed in an atmosphere containing oxygen at 400° C. for one hour.

Next, a 20-nm-thick second tantalum nitride film was formed over the S2 by a sputtering method. Then, a 5-nm-thick second aluminum oxide film was formed over the second tantalum nitride film by an ALD method. Next, a 15-nm-thick third tantalum nitride film was formed over the second aluminum oxide film by a sputtering method.

Then, the third tantalum nitride film in a region where a channel was formed was etched by a lithography method. A dry etching method was used for the etching. Next, the resist mask was removed using oxygen plasma.

Next, a resist mask was formed, and the third tantalum nitride film, the second aluminum oxide film, and the second tantalum nitride film were etched by a lithography method.

Then the resist mask was removed using oxygen plasma, and the second aluminum oxide film in a region where a channel was formed was etched. Next, unnecessary portions of the S2 and the S1 were sequentially etched. A dry etching method was used for the etching.

Then, the second tantalum nitride film in a region where a channel was formed was etched. The third tantalum film over the second aluminum oxide film was also etched by the etching. A dry etching method was used for the etching.

Next, as a third oxide (S3), a 5-nm-thick In—Ga—Zn oxide was formed by a sputtering method. The S3 was formed under the following conditions: a target having an atomic ratio of In:Ga:Zn=4:2:4.1 was used, the oxygen gas flow rate was 45 sccm, the pressure was 0.7 Pa, and the substrate temperature was 130° C.

Then, a 10-nm-thick fourth silicon oxynitride film functioning as a first gate oxide film was formed by a CVD method.

Then, a 10-nm-thick second titanium nitride film was formed by a sputtering method, and a 30-nm-thick third tungsten film was formed over the second titanium nitride film by a sputtering method. The second titanium nitride film and the third tungsten film were successively formed.

Next, the third tungsten film and the second titanium nitride film were etched in this order by a lithography method, so that a gate electrode was formed. A dry etching method was used for the etching.

Next, a 7-nm-thick third aluminum oxide film was formed by an ALD method. The substrate temperature was 250° C.

Next, a resist mask was formed and part of the third aluminum oxide film and part of the fourth silicon oxynitride film were etched by a lithography method. A wet etching method was used for the etching of the third aluminum oxide film, and a dry etching method was used for the etching of the fourth silicon oxynitride film. Then, the S3 was etched after the resist mask was removed. A diluted phosphoric acid solution was used for the etching of the S3.

Next, a fifth silicon oxynitride film was formed by a CVD method. The thicknesses of Samples A, B, C, and D were set to 10 nm, 30 nm, 60 nm, and 100 nm, respectively. The fifth silicon oxynitride film corresponds to the insulator 415 in FIG. 1B.

Then, a 35-nm-thick fourth aluminum oxide film was formed by a sputtering method under the following conditions: the argon gas flow rate was 25 sccm, the oxygen gas flow rate was 25 sccm, the pressure was 0.4 Pa, and the substrate temperature was 250° C.

Next, a 5-nm-thick fifth aluminum oxide film was formed over the fourth aluminum oxide film by an ALD method. The substrate temperature was 250° C.

Then, third heat treatment was performed. The third heat treatment was performed in an atmosphere containing oxygen at 350° C. for one hour.

Next, a 350-nm-thick sixth silicon oxynitride film was formed by a CVD method. Then, second CMP treatment was performed to polish the sixth silicon oxynitride film so that the surface of the sixth silicon oxynitride film was planarized.

Next, a 90-nm-thick fourth tungsten film was formed by a sputtering method. Next, a 130-nm-thick silicon nitride film was formed by a CVD method.

Next, the silicon nitride film and the fourth tungsten film were processed by a lithography method, and a hard mask including the silicon nitride film and the fourth tungsten film was formed. Then, a contact hole reaching the second tungsten film (second gate electrode), a contact hole reaching the third tungsten film (first gate electrode), and contact holes reaching the second tantalum nitride film (source electrode and drain electrode) were formed using the hard mask as an etching mask. After that, a 20-nm-thick third titanium nitride film was formed by an ALD method at a substrate temperature of 375° C., and a 150-nm-thick fifth tungsten film was formed by a CVD method at a substrate temperature of 350° C.

Then, the fifth tungsten film, the third titanium nitride film, the silicon nitride film, and the fourth tungsten film were polished to reach the sixth silicon oxynitride film by third CMP treatment, so that the fifth tungsten film and the third titanium nitride film were embedded in each contact hole to form electrodes.

Next, a 50-nm-thick sixth tungsten film was formed by a sputtering method. Then, part of the sixth tungsten film was etched by a lithography method to form a wiring layer.

Then, fourth heat treatment was performed. The fourth heat treatment was performed at 250° C. for one hour.

Next, a 1.0-μm-thick photoresist film was formed by a coating method. Then, a portion of the photoresist film that is to be a measurement terminal (measurement pad) was removed by a lithography method.

Through the above process, the semiconductor device illustrated in FIGS. 1A to 1C was manufactured.

Next, the transistor characteristics of each sample were measured. In the measured transistors, the designed value of the channel length L was 60 nm, the designed value of the channel width W was 60 nm, the transistor density was 2.9/μm$^2$, and the length of one side of the bottom or top surface of the electrode was 100 nm.

The transistor characteristics of each sample were measured by measuring change in source-drain current (hereinafter referred to as a drain current $I_d$) when a source-gate voltage (hereinafter referred to as a gate voltage $V_g$) changed from −4.0 V to +4.0 V at a source-drain voltage (hereinafter referred to as a drain voltage $V_d$) of 0.1 V or 1.2 V. That is, $I_d$-$V_g$ characteristics were measured. Hereinafter, the gate voltage $V_g$ refers to the voltage of a first gate electrode (top gate electrode). In this measurement, the voltage of a second gate electrode (back gate electrode) was set to 0 V.

In addition, from the measurement data of the $I_g$-$V_g$ characteristics at $V_d$=0.1 V, the field-effect mobility μFE (cm$^2$/Vs) was calculated using the gradual channel approximation formula in a linear region.

Figure 25:
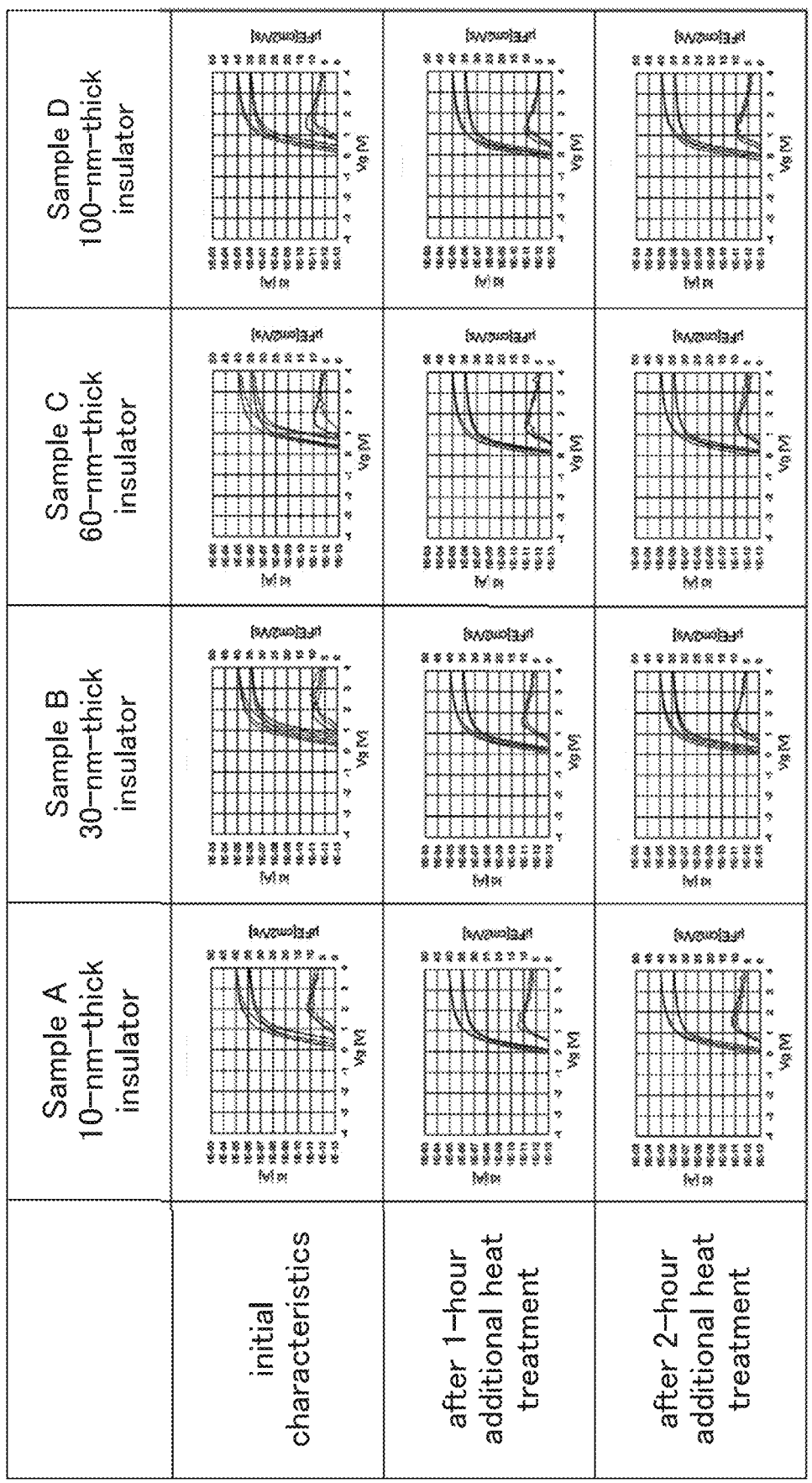
FIG. 25 is a graph showing transistor characteristics in Example.
Figure 26:
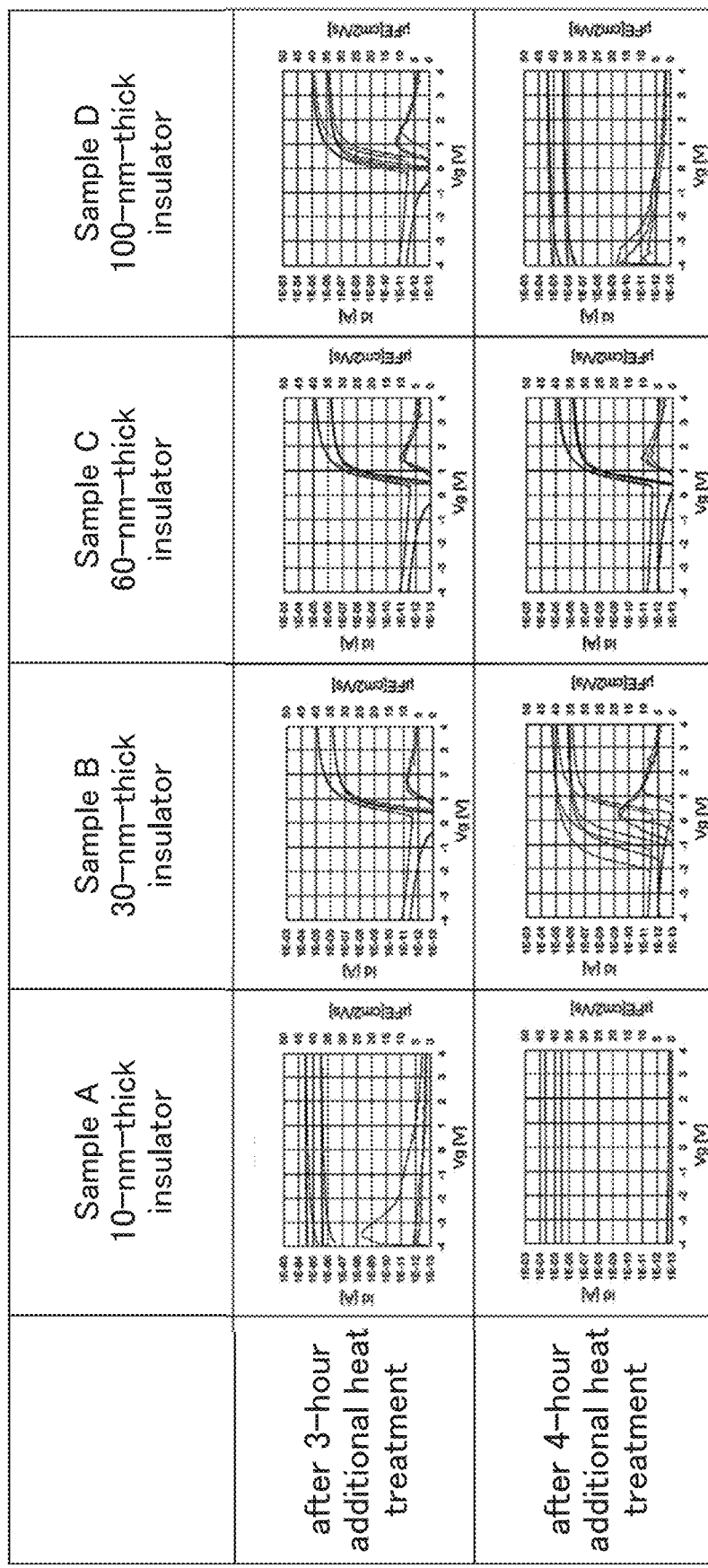
FIG. 26 is a graph showing transistor characteristics in Example.

FIG. 25 and FIG. 26 are graphs showing the $I_d$-$V_g$ characteristics at $V_d$=0.1 V and 1.2 V, and the μFE characteristics at $V_d$=0.1 V, for Samples A to D. The graph in FIG. 25 shows the characteristics at the initial stage, after 1-hour additional heat treatment, and after 2-hour additional heat treatment, for Samples A to D. The graph in FIG. 26 shows the characteristics after 3-hour additional heat treatment and after 4-hour additional heat treatment, each for Samples A to D. The additional heat treatment was performed at 350° C. in a nitrogen atmosphere. In each graph, the vertical axis on the left side represents $I_d$ and the vertical axis on the right side represents μFE. The horizontal axis represents $V_g$.

As shown in FIG. 25 and FIG. 26, it was confirmed that, a structure of one embodiment of the present invention could maintain favorable transistor characteristics with high on-off ratio even after a long-time additional heat treatment. Specifically, in Sample C having the 60-nm-thick fifth silicon oxynitride film corresponding to the insulator 415 in FIG. 1B, the shift of the transistor characteristics in the negative direction due to the additional heat treatment time was most suppressed, and normally-off characteristics could be maintained even after 4-hour additional heat treatment. Meanwhile, compared with Sample C having the 60-nm-thick fifth silicon oxynitride film, the resistance to the additional heat treatment was poor in Samples D, B, and A, whose thicknesses of the fifth silicon oxynitride film were 100 nm, 30 nm, and 10 nm, respectively, which is thicker or thinner than 60 nm. One of possible reasons is that the amount of oxygen added to the fifth silicon oxynitride film from the fourth aluminum oxide film corresponding to the oxide 420 in FIGS. 1B and 1C varies depending on the thickness of the fifth silicon oxynitride film (see FIG. 5A).

From the above, it can be considered that the resistance to the additional heat treatment is poorer in the case of the 100-nm-thick fifth silicon oxynitride film than in the case of the 60-nm-thick fifth oxynitride film by the following reason. Although the amount of excess oxygen included in each fifth silicon oxynitride film is substantially the same, in the case of the 100-nm-thick fifth oxynitride film, the contact area between the fifth silicon oxynitride film and the electrode increases; thus, the influence of oxygen absorption by the electrode increases.

On the other hand, it can be considered that the resistance to the additional heat treatment is poor in the case of thinner thickness of the fifth silicon oxynitride film than 60 nm by the following reason. Under such a condition, the amount of oxygen added to the fifth silicon oxynitride film caused by forming the fourth aluminum oxide film decreases; thus, the transistor characteristics shifts in the negative direction.

From the above, it was confirmed that in the structure of semiconductor device of one embodiment of the present invention, variations in the transistor characteristics due to heat treatment could be reduced by decreasing the contact area between the electrode and the fifth silicon oxynitride film including excess oxygen.

Example 2

In this example, samples corresponding to the semiconductor device illustrated in FIGS. 1A to 1C were fabricated. Sample E and Sample F were prepared as the samples. First, the dependence of the transistor characteristics on the transistor density was evaluated using Sample E. The transistor density was set to 1.0/μm$^2$, 2.0/μm$^2$, and 2.9/μm$^2$. In addition, the difference in the dependence of $V_{sh}$ on $V_{bg}$ between varied thicknesses of the second gate insulating film was evaluated using Samples E and F.

First, methods for fabricating Samples E and F used in this example are described. Note that unless otherwise specified, Samples A and B were fabricated through the same steps. First, a 400-nm-thick silicon oxide film was formed over a single crystal silicon wafer by a thermal oxidation method. Then, a 40-nm-thick first aluminum oxide film was formed by a sputtering method.

Next, a 200-nm-thick first silicon oxynitride film was formed over the first aluminum oxide film by a CVD method, and a 35-nm-thick first tungsten film was formed over the first silicon oxynitride film by a sputtering method. Then, the first tungsten film was processed by a lithography method, and a hard mask including the first tungsten film was formed.

Next, the first silicon oxynitride film was processed, so that a groove reaching the first aluminum oxide film was formed. In the groove, a first tantalum nitride film was formed by a sputtering method and a first titanium nitride film and a second tungsten film were formed over the first tantalum nitride film by an ALD method and a CVD method.

Then, the second tungsten film, the first titanium nitride film, the first tantalum nitride film, and the first tungsten film were polished by first CMP treatment until the top surface of the first silicon oxynitride film was exposed, and the second tungsten film, the first titanium nitride film, and the first tantalum nitride film were embedded in the groove; accordingly, a wiring layer and a second gate electrode were formed.

Next, Samples E and F were fabricated through different steps. For Sample E, a 5-nm-thick second silicon oxynitride film was formed by a CVD method, a 10-nm-thick hafnium oxide film was formed by an ALD method, and then heat treatment was performed. The heat treatment was performed in an atmosphere containing nitrogen at 400° C. for one hour, and subsequently another treatment was performed in an atmosphere containing oxygen at 400° C. for one hour. Then, a 15-nm-thick third silicon oxynitride film was formed by a CVD method.

For Sample F, a 5-nm-thick second silicon oxynitride film was formed by a CVD method, a 10-nm-thick hafnium oxide film was formed by an ALD method, and then heat treatment was performed. The heat treatment was performed in an atmosphere containing nitrogen at 400° C. for one hour, and subsequently another treatment was performed in an atmosphere containing oxygen at 400° C. for one hour. Then, a 5-nm-thick third silicon oxynitride film was formed by a CVD method. The second silicon oxynitride film, the hafnium oxide film, and the third silicon oxynitride film serve as a second gate insulating film. Next, heat treatment was performed. The heat treatment was performed in an atmosphere containing nitrogen at 400° C. for one hour, and subsequently another treatment was performed in an atmosphere containing oxygen at 400° C. for one hour.

The above-described steps are different between Samples E and F. The following steps are the same in fabrication of Samples E and F. Next, as a first oxide (S1), a 5-nm-thick In—Ga—Zn oxide was formed by a sputtering method. The S1 was formed under the following conditions: a target having an atomic ratio of In:Ga:Zn=1:3:4 was used, the oxygen gas flow rate was 45 sccm, the pressure was 0.7 Pa, and the substrate temperature was 200° C.

Next, as a second oxide (S2), a 15-nm-thick In—Ga—Zn oxide was formed over the S1 by a sputtering method. The S2 was formed under the following conditions: a target having an atomic ratio of In:Ga:Zn=4:2:4.1 was used, the argon gas flow rate was 40 sccm, the oxygen gas flow rate was 5 sccm, the pressure was 0.7 Pa, and the substrate temperature was 130° C.

Then, heat treatment was performed. The heat treatment was performed in an atmosphere containing nitrogen at 400° C. for one hour, and subsequently another treatment was performed in an atmosphere containing oxygen at 400° C. for one hour.

Next, a 20-nm-thick second tantalum nitride film was formed over the S2 by a sputtering method. Then, a 5-nm-thick second aluminum oxide film was formed over the second tantalum nitride film by an ALD method. Next, a 15-nm-thick third tantalum nitride film was formed over the second aluminum oxide film by a sputtering method.

Next, a resist mask was formed, and the third tantalum nitride film in a region where a channel was formed was etched by a lithography method with the use of the resist mask as an etching mask. A dry etching method was used for the etching. Then, the resist mask was removed using oxygen plasma.

Next, a resist mask was formed, and the third tantalum nitride film, the second aluminum oxide film, and the second tantalum nitride film were etched by a lithography method with the use of the resist mask as an etching mask. Then, the resist mask was removed using oxygen plasma and the second aluminum oxide film in a region where a channel was formed was etched. Next, unnecessary portions of the S2 and the S1 were sequentially etched. A dry etching method was used for the etching.

Then, the second tantalum nitride film in a region where a channel was formed was etched. The third tantalum nitride film over the second aluminum oxide film was also etched by the etching. A dry etching method was used for the etching.

Next, as a third oxide (S3), a 5-nm-thick In—Ga—Zn oxide was formed by a sputtering method. The S3 was formed under the following conditions: a target having an atomic ratio of In:Ga:Zn=4:2:4.1 was used, the oxygen gas flow rate was 45 sccm, the pressure was 0.7 Pa, and the substrate temperature was 130° C.

Then, a 10-nm-thick fourth silicon oxynitride film functioning as a first gate oxide film was formed by a CVD method.

Then, a 10-nm-thick second titanium nitride film was formed by a sputtering method, and a 30-nm-thick third tungsten film was formed over the second titanium nitride film by a sputtering method.

Next, the third tungsten film and the second titanium nitride film were etched in this order by a lithography method, so that a first gate electrode was formed. A dry etching method was used for the etching.

Next, a 7-nm-thick third aluminum oxide film was formed by an ALD method. The substrate temperature was 250° C.

Next, a resist mask was formed, and part of the third aluminum oxide film and part of the fourth silicon oxynitride film were etched by a lithography method. A wet etching method was used for the etching of the third aluminum oxide film, and a dry etching method was used for the etching of the fourth silicon oxynitride film. Then, the S3 was etched after the resist mask was removed. A wet etching method was used for the etching of the S3.

Next, a 60-nm-thick fifth silicon oxynitride film was formed by a CVD method. The fifth silicon oxynitride film corresponds to the insulator 415 in FIG. 1B.

Then, a 35-nm-thick fourth aluminum oxide film was formed by a sputtering method under the following conditions: the argon gas flow rate was 25 sccm, the oxygen gas flow rate was 25 sccm, the pressure was 0.4 Pa, and the substrate temperature was 250° C.

Next, a 5-nm-thick fifth aluminum oxide film was formed over the fourth aluminum oxide film by an ALD method. The substrate temperature was 250° C.

Next, heat treatment was performed. The heat treatment was performed in an atmosphere containing oxygen at 350° C. for one hour.

Next, a 350-nm-thick sixth silicon oxynitride film was formed by a CVD method. Then, second CMP treatment was performed to polish the sixth silicon oxynitride film so that the surface of the sixth silicon oxynitride film was planarized.

Next, a 90-nm-thick fourth tungsten film was formed by a sputtering method. Next, a 130-nm-thick silicon nitride film was formed by a CVD method.

Then, the silicon nitride film and the fourth tungsten film were processed by a lithography method, and a hard mask including the silicon nitride film and the fourth tungsten film was formed. Then, a contact hole reaching the second tungsten film (second gate electrode), a contact hole reaching the third tungsten film (first gate electrode), and a contact hole reaching the second tantalum nitride film (source electrode and drain electrode) were formed using the hard mask as an etching mask.

Next, a 13-nm-thick sixth aluminum oxide film was formed by an ALD method. Then, by anisotropic etching using a dry etching method, the top surface of the planarized sixth silicon oxynitride film and the sixth aluminum oxide film at the bottom surface of the contact hole were etched. Note that the sixth aluminum oxide film at the side surface of the contact hole remained. In this manner, the sixth aluminum oxide film was formed to be in contact with the side surface of the contact hole.

Next, a 10-nm-thick third titanium nitride film was formed by an ALD method at a substrate temperature of 375° C., and a 150-nm-thick fifth tungsten film was formed by a CVD method at a substrate temperature of 350° C.

Then, the fifth tungsten film, the third titanium nitride film, the silicon nitride film, and the fourth tungsten film were polished to reach the sixth silicon oxynitride film by third CMP treatment, so that the fifth tungsten film and the third titanium nitride film were embedded in each contact hole to form electrodes.

Next, a 50-nm-thick sixth tungsten film was formed by a sputtering method. Next, part of the sixth tungsten film was etched by a lithography method to form a wiring layer.

Next, heat treatment was performed. The heat treatment was performed at 250° C. for one hour.

Next, a 1.0-μm-thick photoresist film was formed by a coating method. Then, a portion of the photoresist film that is to be a measurement terminal (measurement pad) was removed by a lithography method.

Through the above process, samples corresponding to the semiconductor device illustrated in FIGS. 1A to 1C (Samples E and F) were fabricated.

Next, the dependence of the transistor characteristics on the transistor density was evaluated using Sample E. The transistor density was set to $1.0/\mu m^2$, $2.0/\mu m^2$, and $2.9/\mu m^2$. In the measured transistors, the designed value of the channel length L was 60 nm, and the designed value of the channel width W was 60 nm. The number of measurement points was 9.

The transistor characteristics were measured by measuring a change in $I_d$ when $V_g$ changed from −4.0 V to +4.0 V at $V_d$=0.1 V or 1.2 V. That is, $I_d$-$V_g$ characteristics were measured. In this measurement, the voltage of a second gate electrode (back gate electrode) ($V_{bg}$) was set to 0 V.

In addition, from the measurement data of the $I_d$-$V_g$ characteristics at $V_d$=0.1 V, the field-effect mobility μFE (cm$^2$/Vs) was calculated using the gradual channel approximation formula in a linear region.

In addition, $I_{on}$ was calculated from the measurement data of the $I_d$-$V_g$ characteristics. $I_{on}$ was defined as the value of $I_d$ at $V_d$=1.2 and $V_g$=3.3 V. Furthermore, $V_{sh}$ at $V_d$=1.2 V and the subthreshold swing value (S value) at $V_d$=1.2 V were also calculated. S value was defined as the value of $V_g$ needed for changing $I_d$ by one digit in the subthreshold region.

Figure 27:
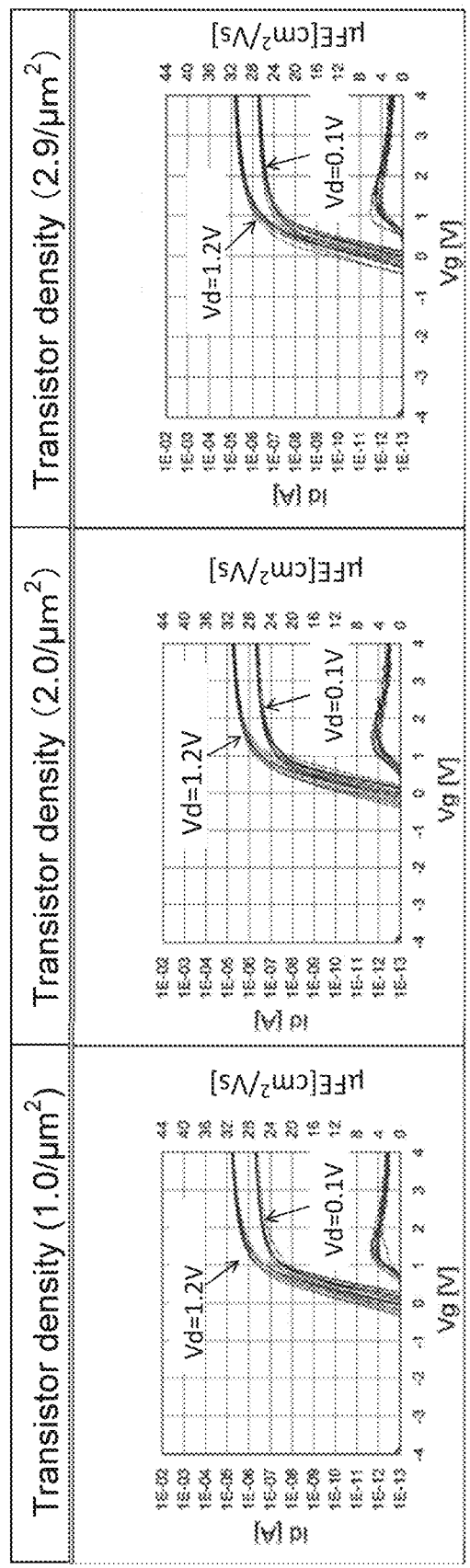
FIG. 27 is a graph showing transistor characteristics in Example.

Graphs in FIG. 27 show the $I_d$-$V_g$ characteristics at $V_d$=0.1 V and 1.2 V, and the μFE characteristics at $V_d$=0.1 V at each transistor density. According to FIG. 27, the $I_d$-$V_g$ characteristics were substantially the same at any transistor density.

Figure 28:
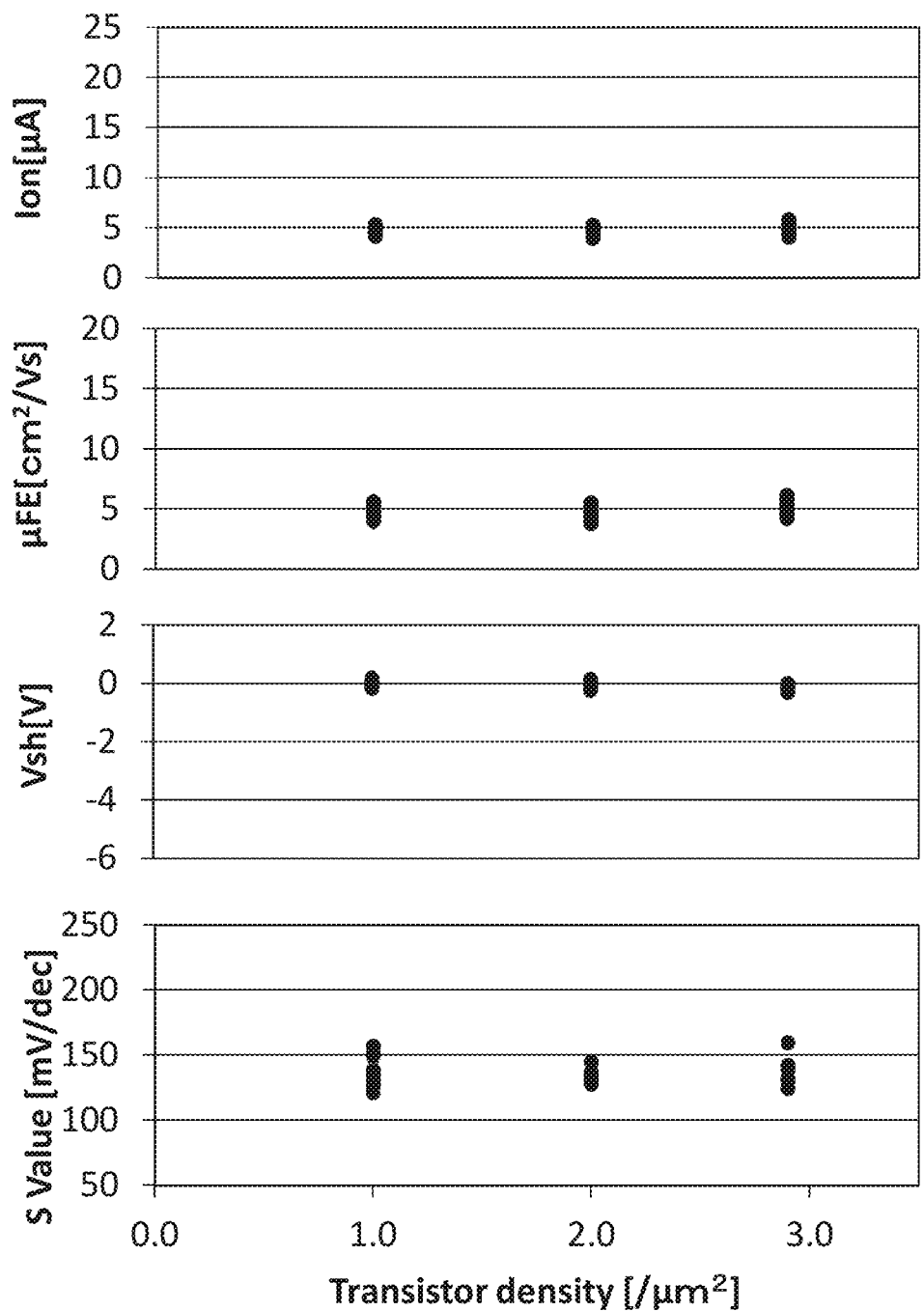
FIG. 28 is a graph showing transistor characteristics in Example.

FIG. 28 is a graph showing the dependence of $I_{on}$, μFE, $V_{sh}$, and S value on the transistor density. According to FIG. 28, $I_{on}$, μFE, $V_{sh}$, and S value each showed substantially the same value at any transistor density. The same can be said for the variations in characteristics, so that the dependence on the transistor density was not observed. From the above results, it was confirmed that in the structure of the semiconductor device of one embodiment of the present invention, transistor characteristics were consistent between different transistor densities, and the transistors had stable characteristics with small variations.

Next, the difference in the dependence of $V_{sh}$ on $V_{bg}$ between varied thicknesses of the second gate insulating film was evaluated using Samples E and F. In Sample E, the second gate insulating film has a three-layer structure of a 5-nm-thick second silicon oxynitride film, a 10-nm-thick hafnium oxide film, and a 15-nm-thick third silicon oxynitride film. In Sample F, the second gate insulating film has a three-layer structure of a 5-nm-thick second silicon oxynitride film, a 10-nm-thick hafnium oxide film, and a 5-nm-thick third silicon oxynitride film. When the equivalent oxide thicknesses (EOT) of Samples E and F were calculated with the second silicon oxynitride film and the third silicon oxynitride film as references, the EOT of Sample E was 22.5 nm and the EOT of Sample F was 12.5 nm. Here, the relative permittivity of the hafnium oxide film was set to four times higher than those of the second silicon oxynitride film and the third silicon oxynitride film.

Figure 29:
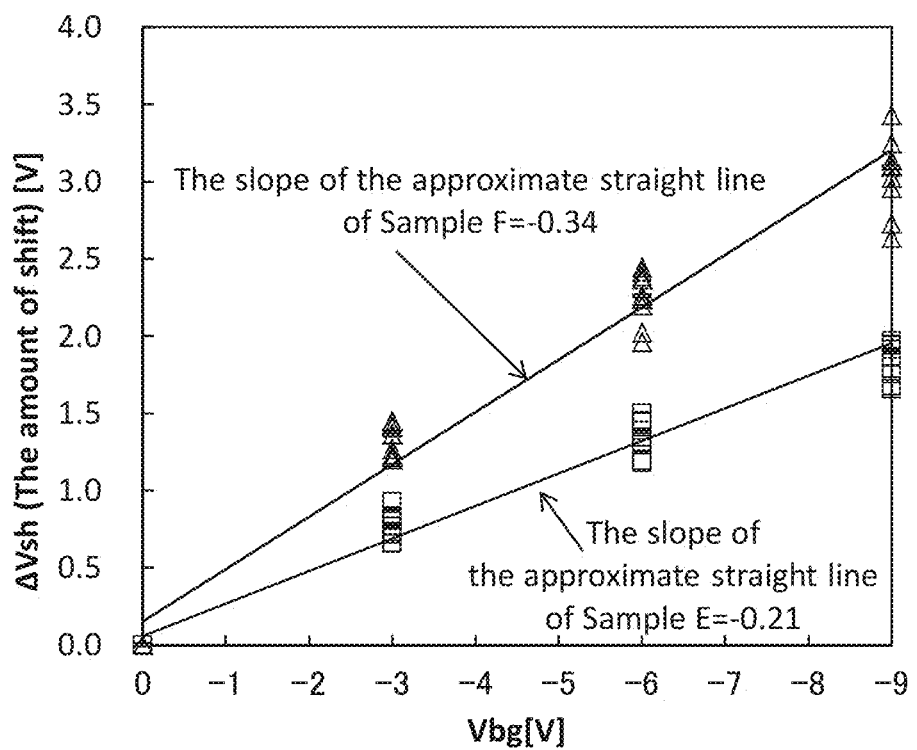
FIG. 29 is a graph showing the dependence of $\Delta V_{sh}$ on $V_{bg}$ in Example.

In this example, $\Delta V_{sh}$ was defined as the amount of shift of $V_{sh}$ when the voltage $V_{bg}$ supplied to the second gate electrode was set to 0 V, −3 V, −6 V, and −9 V. FIG. 29 is a graph in which the differences in $V_{sh}$ at $V_{bg}$=−3 V, −6 V, and −9 V are plotted with $V_{sh}$ at $V_{bg}$=0 V as a reference. Two straight lines in FIG. 29 are the approximate straight lines for values of $\Delta V_{sh}$ of According to FIG. 29, the slope of the approximate straight line of Sample E was about −0.21 and the slope of the approximate straight line of Sample F was about −0.34. In other words, Sample F having thinner EOT of the second gate insulating film showed a larger $\Delta V_{sh}$ along with the change of $V_{bg}$ than Sample E; $V_{sh}$ could be changed by 1.6 times larger than that of Sample E. From the above results, it was confirmed that reduction in thickness of the second gate insulating film enables improvement in the controllability of $V_{sh}$ by $V_{bg}$.

Example 3

In this example, a semiconductor device corresponding to the structure illustrated in FIGS. 1A to 1C was fabricated. A sample of the semiconductor device was fabricated using CAAC-OS of an In—Ga—Zn oxide as the second oxide (S2) corresponding to the oxide 406b in FIGS. 1B and 1C. After the transistor characteristics of the sample were measured, additional heat treatment was performed and the influence of the additional heat treatment time on the transistor characteristics was evaluated.

To fabricate the semiconductor device, a 400-nm-thick silicon oxide film was formed over a single crystal silicon wafer by a thermal oxidation method. Next, a 40-nm-thick first aluminum oxide film was formed by a sputtering method.

Next, a 200-nm-thick first silicon oxynitride film was formed over the first aluminum oxide film by a CVD method, and a 35-nm-thick first tungsten film was formed over the first silicon oxynitride film by a sputtering method. Then, the first tungsten film was processed by a lithography method, and a hard mask including the first tungsten film was formed.

Subsequently, the first silicon oxynitride film was processed, so that a groove reaching the first aluminum oxide film was formed. In the groove, a first tantalum nitride film was formed by a sputtering method and a first titanium nitride film and a second tungsten film were formed over the first tantalum nitride film by an ALD method and a CVD method. Then, the second tungsten film, the first titanium nitride film, the first tantalum nitride film, and the first tungsten film were polished by first CMP treatment until the top surface of the first silicon oxynitride film was exposed, and the second tungsten film, the first titanium nitride film, and the first tantalum nitride film were embedded in the groove; accordingly, a wiring layer and a second gate electrode were formed.

Next, a 5-nm-thick second silicon oxynitride film was formed by a CVD method, and a 10-nm-thick hafnium oxide film was formed by an ALD method. Then, a 15-nm-thick third silicon oxynitride film was formed by a CVD method. The second silicon oxynitride film, the hafnium oxide film, and the third silicon oxynitride film serve as a second gate insulating film.

Then, first heat treatment was performed. The first heat treatment was performed in an atmosphere containing nitrogen at 400° C. for one hour, and subsequently another treatment was performed in an atmosphere containing oxygen at 400° C. for one hour.

Next, as a first oxide (S1), a 5-nm-thick In—Ga—Zn oxide was formed by a sputtering method. The S1 was formed under the following conditions: a target having an atomic ratio of In:Ga:Zn=1:3:4 was used, the oxygen gas flow rate was 45 sccm, the pressure was 0.7 Pa, and the substrate temperature was 200° C.

Then, as a second oxide (S2), a 15-nm-thick In—Ga—Zn oxide was formed over the S1 by a sputtering method. The S2 was formed under the following conditions: a target having an atomic ratio of In:Ga:Zn=4:2:4.1 was used, the argon gas flow rate was 30 sccm, the oxygen gas flow rate was 15 sccm, the pressure was 0.7 Pa, and the substrate temperature was 200° C.

Figure 30:
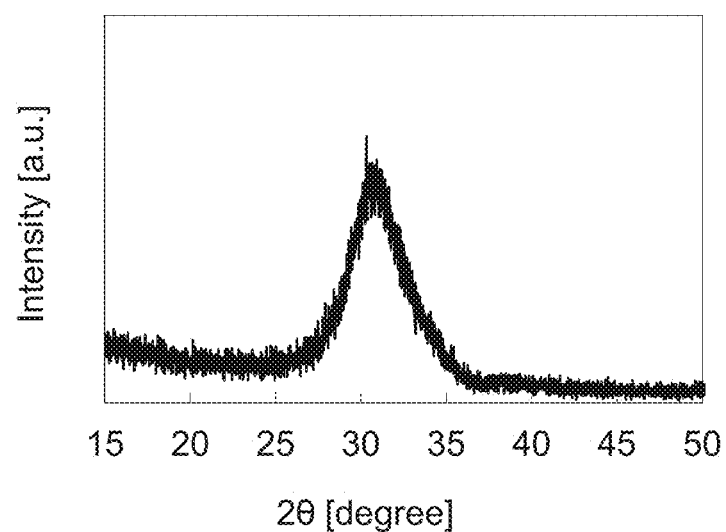
FIG. 30 shows analysis results of CAAC-OS by XRD in Example.

Here, the X-ray diffraction (XRD) analysis result of In—Ga—Zn oxide formed under the same condition as under the S2 is shown in FIG. 30. The In—Ga—Zn oxide was analyzed by an out-of-plane method. As shown in FIG. 30, in the In—Ga—Zn oxide, a peak appeared when the diffraction angle (2θ) was in the vicinity of 31°. This peak is derived from the (009) plane of the InGaZnO$_4$ crystal, which indicates that crystals in the In—Ga—Zn oxide have c-axis alignment, and that the c-axes are aligned in a direction substantially perpendicular to a surface over which the In—Ga—Zn oxide is formed (also referred to as a formation surface) or the top surface of the In—Ga—Zn oxide. Thus, it is found that the In—Ga—Zn-oxide and the S2 of this example are CAAC-OS.

Then, second heat treatment was performed. The second heat treatment was performed in an atmosphere containing nitrogen at 400° C. for one hour, and subsequently another treatment was performed in an atmosphere containing oxygen at 400° C. for one hour.

Next, a 25-nm-thick second tantalum nitride film was formed over the S2 by a sputtering method.

Then, a resist mask was formed, and the second tantalum nitride film was etched in an island shape by a lithography method. A dry etching method was used for the etching. Next, the resist mask was removed using oxygen plasma, and the S2 and the S1 were sequentially etched in an island shape using the island-shaped second tantalum nitride film as an etching mask. A dry etching method was used for the etching.

Next, a second aluminum oxide film was formed over the second tantalum nitride film, the S2, and the S1 by a sputtering method and an ALD method. Upon the formation of the second aluminum oxide film, first, a 5-nm-thick film was formed by a sputtering method, and then a 3-nm-thick film was formed by an ALD method.

Then, a resist mask was formed, and the second aluminum oxide film in a region where a channel was formed was etched by a lithography method. A wet etching method was used for the etching. The second aluminum oxide film was formed to cover the side surfaces of the second tantalum nitride film, the S2, and the S1, and to be in contact with the top surface of the third silicon oxynitride film. By providing the second aluminum oxide film in such a manner, oxygen included in the fifth silicon oxynitride film corresponding to the insulator 415 in FIG. 1B can be prevented from being absorbed by the source electrode or the drain electrode.

Subsequently, the second tantalum nitride film in a region where a channel was formed was etched using the second aluminum oxide film as an etching mask. A dry etching method was used for the etching.

Next, the resist mask was removed using oxygen plasma.

Next, as a third oxide (S3), a 5-nm-thick In—Ga—Zn oxide was formed by a sputtering method. The S3 was formed under the following conditions: a target having an atomic ratio of In:Ga:Zn=4:2:4.1 was used, the oxygen gas flow rate was 45 sccm, the pressure was 0.7 Pa, and the substrate temperature was 130° C.

Then, an 8-nm-thick fourth silicon oxynitride film was formed by a CVD method, and a 3-nm-thick third aluminum oxide film was formed over the fourth silicon oxynitride film by an ALD method. The fourth silicon oxynitride film and the third aluminum oxide film serve as a first gate insulating film. Thus, oxygen included in the fourth silicon oxynitride film can be prevented from being absorbed by the gate electrode when the first gate insulating film includes the third aluminum oxide film.

Then, a 10-nm-thick second titanium nitride film was formed by an ALD method, and a 30-nm-thick third tungsten film was formed over the second titanium nitride film by a sputtering method. The second titanium nitride film and the third tungsten film were successively formed.

Next, the third tungsten film and the second titanium nitride film were etched in this order by a lithography method, so that a gate electrode was formed. A dry etching method was used for the etching.

Next, a 7-nm-thick fourth aluminum oxide film was formed by an ALD method. The substrate temperature was 250° C.

Next, a resist mask was formed, and the fourth aluminum oxide film, the third aluminum oxide film, and the fourth silicon oxynitride film were etched by a lithography method. A wet etching method was used for the etching of the fourth aluminum oxide film and the third aluminum oxide film, and a dry etching method was used for the etching of the fourth silicon oxynitride film. Then, the S3 was etched after the resist mask was removed. A diluted phosphoric acid solution was used for the etching of the S3.

Next, a 60-nm-thick fifth silicon oxynitride film was formed by a CVD method.

Then, a 35-nm-thick fifth aluminum oxide film was formed by a sputtering method under the following conditions: the argon gas flow rate was 25 sccm, the oxygen gas flow rate was 25 sccm, the pressure was 0.4 Pa, and the substrate temperature was 250° C.

Next, a 5-nm-thick sixth aluminum oxide film was formed over the fifth aluminum oxide film by an ALD method. The substrate temperature was 250° C.

Next, a 350-nm-thick sixth silicon oxynitride film was formed by a CVD method. Then, second CMP treatment was performed to polish the sixth silicon oxynitride film so that the surface of the sixth silicon oxynitride film was planarized.

Next, a 90-nm-thick fourth tungsten film was formed by a sputtering method. Then, a 130-nm-thick silicon nitride film was formed by a CVD method.

Then, the silicon nitride film and the fourth tungsten film were processed by a lithography method, and a hard mask including the silicon nitride film and the fourth tungsten film was formed. Next, a contact hole reaching the second tungsten film (second gate electrode), a contact hole reaching the third tungsten film (first gate electrode), and a contact hole reaching the second tantalum nitride film (source electrode and drain electrode) were formed using the hard mask as an etching mask.

Next, a 13-nm-thick seventh aluminum oxide film was formed. The substrate temperature was 250° C. Then, the seventh aluminum oxide film was anisotropically etched to remain only at the side surfaces of the contact holes. By providing the seventh aluminum oxide film in such a manner, oxygen included in the fifth silicon oxynitride film corresponding to the insulator 415 in FIG. 1B can be prevented from being absorbed by the electrodes embedded in the contact holes, and the source electrode or the drain electrode.

Next, a 10-nm-thick third titanium nitride film was formed by an ALD method at a substrate temperature of 375° C., and a 150-nm-thick fifth tungsten film was formed by a CVD method at a substrate temperature of 350° C.

Then, the fifth tungsten film, the third titanium nitride film, silicon nitride film, and the fourth tungsten film were polished to reach the sixth silicon oxynitride film by third CMP treatment, so that the fifth tungsten film and the third titanium nitride film were embedded in each contact hole to form electrodes.

Next, a 50-nm-thick sixth tungsten film was formed by a sputtering method. Next, part of the sixth tungsten film was etched by a lithography method to form a wiring layer.

Next, third heat treatment was performed. The third heat treatment was performed at 250° C. for one hour.

Next, a 1.0-μm-thick photoresist film was formed by a coating method. Then, a portion of the photoresist film that is to be a measurement terminal (measurement pad) was removed by a lithography method.

Through the above process, the semiconductor device illustrated in FIGS. 1A to 1C was fabricated.

Next, the transistor characteristics of the sample were measured. In the measured transistor, the designed value of the channel length L was 60 nm, the designed value of the channel width W was 60 nm, and the transistor density was 2.0/μm².

The transistor characteristics were measured by measuring change in $I_d$ when $V_g$ changed from −4.0 V to +4.0 V at $V_d$=0.1 V or 1.2 V. That is, $I_d$-$V_g$ characteristics were measured. In this measurement, the voltage of a second gate electrode (back gate electrode) ($V_{bg}$) was set to 0 V.

In addition, from the measurement data of the $I_d$-$V_g$ characteristics at $V_d$=0.1 V, the field-effect mobility μFE (cm²/Vs) was calculated using the gradual channel approximation formula in a linear region.

Figure 31A:
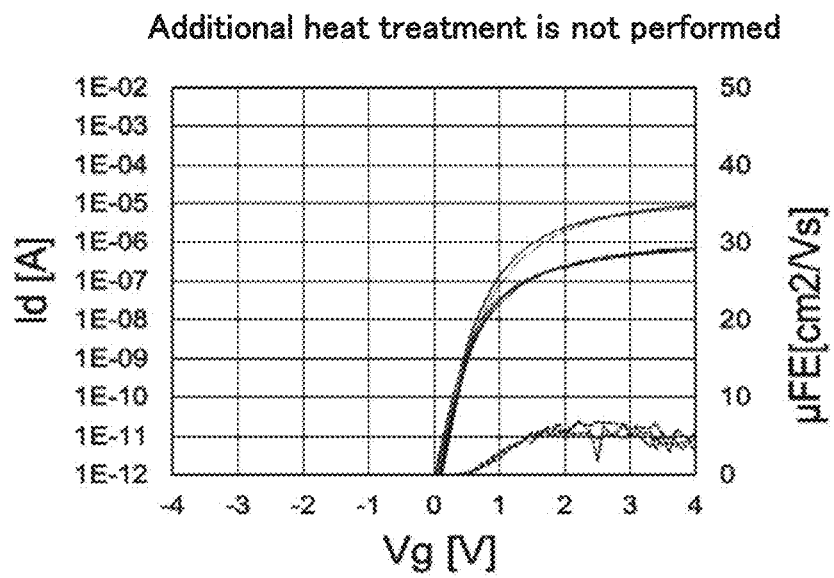
FIGS. 31A and 31B are graphs showing transistor characteristics in Example.
Figure 31B:
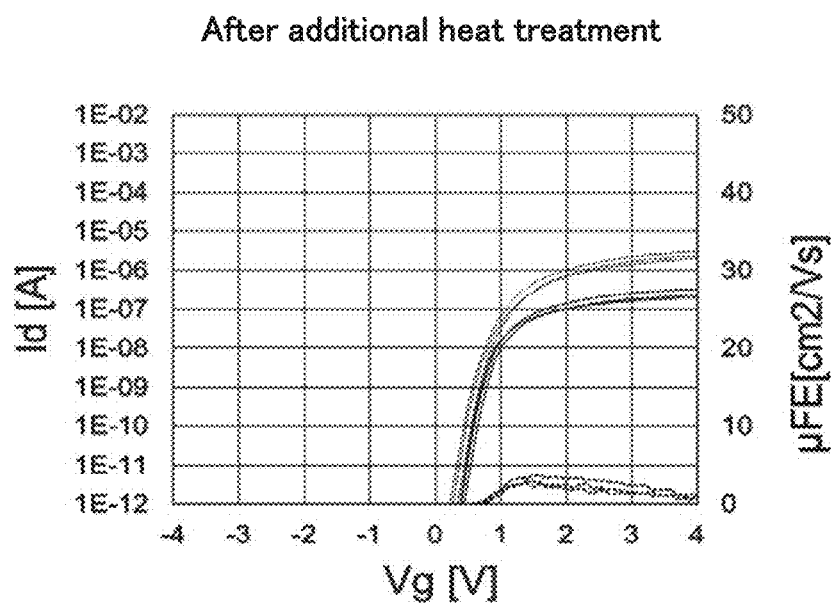

FIGS. 31A and 31B are graphs showing the $I_d$-$V_g$ characteristics at $V_d$=0.1 V and the μFE characteristics at $V_d$=0.1 V, for the sample of this example. FIG. 31A shows the initial characteristics of the sample, and FIG. 31B shows the characteristics after 4-hour additional heat treatment. The additional heat treatment was performed at 400° C. in a nitrogen atmosphere. In each graph, the vertical axis on the left side represents $I_d$ and the vertical axis on the right side represents μFE. The horizontal axis represents $V_g$.

As shown in FIG. 31B, it was confirmed that a structure of one embodiment of the present invention could maintain favorable transistor characteristics with high on-off ratio even after a long-time additional heat treatment. Normally-off characteristics can be maintained even after 4-hour additional heat treatment. Thus, the transistor of this example are stable with respect to high temperature in the manufacturing process (what is called thermal budget).

In the sample of this example, the S2 includes CAAC-OS. The CAAC-OS has a dense structure with small amounts of impurities and defects (e.g., oxygen vacancies) and high crystallinity. Accordingly, extraction of oxygen from the S2 by the source electrode or the drain electrode can be suppressed. Because extraction of oxygen from the S2 can be suppressed even if the heat treatment is performed, the transistor including CAAC-OS is stable with respect to thermal budget.

Through the above process, it was confirmed that in the structure of the semiconductor device of one embodiment of the present invention, variations in the transistor characteristics due to heat treatment could be suppressed when CAAC-OS is used for the S2.

REFERENCE NUMERALS

I1: insulator, I2: insulator, S1: oxide, S2: oxide, S3: oxide, 100: capacitor, 101: capacitor, 110: conductor, 112: conductor, 120: conductor, 130: insulator, 150: insulator, 156: conductor, 160: insulator, 166: conductor, 200: transistor, 201: transistor, 210: insulator, 212: insulator, 214: insulator, 216: insulator, 218: conductor, 300: transistor, 301: insulator, 302: insulator, 303: insulator, 310: conductor, 310a: conductor, 310b: conductor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 340: transistor, 345: transistor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 400: substrate, 401a: oxide, 401b: oxide, 402: insulator, 404: conductor, 404a: conductor, 404b: conductor, 405: conductor, 405a: conductor, 405b: conductor, 406a: oxide, 406a1: oxide, 406b: oxide, 406b1: oxide, 406c: oxide, 406c1: oxide, 408a: oxide, 408b: oxide, 410: insulator, 411: conductor, 411a: conductor, 411a1: conductor, 411a2: conductor, 412: insulator, 412a: insulator, 415: insulator, 416: conductor, 416a: conductor, 416a1: conductor, 416a2: conductor, 417: barrier film, 417a: barrier film, 417a1: barrier film, 417a2: barrier film, 418: oxide, 420: oxide, 421: resist, 422: oxide, 430c: oxide, 431a: oxide, 431b: oxide, 432a: oxide, 432b: oxide, 440: conductor, 440a: conductor, 440b: conductor, 445: barrier layer, 445a: barrier layer, 445b: barrier layer, 450: electrode, 451: electrode, 452: electrode, 455: insulator, 460: conductor, 460a: conductor, 460b: conductor, 470: barrier layer, 500: structure, 711: substrate, 712: circuit region, 713: separation region, 714: separation line, 715: chip, 750: electronic component, 752: printed circuit board, 754: circuit board, 755: lead, 2910: information terminal, 2911: housing, 2912: display portion, 2913: camera, 2914: speaker portion, 2915: operation switch, 2916: external connection portion, 2917: microphone, 2920: notebook personal computer, 2921: housing, 2922: display portion, 2923: keyboard, 2924: pointing device, 2940: video camera, 2941: housing, 2942: housing, 2943: display portion, 2944: operation switch, 2945: lens, 2946: joint, 2950: information terminal, 2951: housing, 2952: display portion, 2960: information terminal, 2961: housing, 2962: display portion, 2963: band, 2964: buckle, 2965: operation switch, 2966: input/output terminal, 2967: icon, 2980: car, 2981: car body, 2982: wheel, 2983: dashboard, 2984: light, 3001: wiring, 3002: wiring, 3003: wiring, 3004: wiring, 3005: wiring, 3006: wiring, 3007: wiring, 3008: wiring, 3009: wiring, and 3010: wiring.

This application is based on Japanese Patent Application Serial No. 2017-014337 filed with Japan Patent Office on Jan. 30, 2017, Japanese Patent Application Serial No. 2017-118471 filed with Japan Patent Office on Jun. 16, 2017, and Japanese Patent Application Serial No. 2017-156235 filed with Japan Patent Office on Aug. 11, 2017, the entire contents of which are hereby incorporated by reference.

The invention claimed is:

1. A semiconductor device comprising:
    a transistor;
    an insulating film over the transistor;
    an electrode; and
    a metal oxide over the insulating film,
    wherein the transistor comprises:
        a first gate electrode;
        a first gate insulating film over the first gate electrode;
        an oxide over the first gate insulating film;
        a source electrode and a drain electrode electrically connected to the oxide;
        a second gate insulating film over the oxide; and
        a second gate electrode over the second gate insulating film,
    wherein the electrode reaches the source electrode or the drain electrode through the metal oxide and the insulating film,
    wherein the electrode comprises a region in contact with the insulating film,
    wherein the first gate insulating film is in contact with the insulating film,
    wherein the insulating film comprises a first region overlapping the second gate electrode, a second region overlapping the source electrode, and a third region overlapping the drain electrode,
    wherein thickness of the first region, thickness of the second region and thickness of the third region of the insulating film are substantially the same, and
    wherein the insulating film contains excess oxygen.

2. The semiconductor device according to claim 1, wherein the metal oxide is configured to inhibit the passage of oxygen.

3. The semiconductor device according to claim 1, wherein the metal oxide comprises aluminum and oxygen.

4. The semiconductor device according to claim 1, wherein the oxide comprises In, an element M, and Zn, and
    wherein M is Al, Ga, Y, or Sn.

5. The semiconductor device according to claim 1, further comprising a circuit,
    wherein the circuit comprises a plurality of the transistors and the electrodes, and
    wherein density of the transistors in the circuit is higher than or equal to $1/\mu m^2$ and lower than or equal to $2500/\mu m^2$.

6. The semiconductor device according to claim 1, wherein a contact area between the electrode and the insulating film is less than or equal to $0.035\ \mu m^2$.

7. The semiconductor device according to claim 1, wherein thickness of the insulating film is greater than or equal to 40 nm.

8. A semiconductor wafer comprising:
    a plurality of the semiconductor devices according to claim 1; and
    a region for dicing.

9. The semiconductor device according to claim 1,
    wherein each of a top surface of the insulating film and a top surface of the metal oxide includes unevenness.

10. A method for manufacturing a semiconductor device, comprising the steps of:
    forming a first insulator;
    forming a transistor including a source electrode, a drain electrode, a gate electrode and a channel formation region in an oxide over the first insulator;
    forming a second insulator over the transistor;
    forming a third insulator over the second insulator to add oxygen into the second insulator;
    performing heat treatment to transfer the oxygen to the oxide through the second insulator; and
    forming an electrode reaching the source electrode through the second insulator and the third insulator,
    wherein the second insulator comprises a first region overlapping the gate electrode, a second region overlapping the source electrode, and a third region overlapping the drain electrode, and
    wherein thickness of the first region, thickness of the second region and thickness of the third region of the second insulator are substantially the same.

11. The method for manufacturing a semiconductor device according to claim 9,
    wherein the third insulator is formed by a sputtering method and comprises aluminum and oxygen.

12. The method for manufacturing a semiconductor device according to claim 9,
    wherein a contact area between the electrode and the second insulator is less than or equal to $0.035\ \mu m^2$.

13. The method for manufacturing a semiconductor device according to claim 9,
    wherein the oxide is formed over the first insulator and the second insulator is in contact with the first insulator.

14. The method for manufacturing a semiconductor device according to claim 9,
    wherein each of a top surface of the second insulator and a top surface of the third insulator includes unevenness.

* * * * *